(12) United States Patent
Zhu

(10) Patent No.: US 11,528,020 B2
(45) Date of Patent: *Dec. 13, 2022

(54) CONTROL CIRCUIT AND DELAY CIRCUIT

(71) Applicant: CHANGXIN MEMORY TECHNOLOGIES, INC., Hefei (CN)

(72) Inventor: Lei Zhu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/400,481

(22) Filed: Aug. 12, 2021

(65) Prior Publication Data

US 2022/0166416 A1 May 26, 2022

Related U.S. Application Data

(63) Continuation of application No. PCT/CN2021/095593, filed on May 24, 2021.

(30) Foreign Application Priority Data

Nov. 25, 2020 (CN) .......................... 202011345952.9

(51) Int. Cl.
*H03K 5/01* (2006.01)
*H03K 19/20* (2006.01)
*H03K 5/00* (2006.01)

(52) U.S. Cl.
CPC ............... *H03K 5/01* (2013.01); *H03K 19/20* (2013.01); *H03K 2005/00013* (2013.01)

(58) Field of Classification Search
CPC . H03K 5/01; H03K 19/20; H03K 2005/00013
(Continued)

(56) References Cited

U.S. PATENT DOCUMENTS

| 4,417,263 A | 11/1983 | Matsuura |
| 5,099,146 A | 3/1992 | Miki |

(Continued)

FOREIGN PATENT DOCUMENTS

| CN | 1216880 A | 5/1999 |
| CN | 1367927 A | 9/2002 |

(Continued)

OTHER PUBLICATIONS

First Office Action of the U.S. Appl. No. 17/404,149, dated Mar. 9, 2022, 23 pgs.

(Continued)

*Primary Examiner* — Ryan Jager
(74) *Attorney, Agent, or Firm* — Cooper Legal Group, LLC

(57) ABSTRACT

A control circuit and a delay circuit are provided. The control circuit includes a control unit and a feedback unit. The feedback unit is configured to output a feedback signal according to a voltage of the control unit and a reference voltage; a first terminal of the feedback unit is connected to a first terminal of the control unit, a second terminal of the feedback unit serves as an input terminal of the reference voltage, and an output terminal of the feedback unit is connected to a second terminal of the control unit. The control unit is configured to adjust a voltage of the second terminal of the control unit according to the feedback signal, so as to allow a current variation of the control unit with a first parameter to be within a first range.

20 Claims, 47 Drawing Sheets

(58) Field of Classification Search
USPC .................................................... 327/262
See application file for complete search history.

(56) References Cited

U.S. PATENT DOCUMENTS

| | | | |
|---|---|---|---|
| 5,434,534 A | 7/1995 | Lucas | |
| 5,831,472 A | 11/1998 | Wang | |
| 6,040,610 A | 3/2000 | Noguchi | |
| 6,060,930 A | 5/2000 | Choi | |
| 6,075,404 A | 6/2000 | Shindoh | |
| 6,081,131 A * | 6/2000 | Ishii | H03K 19/018571 |
| | | | 326/68 |
| 6,147,550 A | 11/2000 | Holloway | |
| 6,198,322 B1 | 3/2001 | Yoshimura | |
| 6,229,732 B1 | 5/2001 | Lin | |
| 6,262,616 B1 * | 7/2001 | Srinivasan | H03F 1/301 |
| | | | 327/264 |
| 6,333,571 B1 | 12/2001 | Teraoka | |
| 6,448,833 B2 | 9/2002 | Hirose | |
| 6,468,848 B1 | 10/2002 | Kaoru | |
| 6,496,056 B1 | 12/2002 | Shoji | |
| 6,803,803 B1 * | 10/2004 | Starr | H03K 19/00384 |
| | | | 327/378 |
| 6,847,252 B1 | 1/2005 | Ono | |
| 7,049,887 B2 | 5/2006 | Midtgaard | |
| 7,119,622 B2 | 10/2006 | Sato | |
| 7,138,851 B2 | 11/2006 | Sumita | |
| 7,148,732 B2 * | 12/2006 | Kakuda | G11C 7/06 |
| | | | 327/262 |
| 7,154,324 B1 * | 12/2006 | Maangat | H03K 5/133 |
| | | | 327/288 |
| 7,221,211 B2 | 5/2007 | Sumita | |
| 7,358,793 B2 | 4/2008 | Sumita | |
| 7,365,590 B2 | 4/2008 | Sumita | |
| 7,426,146 B2 | 9/2008 | Aota | |
| 7,477,090 B2 * | 1/2009 | Takahashi | H03K 19/00384 |
| | | | 327/108 |
| 7,495,465 B2 * | 2/2009 | Khan | H03K 19/00384 |
| | | | 326/21 |
| 7,508,251 B2 | 3/2009 | Sumita | |
| 7,525,381 B2 | 4/2009 | Murden | |
| 7,642,843 B2 | 1/2010 | Riho | |
| 7,675,348 B2 | 3/2010 | Sumita | |
| 7,683,433 B2 | 3/2010 | Kapoor | |
| 7,719,346 B2 | 5/2010 | Imura | |
| 7,791,959 B2 | 9/2010 | Chun | |
| 7,808,308 B2 | 10/2010 | Lai | |
| 7,816,974 B2 | 10/2010 | Araki | |
| 7,834,683 B2 | 11/2010 | Truong | |
| 7,843,253 B2 | 11/2010 | Aota | |
| 7,847,616 B2 | 12/2010 | Hashimoto | |
| 7,898,297 B2 | 3/2011 | Kapoor | |
| 7,999,603 B2 | 8/2011 | Sumita | |
| 8,143,963 B2 | 3/2012 | Lin | |
| 8,174,309 B2 | 5/2012 | Yoshino | |
| 8,188,801 B2 | 5/2012 | Kim | |
| 8,378,739 B2 * | 2/2013 | Notani | G05F 1/56 |
| | | | 327/540 |
| 8,384,470 B2 | 2/2013 | Sugiura | |
| 8,390,355 B2 * | 3/2013 | Quan | H03K 5/133 |
| | | | 327/261 |
| 8,390,356 B2 * | 3/2013 | Shinde | H03K 5/133 |
| | | | 327/262 |
| 8,519,782 B2 | 8/2013 | Oyama | |
| 8,665,005 B2 | 3/2014 | Gerna | |
| 8,742,815 B2 * | 6/2014 | Wadhwa | H03K 5/133 |
| | | | 327/262 |
| 8,754,695 B2 * | 6/2014 | Di Vincenzo | H03K 19/018528 |
| | | | 327/262 |
| 8,963,621 B2 | 2/2015 | Gerna et al. | |
| 8,975,952 B2 | 3/2015 | Fechner et al. | |
| 9,019,666 B2 | 4/2015 | Bourgeat | |
| 9,214,932 B2 | 12/2015 | Clausen et al. | |
| 9,225,334 B2 | 12/2015 | Di Vincenzo et al. | |
| 9,300,247 B2 | 3/2016 | Roine et al. | |
| 9,325,323 B2 | 4/2016 | Rana et al. | |
| 9,431,959 B2 | 8/2016 | Liu et al. | |
| 9,473,135 B2 | 10/2016 | Garg et al. | |
| 9,525,407 B2 | 12/2016 | Iriarte et al. | |
| 9,998,099 B2 * | 6/2018 | Su | G05F 3/205 |
| 10,193,444 B1 | 1/2019 | Wei | |
| 10,324,485 B2 | 6/2019 | Huang | |
| 10,361,691 B2 * | 7/2019 | Jang | H03K 5/1565 |
| 10,418,981 B2 | 9/2019 | Loke et al. | |
| 10,432,090 B2 | 10/2019 | Wei | |
| 10,476,457 B2 | 11/2019 | Schober et al. | |
| 10,514,716 B2 | 12/2019 | Schober et al. | |
| 10,554,174 B2 | 2/2020 | Schober et al. | |
| 10,707,757 B2 | 7/2020 | Wei | |
| 11,119,522 B2 | 9/2021 | Huang | |
| 11,177,794 B2 | 11/2021 | Roewer | |
| 2001/0020861 A1 | 9/2001 | Hirose | |
| 2001/0046156 A1 | 11/2001 | Miyazaki | |
| 2002/0195623 A1 | 12/2002 | Horiuchi | |
| 2003/0071661 A1 | 4/2003 | Eguchi | |
| 2003/0085751 A1 | 5/2003 | Miyazaki | |
| 2003/0146785 A1 | 8/2003 | Ueda | |
| 2003/0174014 A1 | 9/2003 | Nakashimo | |
| 2004/0135621 A1 | 7/2004 | Sumita | |
| 2004/0251484 A1 | 12/2004 | Miyazaki | |
| 2005/0116765 A1 | 6/2005 | Sakiyama | |
| 2005/0134384 A1 | 6/2005 | Sato | |
| 2005/0162212 A1 | 7/2005 | Sakiyama | |
| 2006/0125550 A1 | 6/2006 | Sumita | |
| 2006/0125551 A1 | 6/2006 | Sumita | |
| 2007/0024342 A1 | 2/2007 | Sumita | |
| 2007/0024343 A1 | 2/2007 | Sumita | |
| 2007/0024345 A1 | 2/2007 | Sumita | |
| 2007/0132504 A1 | 6/2007 | Sumita | |
| 2008/0088357 A1 | 4/2008 | Sumita | |
| 2008/0211556 A1 | 9/2008 | Masuo | |
| 2008/0211572 A1 | 9/2008 | Riho | |
| 2009/0153214 A1 * | 6/2009 | Takatori | H03K 5/133 |
| | | | 327/262 |
| 2010/0007382 A1 | 1/2010 | Hashimoto | |
| 2010/0117717 A1 | 5/2010 | Sumita | |
| 2011/0102043 A1 | 5/2011 | Zerbe | |
| 2011/0309885 A1 | 12/2011 | Kim | |
| 2012/0154066 A1 | 6/2012 | Kubota | |
| 2013/0141824 A1 | 6/2013 | Bourgeat | |
| 2014/0285240 A1 | 9/2014 | Di Vincenzo et al. | |
| 2014/0376305 A1 | 12/2014 | Bai et al. | |
| 2015/0229296 A1 | 8/2015 | Kim | |
| 2016/0013763 A1 * | 1/2016 | Tomimatsu | H03F 1/301 |
| | | | 341/143 |
| 2016/0065220 A1 | 3/2016 | Rana et al. | |
| 2017/0077907 A1 | 3/2017 | Su et al. | |
| 2017/0271195 A1 | 9/2017 | Hoyerby et al. | |
| 2018/0302069 A1 | 10/2018 | Loke et al. | |
| 2020/0209070 A1 | 7/2020 | Tang et al. | |
| 2021/0080991 A1 | 3/2021 | Huang | |
| 2022/0038064 A1 | 2/2022 | Kareppagoudr et al. | |
| 2022/0163986 A1 | 5/2022 | Zhu | |
| 2022/0166416 A1 | 5/2022 | Colles et al. | |

FOREIGN PATENT DOCUMENTS

| | | |
|---|---|---|
| CN | 1497725 A | 5/2004 |
| CN | 1630185 A | 6/2005 |
| CN | 101256824 A | 9/2008 |
| CN | 101895280 A | 11/2010 |
| CN | 102291105 A | 12/2011 |
| CN | 103647545 A | 3/2014 |
| CN | 104038201 A | 9/2014 |
| CN | 105629772 A | 6/2016 |
| CN | 106301346 A | 1/2017 |
| CN | 108696269 A | 10/2018 |
| CN | 109379060 A | 2/2019 |
| CN | 109450415 A | 3/2019 |
| CN | 110377088 A | 10/2019 |
| CN | 111295841 A | 6/2020 |

(56) References Cited

FOREIGN PATENT DOCUMENTS

| | | |
|---|---|---|
| JP | H06139779 A | 5/1994 |
| JP | 2001251171 A | 9/2001 |
| JP | 2010074721 A | 4/2010 |

OTHER PUBLICATIONS

First Office Action of the U.S. Appl. No. 17/446,302, dated May 25, 2022, 51 pgs.
Final Office Action of the U.S. Appl. No. 17/404,149, dated Jul. 22, 2022, 9 pgs.
Supplementary European Search Report in the European application No. 21773264.3, dated Jul. 27, 2022, 8 pgs.
Supplementary European Search Report in the European application No. 21772658.7, dated Sep. 8, 2022, 10 pages.
Melek, et al., "Body-Bias Compensation Technique for SubThreshold CMOS Static Logic Gates", Integrated Circuits and Systems Design, SBCCI'04, Sep. 4, 2004, Pernambuco, Brazi, pp. 267-272.
Supplementary European Search Report in the European application No. 21856898.8, dated Nov. 7, 2022, 13 pages.

\* cited by examiner

CONTROL CIRCUIT AND DELAY CIRCUIT

CROSS-REFERENCE TO RELATED APPLICATIONS

This is a continuation of International Application No. PCT/CN2021/095593, filed on May 24, 2021, which claims priority to Chinese patent application No. 202011345952.9, filed on Nov. 25, 2020 and entitled "CONTROL CIRCUIT AND DELAY CIRCUIT". The disclosures of International Application No. PCT/CN2021/095593 and Chinese patent application No. 202011345952.9 are hereby incorporated by reference in their entireties.

TECHNICAL FIELD

This application relates to the technical field of integrated circuits, in particular to a control circuit and a delay circuit.

BACKGROUND

At present, delay circuits are often used in semiconductor elements, and a delay circuit refers to a circuit that can delay a pulse signal for a certain period of time. When the delay circuit is used in a Dynamic Random Access Memory (DRAM), it is often necessary to accurately control a delay time of the delay circuit. The delay circuit needs to meet a requirement for a slight variation of the delay time when there is a variation of parameters (such as a power supply voltage, an operating temperature, and a manufacturing process).

FIG. 1 is a schematic diagram showing an input signal and an output signal through a delay circuit. After the input signal passing through the delay circuit, a delay signal is output. As shown in FIG. 1, the output signal is the signal output after the input signal being delayed by a time T. FIG. 1 shows a case where both a rising edge and a falling edge of the input signal are delayed by the time T. There is also a case where merely the rising edge of the input signal is delayed by the time T or the falling edge of the input signal is delayed by the time T.

In the existing delay circuit, the delay time T will be significantly varied (being longer or shorter) with the power supply voltage, the operating temperature, and the manufacturing process; thus, accuracy of the delay time will be affected. How to reduce the influence of the variations of the aforementioned parameters on the delay time T of the delay circuit so as to make less variation of the delay time T is a problem that is urgent to be solved.

SUMMARY

In a first aspect, this disclosure provides a control circuit, including a control unit and a feedback unit.

The feedback unit is configured to output a feedback signal according to a voltage of the control unit and a reference voltage. A first terminal of the feedback unit is connected to a first terminal of the control unit, a second terminal of the feedback unit serves as an input terminal of the reference voltage, and an output terminal of the feedback unit is connected to a second terminal of the control unit.

The control unit is configured to adjust a voltage of the second terminal of the control unit according to the feedback signal, so as to allow a current variation of the control unit with a first parameter to be within a first range. The first parameter includes at least one of a manufacturing process of the control circuit, a power supply voltage of the control circuit, and an operating temperature of the control circuit. A third terminal of the control unit is connected to a first power supply terminal, and a fourth terminal of the control unit is connected to a negative power supply terminal, or, the third terminal of the control unit is connected to a second power supply terminal, and the fourth terminal of the control unit is connected to a ground terminal.

In a second aspect, this disclosure provides a delay circuit, including a delay unit and the control circuit as described above. The second terminal of the control unit is connected to a first terminal of the delay unit, and the control unit is configured to control a variation of at least one of a rising edge delay time of the delay unit or a falling edge delay time of the delay unit with the first parameter, to be within the first range.

BRIEF DESCRIPTION OF THE DRAWINGS

In order to more clearly illustrate the technical solutions in this disclosure or in the existing art, the drawings required to be used in descriptions about the embodiments or in the art will be simply introduced below. It is apparent that the drawings in the following descriptions are some embodiments of this disclosure, and those of ordinary skill in the art may further obtain other drawings according to these drawings without creative work.

DETAILED DESCRIPTION

In order to make the objectives, technical solutions, and advantages of the embodiments of this disclosure clearer, the technical solutions in the embodiments of this disclosure will be clearly and completely described below in combination with the drawings in the embodiments of this disclosure. It is apparent that the described embodiments are merely part of embodiments, rather than all embodiments of this disclosure. All other embodiments obtained by those of ordinary skill in the art on the basis of the embodiments in this disclosure without creative work shall fall within the scope of protection of this disclosure.

Firstly, a rising edge delay time and a falling edge delay time involved in this disclosure will be explained to facilitate understanding.

Figure 1:
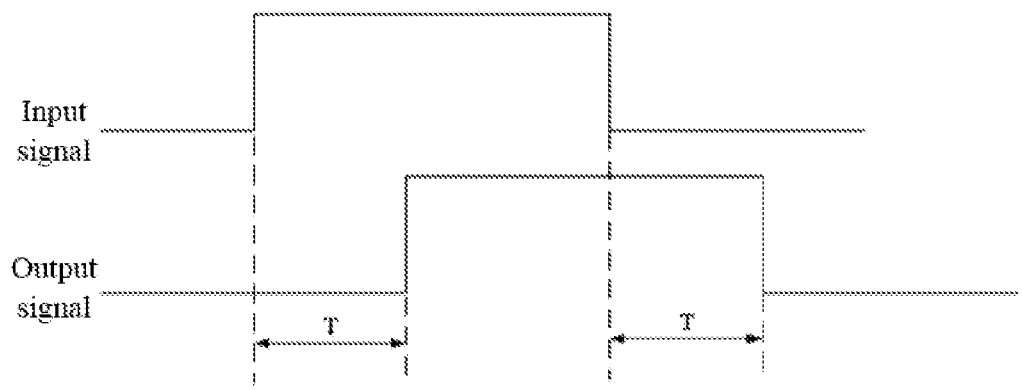
FIG. 1 is a schematic diagram of an input signal and an output signal through a delay circuit.

1. The rising edge delay time: FIG. 1 is a schematic diagram of an input signal and an output signal through a delay circuit. As shown in FIG. 1, a delay time T between a rising edge of the output signal and a rising edge of the input signal refers to the rising edge delay time.

2. The falling edge delay time: As shown in FIG. 1, a delay time T between a falling edge of the output signal and a falling edge of the input signal refers to the falling edge delay time.

Figure 2:
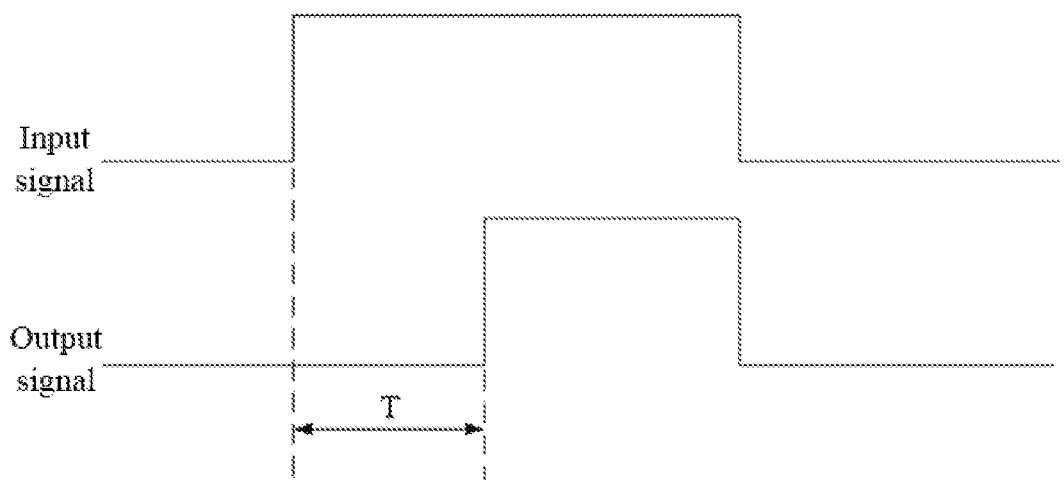
FIG. 2 is a schematic diagram of an input signal and an output signal through a delay circuit.
Figure 3:
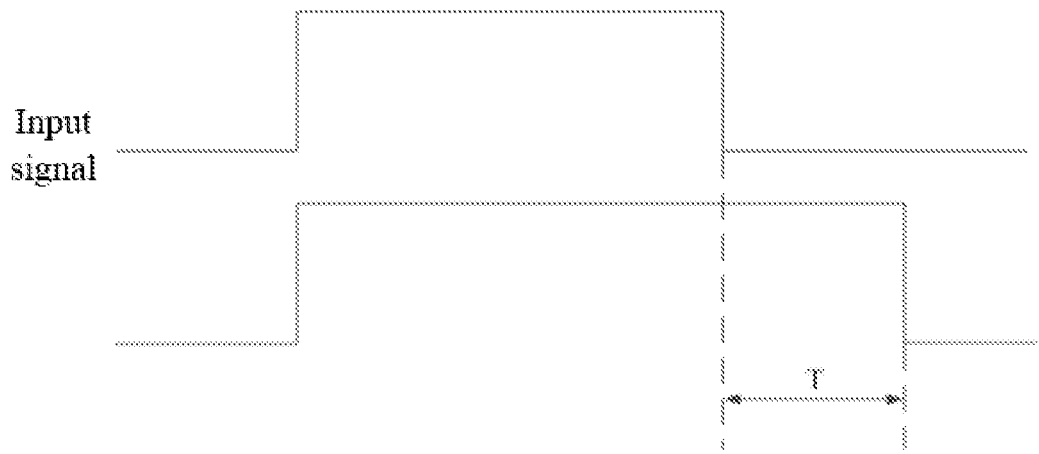
FIG. 3 is a schematic diagram of an input signal and an output signal through a delay circuit.

Through a delay circuit provided in this disclosure, both the rising edge of the input signal and the falling edge of the input signal can be delayed by the time T, with a constant pulse signal width. As shown in FIG. 1, the rising edge of the input signal can be delayed by the time T, and the falling edge of the input signal can also be delayed by the time T. FIG. 2 is a schematic diagram of an input signal and an output signal through a delay circuit. As shown in FIG. 2, a rising edge of the input signal is delayed by a time T to obtain the output signal, and a pulse signal width is shortened by the time T. FIG. 3 is a schematic diagram of an input signal and an output signal through a delay circuit. As shown in FIG. 3, a falling edge of the input signal is delayed by a time T to obtain the output signal, and a pulse signal width is prolonged by a time T. It should be noted that there is only one period as shown in FIGS. 1 to 3.

The delay circuit provided in this disclosure can be applied to scenarios that require precise control of the delay time of the delay circuit. For example, the delay circuit can be applied to a Dynamic Random Access Memory (DRAM), and the influence of the variation of any of a power supply voltage, an operating temperature, and a manufacturing process on the delay time can be simultaneously compensated; so that there is a slight variation of the delay time T, and thus the control capability of the delay circuit to accuracy of the delay time can be improved.

A delay unit of an existing delay circuit includes an inverter composed of two transistors (a P-type transistor and an N-type transistor). The delay time T of the output signal through the delay circuit may greatly varies with the power supply voltage, the operating temperature, and the manufacturing process, which may affect the accuracy of the delay time. The disclosure solves the problem from the perspective of a structure of the delay unit. Since the variations of the power supply voltage, the operating temperature, and the manufacturing process all may cause a current flowing through the two transistors of the inverter to be varied, the delay time is caused to be varied. Therefore, a delay circuit is provided in the disclosure, including a potential generating circuit and a delay unit. The potential generating circuit includes a first transistor and a second transistor. A potential of a substrate terminal of the first transistor and a potential of a substrate terminal of the second transistor may vary with a first parameter, and the first parameter refers to any of a power supply voltage of the potential generating circuit, an operating temperature of the potential generating circuit, and a manufacturing process of the potential generating circuit. The delay unit includes a first inverter. The first inverter includes a fourth transistor and a fifth transistor. A substrate terminal of the fourth transistor is connected to the potential of the substrate terminal of the first transistor, and a substrate terminal of the fifth transistor is connected to the potential of the substrate terminal of the second transistor.

Since the potential of the first transistor varies with any of the power supply voltage, the operating temperature, and the manufacturing process, a variation of a substrate potential with the first parameter may be provided to the substrate terminal of the fourth transistor. Since the potential of the second transistor varies with any of the power supply voltage, the operating temperature, and the manufacturing process, a variation of a substrate potential with the first parameter may be provided to the substrate terminal of the fifth transistor. Thus, a current flowing through the two transistors of the first inverter may be adjusted, and a variation of the current flowing through the two transistors of the inverter may be compensated, so that the delay time T of the delay circuit may be with a slight variation, and thus the control capability of the delay circuit to accuracy of the delay time can be improved.

Specific structures of the control circuit and the delay circuit according to the disclosure will be illustrated in detail below through the specific embodiments.

Embodiment 1

Figure 4:
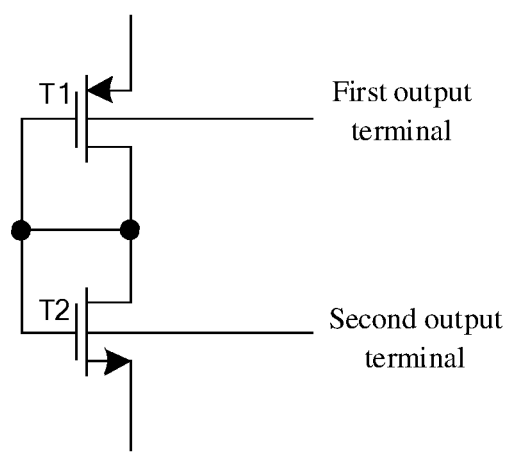
FIG. 4 is a schematic structural diagram of a potential generating circuit according to an embodiment of the disclosure.

FIG. 4 is a schematic structural diagram of a potential generating circuit according to an embodiment of the disclosure. As shown in FIG. 4, the potential generating circuit according to this embodiment may include a first transistor T1 and a second transistor T2. A potential of a substrate terminal of the first transistor T1 varies with a first parameter. The first parameter refers to any of a power supply voltage of the potential generating circuit, an operating temperature of the potential generating circuit, and a manufacturing process of the potential generating circuit. A potential of a substrate terminal of the second transistor T2 varies with the first parameter.

A gate terminal of the first transistor T1 is connected to a drain terminal thereof. The substrate terminal of the first transistor T1 serves as a first output terminal of the potential generating circuit. A gate terminal of the second transistor T2 is connected to a drain terminal thereof. The substrate terminal of the second transistor T2 serves as a second output terminal of the potential generating circuit.

Specifically, the potential of the substrate terminal of the first transistor T1 is a potential output from a first output terminal, and the potential of the substrate terminal of the second transistor T2 is a potential output from the second output terminal. Both of the potential of the substrate terminal of the first transistor T1 and the potential of the substrate terminal of the second transistor T2 may vary with the first parameter. Thus, the potential generating circuit provided in the embodiment can output a potential that varies with any of the power supply voltage, the operating temperature, and the manufacturing process.

Specifically, when the first parameter refers to the power supply voltage of the potential generating circuit or the operating temperature of the potential generating circuit, both of the potential of the substrate terminal of the first transistor T1 and the potential of the substrate terminal of the second transistor T2 may vary with the first parameter. In particular, the variation may include that the potential of the substrate terminal of the first transistor T1 rises along with an increase of the first parameter and falls along with a decrease of the first parameter, that is, the potential and the first parameter are directly proportional; or, the potential of the substrate terminal of the second transistor T2 falls along with an increase of the first parameter and rises along with a decrease of the first parameter.

In an implementation, the first transistor T1 is a P-type transistor, and the second transistor T2 is an N-type transistor.

In an implementation, a source terminal of the first transistor T1 is connected to a first voltage node, a source terminal of the second transistor T2 is connected to a second voltage node, and a drain terminal of the first transistor T1 is connected to a drain terminal of the second transistor T2.

Figure 5:
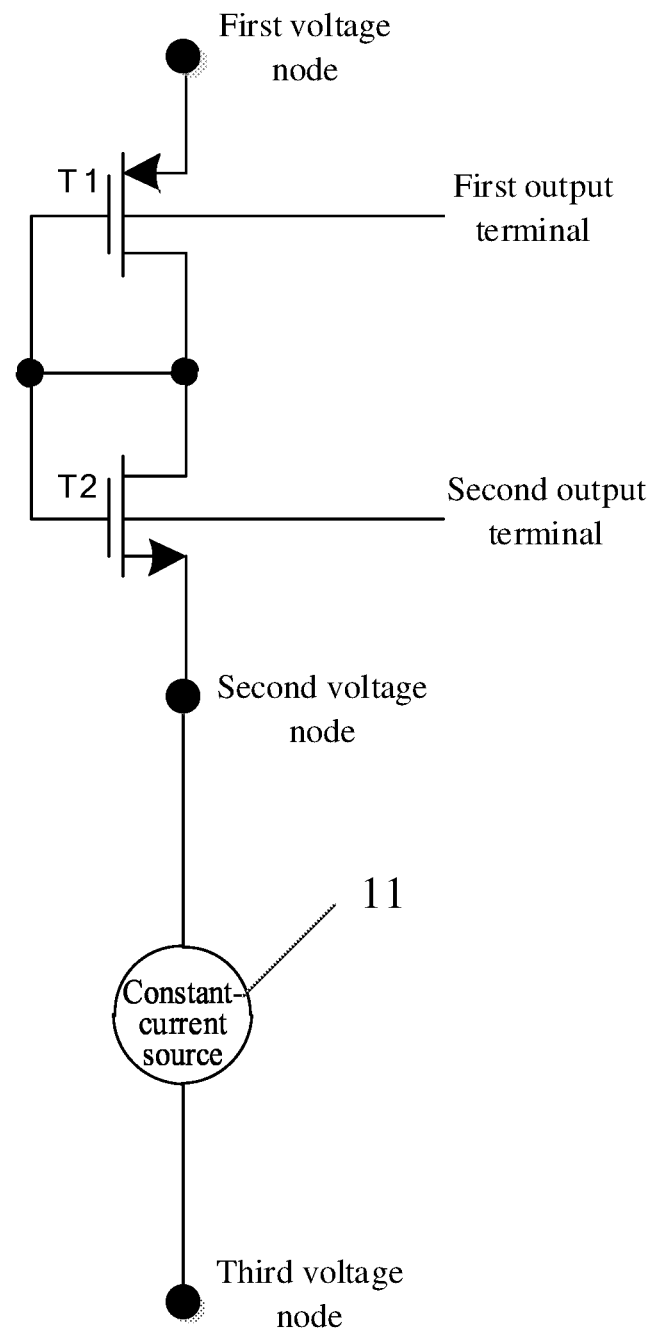
FIG. 5 is a schematic structural diagram of a potential generating circuit according to an embodiment of this application.

In the implementation, FIG. 5 is a schematic structural diagram of a potential generating circuit according to an embodiment of the disclosure. As shown in FIG. 5, based on the circuit shown in FIG. 4, the potential generating circuit according to this embodiment further includes a constant-current source 11. A first terminal of the constant-current source 11 is connected to the second voltage node, and a second terminal of the constant-current source 11 is connected to a third voltage node.

Figure 6:
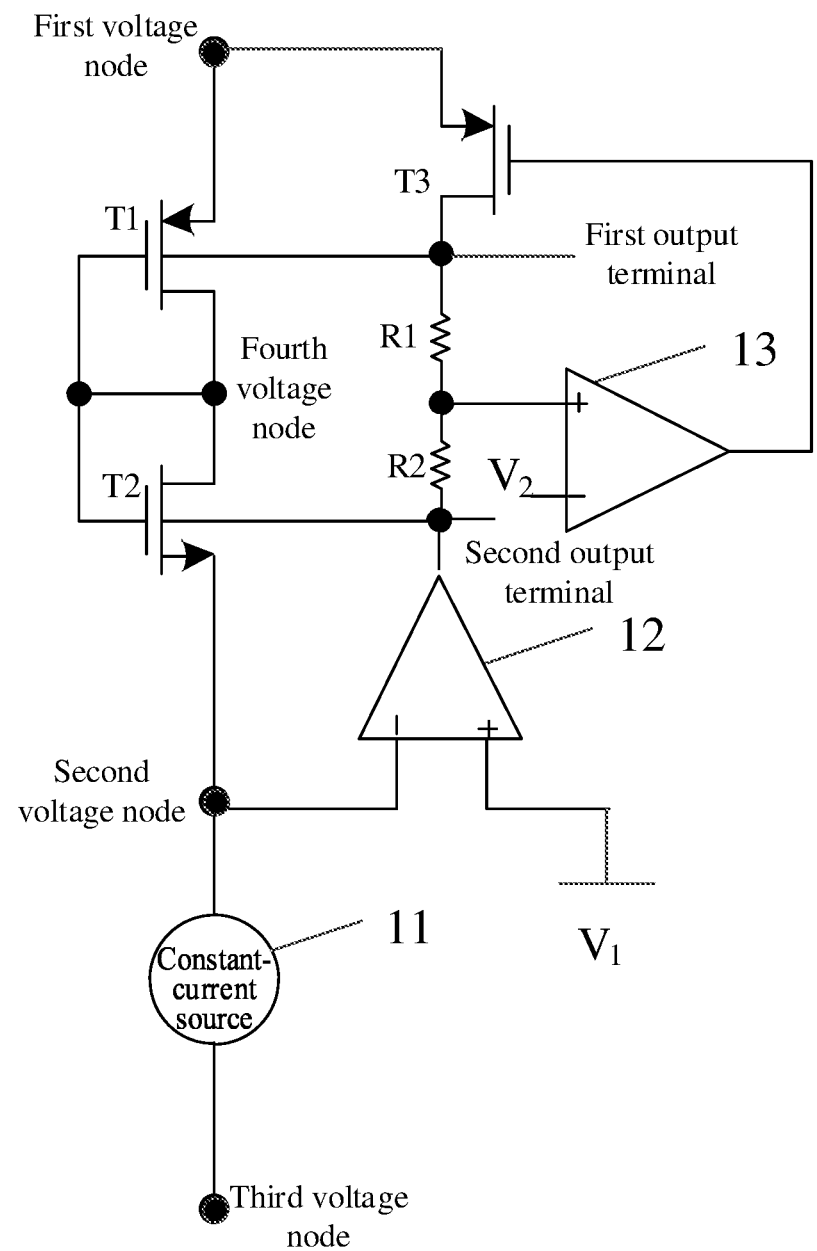
FIG. 6 is a schematic structural diagram of a potential generating circuit according to an embodiment of the disclosure.

FIG. 6 is a schematic structural diagram of a potential generating circuit according to an embodiment of the disclosure. As shown in FIG. 6, based on the circuit shown in FIG. 5, the potential generating circuit according to this embodiment may further include a first error amplifier 12, a second error amplifier 13, and a third transistor T3.

The first error amplifier 12 and the second transistor T2 form a first feedback loop, and the substrate terminal of the second transistor T2 is connected to a voltage node of the first feedback loop.

The second error amplifier 13 and the third transistor T3 form a second feedback loop, and the substrate terminal of the first transistor T1 is connected to a voltage node of the second feedback loop.

As shown in FIG. 6, alternatively, a negative input terminal of the first error amplifier 12 is connected to the second voltage node, a positive input terminal of the first error amplifier 12 is connected to a first reference voltage $V_1$, and an output terminal of the first error amplifier 12 is connected to the substrate terminal of the second transistor T2.

A negative input terminal of the second error amplifier 13 is connected to a second reference voltage $V_2$. A positive input terminal of the second error amplifier 13 is connected to a fourth voltage node. An output terminal of the second error amplifier 13 is connected to a gate terminal of the third transistor T3. A source terminal of the third transistor T3 is connected to the first voltage node. A drain terminal of the third transistor T3 is coupled to the fourth voltage node through a first resistor R1. The output terminal of the first error amplifier 12 is coupled to the fourth voltage node through a second resistor R2.

In the embodiment, the first voltage node may be connected to a power supply terminal, the first reference voltage $V_1$ may be connected to a ground terminal, and a potential of the third voltage node is less than that of the first reference voltage $V_1$.

In the potential generating circuit shown in FIG. 6, the first voltage node is connected to the power supply terminal, the first reference voltage $V_1$ is connected to the ground terminal, the potential of the third voltage node is less than that of $V_1$; that is, the potential of the third voltage node is less than 0. The potential of the first voltage node is greater than that of the third voltage node.

Another potential generating circuit is shown below with reference to FIGS. 7 and 8, which will be illustrated in detail below in conjunction with FIGS. 7 and 8.

Figure 7:
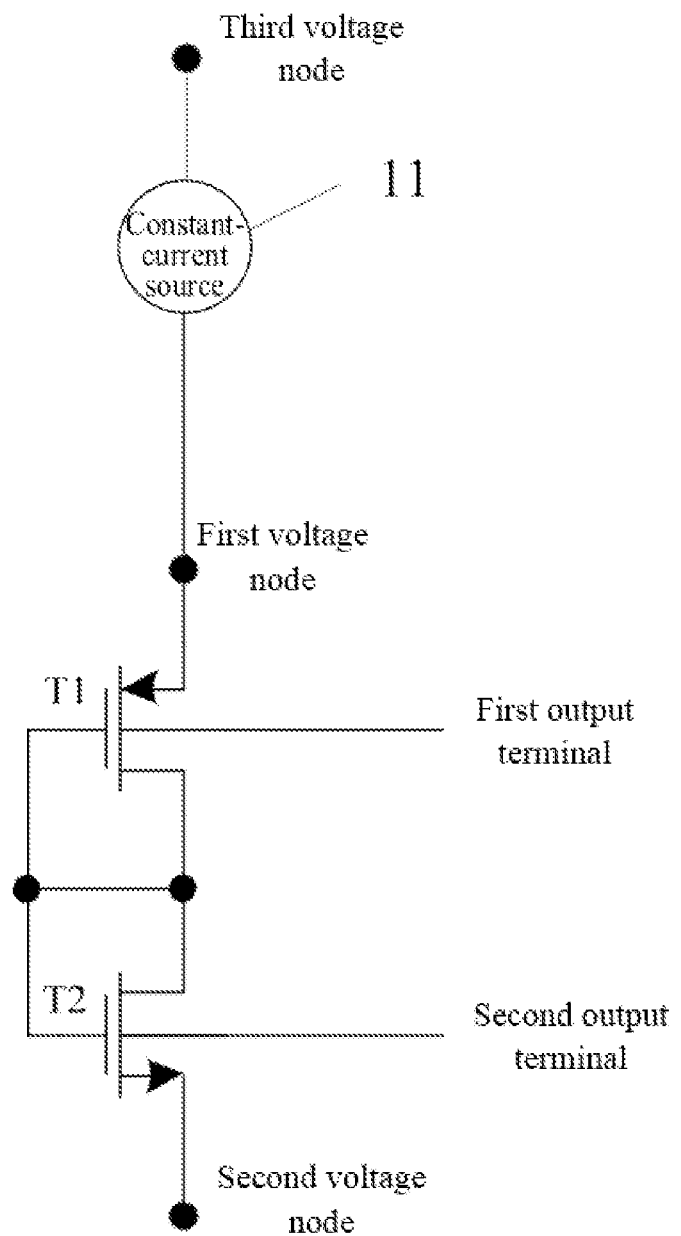
FIG. 7 is a schematic structural diagram of a potential generating circuit according to an embodiment of the disclosure.

FIG. 7 is a schematic structural diagram of a potential generating circuit according to an embodiment of the disclosure. As shown in FIG. 7, based on the circuit shown in FIG. 4, the potential generating circuit according to this embodiment further includes a constant-current source 11. A first terminal of the constant-current source 11 is connected to a third voltage node, and a second terminal of the constant-current source 11 is connected to the first voltage node.

Figure 8:
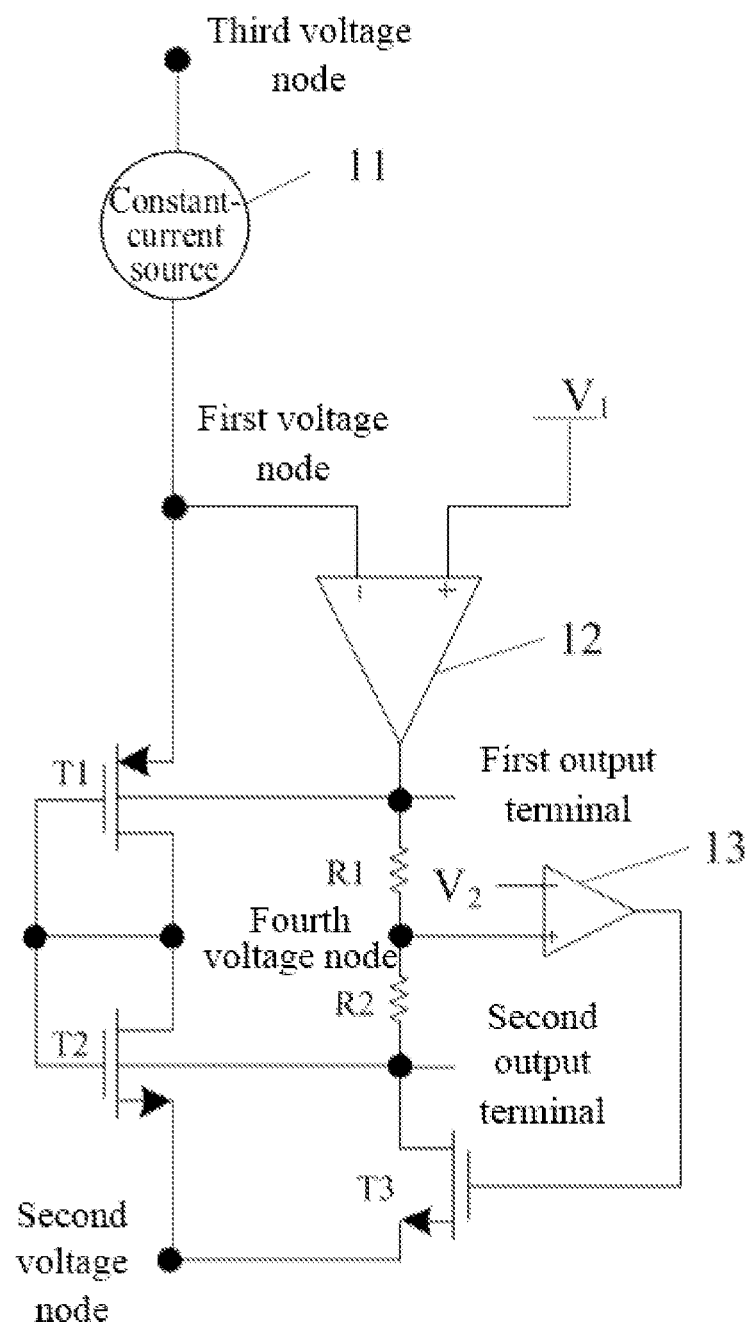
FIG. 8 is a schematic structural diagram of a potential generating circuit according to an embodiment of the disclosure.

FIG. 8 is a schematic structural diagram of a potential generating circuit according to an embodiment of the disclosure. As shown in FIG. 8, based on the circuit shown in FIG. 7, the potential generating circuit according to this embodiment may further include a first error amplifier 12 which forms a first feedback loop with the first transistor T1. The substrate terminal of the first transistor T1 is connected to a voltage node of the first feedback loop.

In addition, a second error amplifier 13 and a third transistor T3 are also included in the potential generating circuit. The second error amplifier 13 and the third transistor T3 form a second feedback loop, and the substrate terminal of the second transistor T2 is connected to a voltage node of the second feedback loop.

As shown in FIG. 8, alternatively, a negative input terminal of the first error amplifier 12 is connected to the first voltage node, a positive input terminal of the first error amplifier 12 is connected to a first reference voltage $V_1$, and an output terminal of the first error amplifier 12 is connected to the substrate terminal of the first transistor T1.

A negative input terminal of the second error amplifier 13 is connected to a second reference voltage $V_2$. A positive input terminal of the second error amplifier 13 is connected to a fourth voltage node. An output terminal of the second error amplifier 13 is connected to a gate terminal of the third transistor T3. A source terminal of the third transistor T3 is connected to the second voltage node. A drain terminal of the third transistor T3 is coupled to the fourth voltage node through a second resistor R2. The output terminal of the first error amplifier 12 is coupled to the fourth voltage node through a first resistor R1.

In the embodiment, the second voltage node may be connected to a ground terminal, the first reference voltage $V_1$ may be connected to a power supply terminal, and a potential of the third voltage node is greater than that of the first reference voltage $V_1$.

In the potential generating circuit shown in FIG. 8, the second voltage node is connected to the ground terminal, the first reference voltage $V_1$ is connected to the power supply terminal, the potential of the third voltage node is greater than that of $V_1$; that is, the potential of the third voltage node is greater than a potential of the power supply terminal. The potential of the first voltage node is less than that of the third voltage node.

The potential generating circuit shown in any of FIGS. 4 to 8 is provided with the first transistor and the second transistor. The gate terminal of the first transistor is connected to the drain terminal thereof. The substrate terminal of the first transistor serves as the first output terminal of the potential generating circuit. The gate terminal of the second transistor is connected to the drain terminal thereof. The substrate terminal of the second transistor serves as the second output terminal of the potential generating circuit. Since both of the potential of the substrate terminal of the first transistor and the potential of the substrate terminal of the second transistor may vary with the first parameter, the first output terminal and the second output terminal can respectively output a potential that varies with any of the power supply voltage, the operating temperature, and the manufacturing process.

Figure 9:
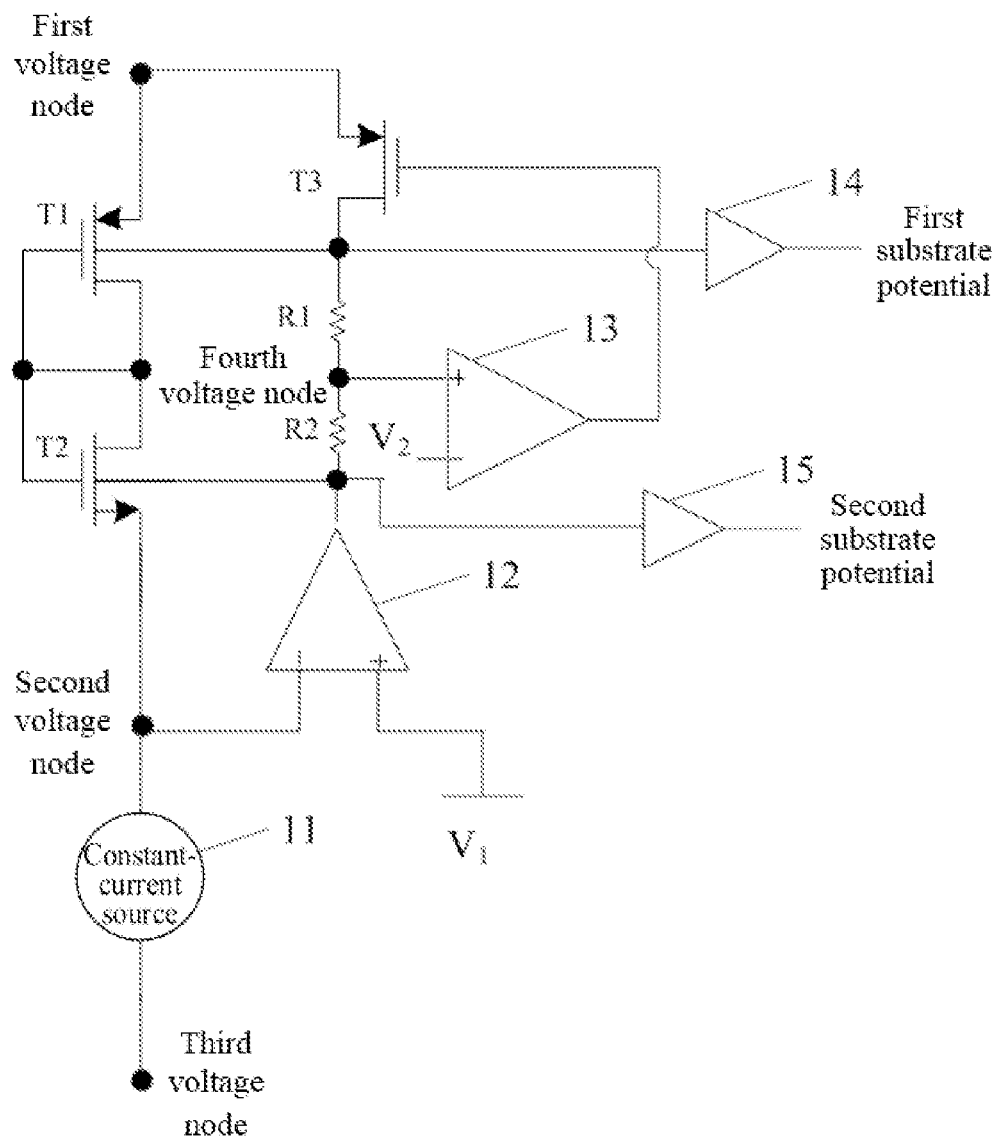
FIG. 9 is a schematic structural diagram of a potential generating circuit according to an embodiment of the disclosure.
Figure 10:
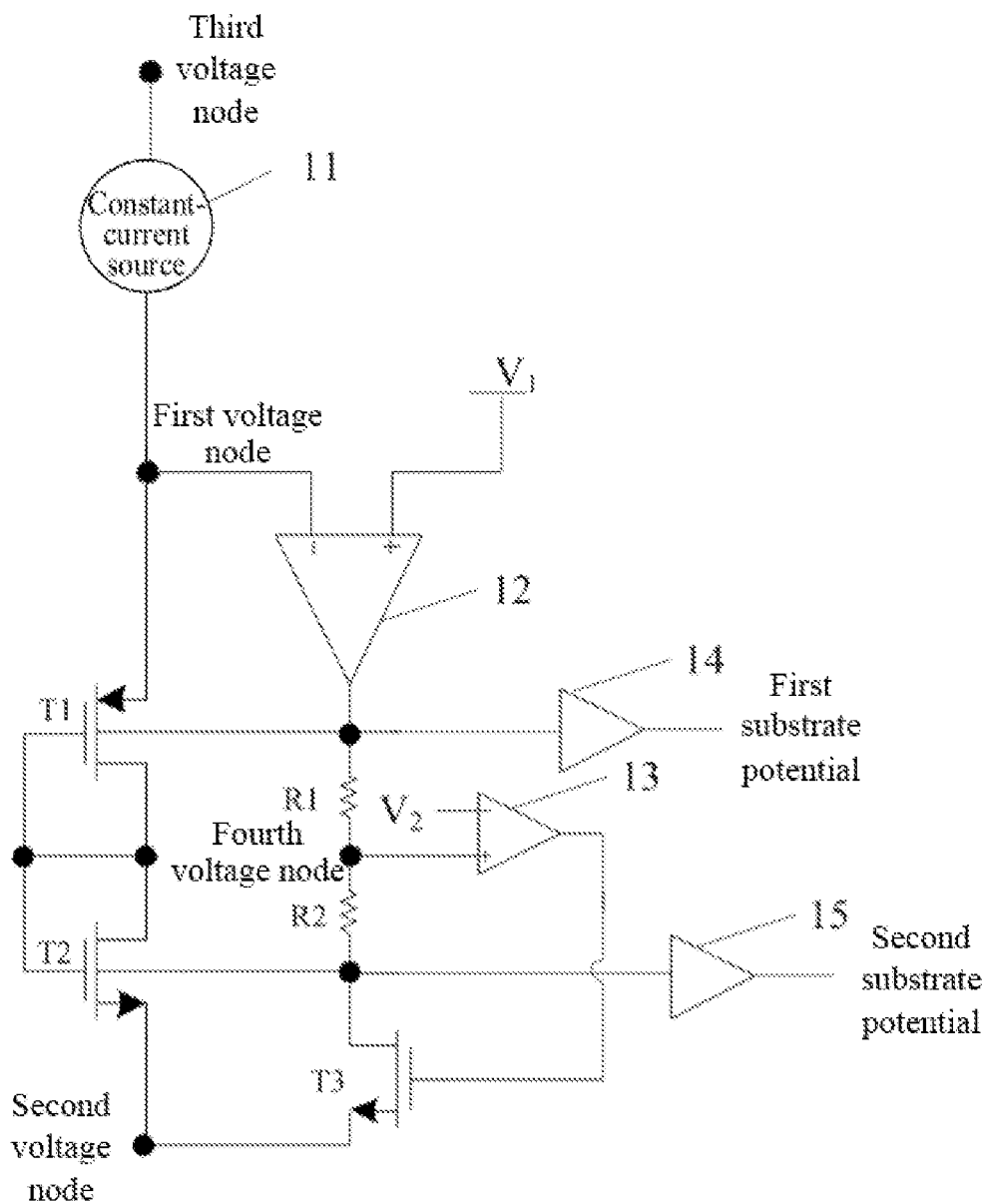
FIG. 10 is a schematic structural diagram of a potential generating circuit according to an embodiment of the disclosure.

Further, based on the potential generating circuit as shown in any of FIGS. 4 to 8, a first buffer 14 and a second buffer 15 may also be included in the potential generating circuit. FIG. 9 is a schematic structural diagram of a potential generating circuit according to an embodiment of the disclosure. FIG. 10 is a schematic structural diagram of a potential generating circuit according to an embodiment of the disclosure. Based on the circuit shown in FIG. 6, the potential generating circuit shown in FIG. 9 may further include a first buffer 14 and a second buffer 15. Based on the circuit shown in FIG. 8, the potential generating circuit shown in FIG. 10 may further include a first buffer 14 and a second buffer 15.

Referring to FIGS. 9 and 10, the first buffer 14 is connected to the first output terminal, and the first buffer 14 outputs a first substrate potential. A value of the first substrate potential is equal to a potential value of the substrate terminal of the first transistor T1. An input potential of the first buffer 14 is equal to an output potential thereof. The first buffer 14 is configured to improve the driving capability of the potential of the substrate terminal of the first transistor T1, and can also isolate the substrate terminal of the first transistor T1 to prevent the potential of the substrate terminal of the first transistor T1 from being interfered.

The second buffer 15 is connected to the second output terminal, and the second buffer 15 outputs a second substrate potential. A value of the second substrate potential is equal to a potential value of the substrate terminal of the second transistor T2. An input potential of the second buffer 15 is equal to an output potential thereof. The second buffer 15 is configured to improve the driving capability of the potential of the substrate terminal of the second transistor T2, and can also isolate the substrate terminal of the second transistor T2 to prevent the potential of the substrate terminal of the second transistor T2 from being interfered.

The structure of the potential generating circuit of this disclosure will be illustrated below with reference to the specific embodiments. The specific structure of the potential generating circuit of this disclosure is not limited to any of the following structures.

Figure 11:
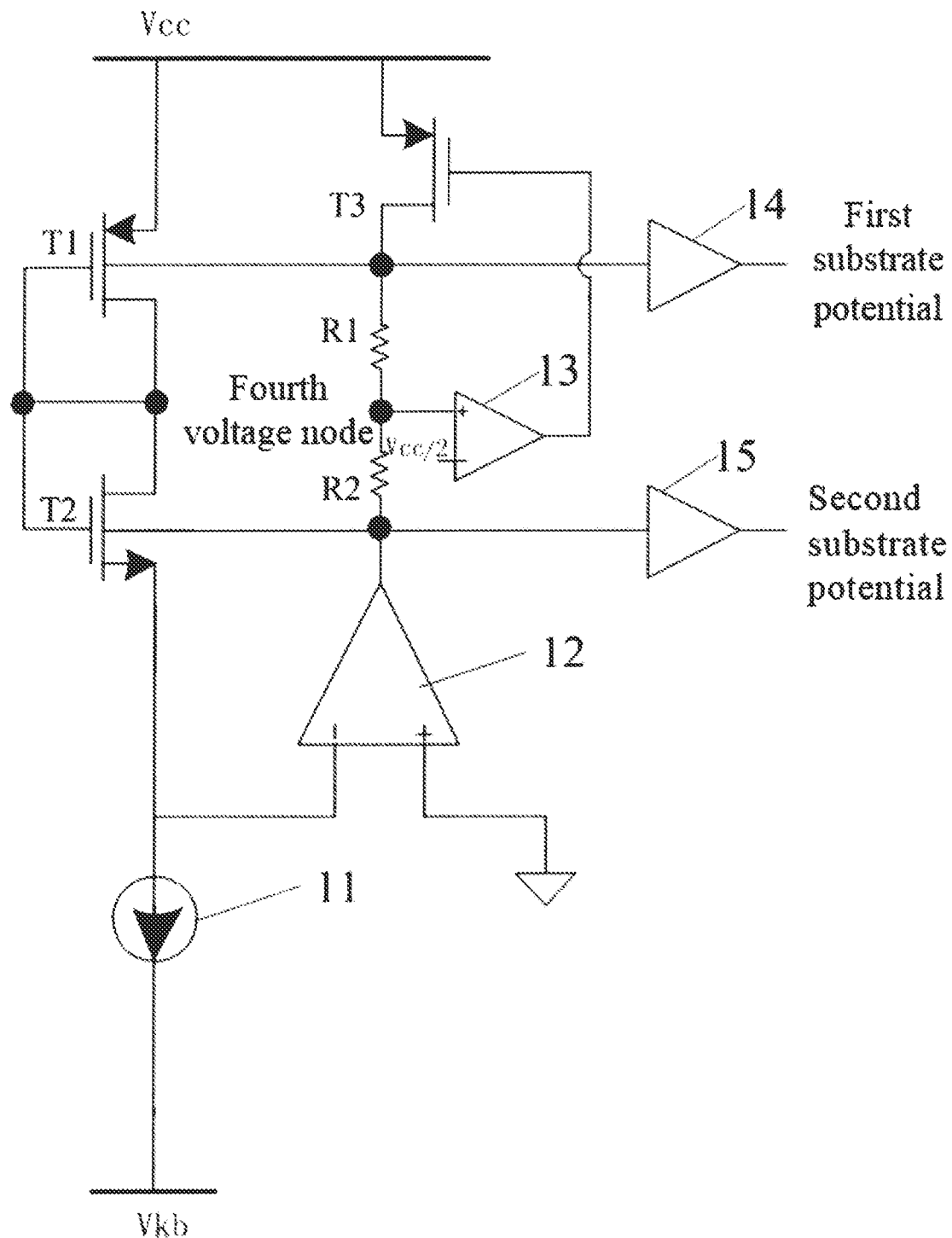
FIG. 11 is a schematic structural diagram of a potential generating circuit according to an embodiment of the disclosure.

FIG. 11 is a schematic structural diagram of a potential generating circuit according to an embodiment of the disclosure. The potential generating circuit according to this embodiment may include a first transistor T1, a second transistor T2, a constant-current source 11, a first error amplifier 12, a second error amplifier 13, a first resistor R1, a second resistor R2, a third transistor T3, a first buffer 14, and a second buffer 15.

In this embodiment, the first transistor T1 is a P-type transistor, and the second transistor T2 is an N-type transistor. A gate terminal of the first transistor T1 is connected to a drain terminal thereof. A gate terminal of the second transistor T2 is connected to a drain terminal thereof. A source terminal of the first transistor T1 is connected to a power supply terminal Vcc. A source terminal of the second transistor T2 is connected to a first terminal of the constant-current source 11. The drain terminal of the first transistor T1 is connected to the drain terminal of the second transistor T2. A second terminal of the constant-current source 11 is connected to Vkb, and a potential of Vkb is less than 0.

The first error amplifier 12 and the second transistor T2 form a first feedback loop. A negative input terminal of the first error amplifier 12 is connected to the source terminal of the second transistor T2 and the first terminal of the constant-current source 11. A positive input terminal of the first error amplifier 12 is connected to a ground terminal. An output terminal of the first error amplifier 12 is connected to a substrate terminal of the second transistor T2.

A negative input terminal of the second error amplifier 13 is connected to a power supply terminal which may be, for example, Vcc/2. A positive input terminal of the second error amplifier 13 is connected to a fourth voltage node. An output terminal of the second error amplifier 13 is connected to a gate terminal of the third transistor T3. A source terminal of the third transistor T3 is connected to the power supply terminal Vcc. A drain terminal of the third transistor T3 is coupled to the fourth voltage node through a first resistor R1. The output terminal of the first error amplifier 12 is coupled to the fourth voltage node through a second resistor R2.

The first buffer 14 is connected to a substrate terminal of the first transistor and the first buffer 14 outputs a first substrate potential. A value of the first substrate potential is equal to a potential value of the substrate terminal of the first transistor T1. The second buffer 15 is connected to a substrate terminal of the second transistor and the second buffer 15 outputs a second substrate potential. A value of the second substrate potential is equal to a potential value of the substrate terminal of the second transistor T2.

Alternatively, the first resistor R1 and the second resistor R2 may be set with large resistance values, for example, 100M Ω. Since the resistance values of the first resistor R1 and the second resistor R2 are set to be large, the output of the first error amplifier 12 may only slowly affect the input of the second error amplifier 13, and thus, there is a little influence on the first substrate potential.

In this embodiment, the potential of the substrate terminal of the first transistor T1 rises along with an increase of a first parameter, and falls along with a decrease of the first parameter. The potential of the substrate terminal of the second transistor T2 falls along with the increase of the first parameter, and rises along with the decrease of the first parameter. The first parameter refers to any of a power supply voltage of the potential generating circuit, an operating temperature of the potential generating circuit and a manufacturing process of the potential generating circuit.

Taking the first parameter referring to the operating temperature as an example, the principle that the potential of the substrate terminal of the first transistor T1 varies with the first parameter, and the principle that the potential of the substrate terminal of the second transistor T2 varies with the first parameter will be illustrated below in detail.

A current flowing through the first transistor T1 is $Id=\mu*Cox*(W/L)*(Vgs-Vth)^2$, where $\mu$ is an electronic mobility, Cox is a gate capacitance, Vgs is a voltage difference between a gate of the first transistor T1 and a source of the first transistor T1, and Vth is a threshold voltage. For example, when the operating temperature increases, the electronic mobility $\mu$ decreases, and the current Id flowing through the first transistor T1 is caused to be decreased, and a delay time of a corresponding inverter is caused to be prolonged. Here, if Vgs-Vth is adjusted to be greater, a current variation caused by a decrease of the electronic mobility $\mu$ may be compensated. The specific adjusted value may be set according to actual requirements. In the potential generating circuit shown in FIG. 11, if the temperature rises, the electronic mobility $\mu$ decreases, and the current Id flowing through the first transistor T1 also decreases. In order to keep the current of the constant-current source constant, the first substrate potential needs to be increased, for example, to be Vcc+100 mV, while the second substrate potential needs to be decreased, for example, to be −100 mV. When the temperature rises, the current Id flowing through the first transistor T1 and the second transistor T2 decreases. For the constant-current source 11, the current provided from an upper side of the constant-current source decreases, while the current flowing to a lower side of the constant-current source remains unvaried, so that the potential of the negative input terminal of the first error amplifier 12 decreases and the second substrate potential also decreases, which may cause an output of the first error amplifier 12 to gradually become −100 mV. Then, the potential of the positive input terminal of the second error amplifier 13 decreases, which may cause an output voltage of the second error amplifier 13 to be decreased and the pull-up capability of the third transistor T3 to be further improved. Thus, the voltage of the first substrate potential will increase, and the first substrate potential will gradually become Vcc+100 mV.

When the first parameter refers to the power supply voltage and the manufacturing process, a variation of the power supply voltage and the manufacturing process may cause a variation of the current Id flowing through the first transistor T1, thereby resulting in a variation of the delay time. The principle of compensation is similar to the foregoing principle, which will not be elaborated here.

Figure 12:
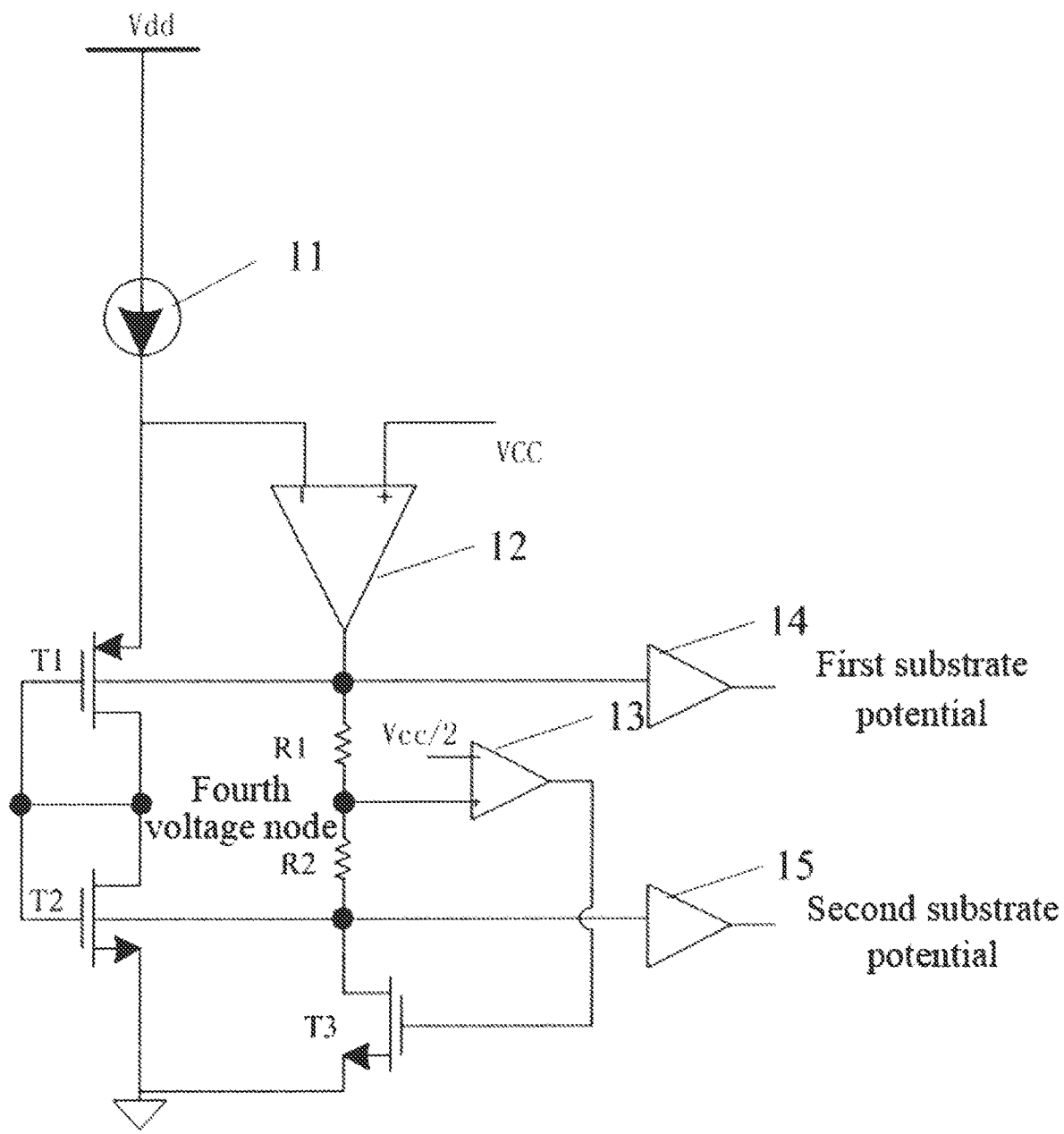
FIG. 12 is a schematic structural diagram of a potential generating circuit according to an embodiment of the disclosure.

FIG. 12 is a schematic structural diagram of a potential generating circuit according to an embodiment of the disclosure. The potential generating circuit according to this embodiment may include a first transistor T1, a second transistor T2, a constant-current source 11, a first error amplifier 12, a second error amplifier 13, a first resistor R1, a second resistor R2, a third transistor T3, a first buffer 14, and a second buffer 15.

In this embodiment, the first transistor T1 is a P-type transistor, and the second transistor T2 is an N-type transistor. A gate terminal of the first transistor T1 is connected to a drain terminal thereof. A gate terminal of the second transistor T2 is connected to a drain terminal thereof. A source terminal of the first transistor T1 is connected to a first terminal of the constant-current source 11. A source terminal of the second transistor T2 is connected to a ground terminal. The drain terminal of the first transistor T1 is connected to the drain terminal of the second transistor T2. A second terminal of the constant-current source 11 is connected to a power supply terminal Vdd.

The first error amplifier 12 and the first transistor T1 form a first feedback loop. A negative input terminal of the first error amplifier 12 is connected to the first terminal of the constant-current source 11. A positive input terminal of the first error amplifier is connected to a power supply terminal Vcc. An output terminal of the first error amplifier 12 is connected to a substrate terminal of the first transistor T1.

Vdd is greater than Vcc.

A negative input terminal of the second error amplifier 13 is connected to a power supply terminal which may be, for example, Vcc/2. A positive input terminal of the second error amplifier 13 is connected to a fourth voltage node. An output terminal of the second error amplifier 13 is connected to a gate terminal of the third transistor T3. A source terminal of the third transistor T3 is connected to the ground terminal. A drain terminal of the third transistor T3 is coupled to the fourth voltage node through a second resistor R2. The output terminal of the first error amplifier 12 is coupled to the fourth voltage node through a first resistor R1.

The first buffer 14 is connected to a substrate terminal of the first transistor, and the first buffer 14 outputs a first substrate potential. A value of the first substrate potential is equal to a potential value of the substrate terminal of the first transistor T1. The second buffer 15 is connected to a substrate terminal of the second transistor and the second buffer 15 outputs a second substrate potential. A value of the second substrate potential is equal to a potential value of the substrate terminal of the second transistor T2.

In this embodiment, the potential of the substrate terminal of the first transistor T1 rises along with an increase of a first parameter, and falls along with a decrease of the first parameter. The potential of the substrate terminal of the second transistor T2 falls along with the increase of the first parameter, and rises along with the decrease of the first parameter. The first parameter refers to any of a power supply voltage of the potential generating circuit, an operating temperature of the potential generating circuit and a manufacturing process of the potential generating circuit.

Taking the first parameter referring to the operating temperature as an example, the principle that the potential of the substrate terminal of the first transistor T1 varies with the first parameter, and the principle that the potential of the substrate terminal of the second transistor T2 varies with the first parameter will be illustrated below in detail.

A current flowing through the first transistor T1 is $Id=\mu*Cox*(W/L)*(Vgs-Vth)^2$, where $\mu$ is an electronic mobility, and Vth is a threshold voltage. For example, when the operating temperature increases, the electronic mobility $\mu$ decreases, and the current Id flowing through the first transistor T1 is caused to be decreased, and a delay time of a corresponding inverter is caused to be prolonged. Here, if Vgs-Vth is adjusted to be greater, a current variation caused by a decrease of the electronic mobility $\mu$ may be compensated. The specific adjusted value may be set according to actual requirements. In the potential generating circuit shown in FIG. 12, if the temperature rises, the electronic mobility $\mu$ decreases, and the current Id flowing through the first transistor T1 also decreases. In order to keep the current of the constant-current source constant, the second substrate potential needs to be decreased, for example, to be −100 mV, while the first substrate potential needs to be increased, for example, to be Vcc+100 mV. When the temperature rises, the current provided from an upper side of the constant-current source remains unvaried, the current flowing to a lower side of the constant-current source is equal to the current Id flowing through the first transistor T1 and the second transistor T2. When the current Id decreases, the potential of the negative input terminal of the first error amplifier 12 increases, and the first substrate potential also increases, which may cause an output voltage of the first error amplifier 12 to gradually become Vcc+100 mV. Then, the potential of the positive input terminal of the second error amplifier 13 increases, which may cause an output voltage of the second error amplifier 13 to be decreased and the pull-up capability of the third transistor T3 to be further improved. Thus, the voltage of the second substrate potential will decrease.

When the first parameter refers to the power supply voltage and the manufacturing process, the variation of the power supply voltage and the manufacturing process may cause a variation of the current Id flowing through the first transistor T1, thereby resulting in a variation of the delay time. The principle of compensation is similar to the foregoing principle, which will not be elaborated here.

The embodiment of this disclosure further provides a delay circuit, including the potential generating circuit shown in any of FIGS. 4 to 12 and a delay unit. The delay unit includes a first inverter. The first inverter includes a fourth transistor and a fifth transistor. A substrate terminal of the fourth transistor is connected to the potential of the substrate terminal of the first transistor T1, and a substrate terminal of the fifth transistor is connected to the potential of the substrate terminal of the second transistor T2.

In the delay circuit provided in the embodiment, since the potential of the first transistor in the potential generating circuit may vary with any of the power supply voltage, the operating temperature, and the manufacturing process, a first substrate potential that varies with the first parameter may be provided to the substrate terminal of the fourth transistor. Since the potential of the second transistor in the potential generating circuit may vary with any of the power supply voltage, the operating temperature, and the manufacturing process, and a second substrate potential that varies with a variation of the first parameter may be provided to the substrate terminal of the fifth transistor. Thus, the current flowing through the two transistors of the first inverter may be adjusted, and a variation of the current flowing through the two transistors of the inverter may be compensated, so that there is a slight variation of a delay time T of the delay circuit, and thus the control capability of the delay circuit to the accuracy of the delay time can be improved.

When the first transistor is a P-type transistor, the second transistor is an N-type transistor, the fourth transistor is a P-type transistor, and the fifth transistor is an N-type transistor. Since the first substrate potential that varies with the variation of the first parameter is provided to the substrate terminal of the P-type transistor, a variation of a rising edge delay time of the delay circuit may be adjusted, and the variation of the rising edge delay time of the delay circuit may be slight. In addition, since the second substrate potential that varies with the variation of the first parameter is provided to the substrate terminal of the N-type transistor, a variation of a falling edge delay time of the delay circuit may be adjusted, and the variation of the falling edge delay time of the delay circuit may be slight.

It should be noted that, in the embodiment of this disclosure, connection relationships between the potential generating circuit and inverters may be set according to the number of the inverters included in the delay circuit and the requirements for compensation of the delay time. For example, two inverters are connected in series; a substrate terminal of a P-type transistor of each inverter is connected to a substrate terminal of a P-type transistor of the potential generating circuit, so that the variation of the rising edge delay time of the delay circuit may be adjusted. A substrate terminal of an N-type transistor of the inverter is connected to a substrate terminal of an N-type transistor of the potential generating circuit, so that the variation of the falling edge delay time of the delay circuit may be adjusted. Specifically, the connection relationships between the potential generating circuit and the inverters may be set according to the variation of the rising edge delay time and/or the falling edge delay time required to be adjusted. The potential generating circuit provided in the embodiment of this disclosure may be applied to the delay circuit that requires both a rising edge delay and/or a falling edge delay. Therefore, the influence of the variation of the manufacturing process of the delay circuit, the power supply voltage of the delay circuit, and the operating temperature of the delay circuit on a delay time T of the delay circuit can be reduced, so that the delay time T (including the rising edge delay time and/or the falling edge delay time) may be with a slight variation, and thus the control capability of the delay circuit to the accuracy of the delay time can be improved.

Figure 13:
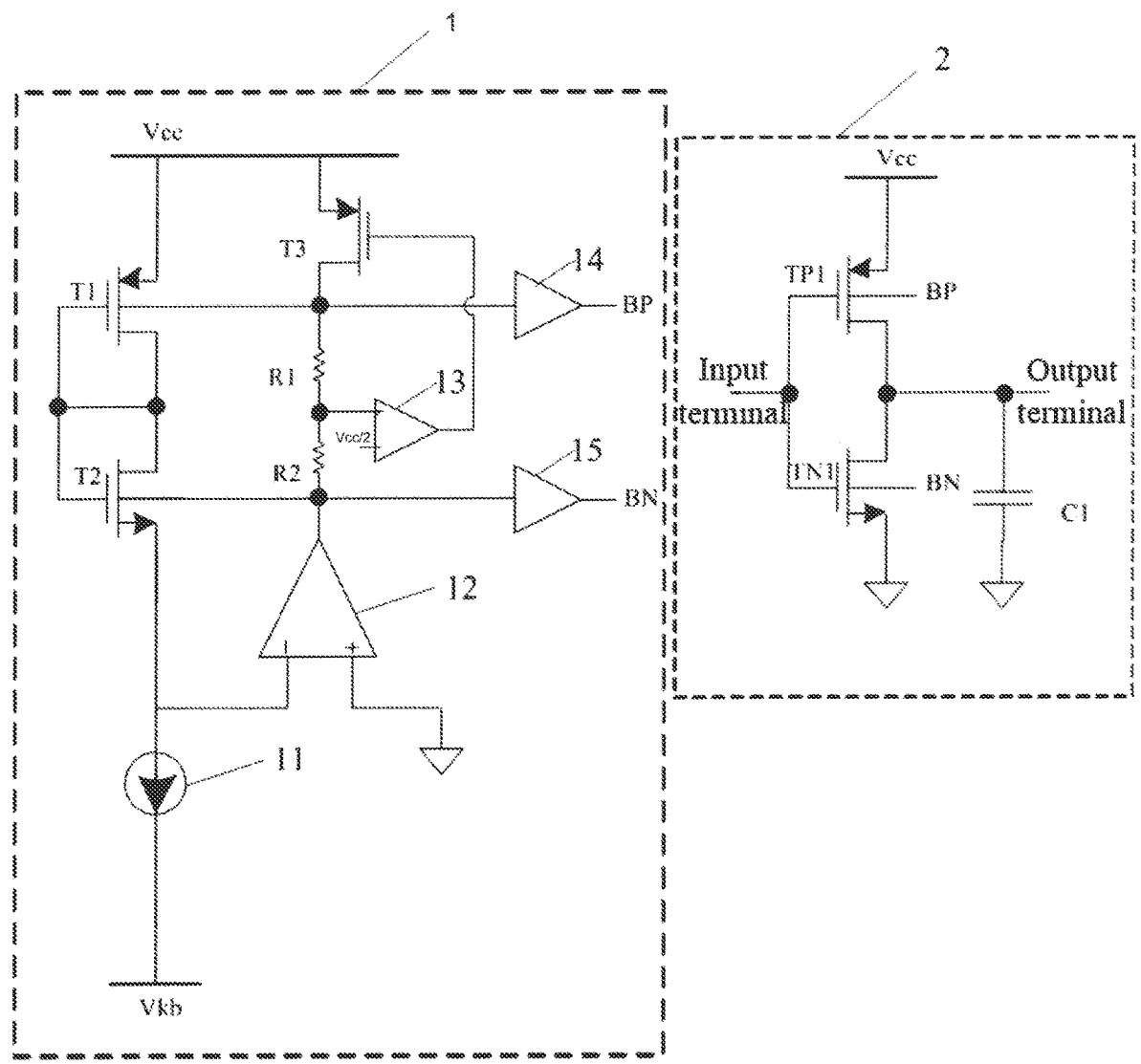
FIG. 13 is a schematic structural diagram of a delay circuit according to an embodiment of the disclosure.

Examples of the delay circuit in three types are illustrated below with reference to FIGS. 13 to 15. FIG. 13 is a schematic structural diagram of a delay circuit according to an embodiment of the disclosure. As shown in FIG. 13, the delay circuit according to the embodiment includes a potential generating circuit 1 and a delay unit 2. The potential generating circuit 1 is the circuit shown in FIG. 11, the description of the specific structure of the potential generating circuit 1 may refer to the description in the embodiment shown in FIG. 11, which will not be elaborated here. The potential generating circuit 1 outputs a first substrate potential BP and a second substrate potential BN. The delay unit 2 includes an inverter and a capacitor C1. The inverter includes a P-type transistor TP1 and an N-type transistor TN1. A substrate terminal of the P-type transistor TP1 is connected to the first substrate potential BP, and a substrate terminal of the N-type transistor TN1 is connected to the second substrate potential BN. In the delay circuit according to the embodiment, the potential generating circuit 1 provides the first substrate potential that varies with a variation of a first parameter to the substrate terminal of the P-type transistor in the delay unit 2. When an input terminal of the delay unit 2 refers to a falling edge, a variation of a rising edge delay time of the delay circuit may be adjusted by the first substrate potential BP, so that there is a slight variation of the rising edge delay time of the delay circuit. The potential generating circuit 1 provides the second substrate potential that varies with the variation of the first parameter to the substrate terminal of the N-type transistor in the delay unit 2. When the input terminal of the delay unit 2 refers to a rising edge, a variation of a falling edge delay time of the delay circuit may be adjusted by the second substrate potential BN, so that there is a slight variation of the falling edge delay time of the delay circuit. Thus, the influence of a manufacturing process of the delay circuit, a power supply voltage of the delay circuit, and an operating temperature of the delay circuit on the delay time T may be reduced, so that the delay time T (including the rising edge delay time and the falling edge delay time) may be with a slight variation, and thus the control capability of the delay circuit to accuracy of the delay time can be improved.

Figure 14:
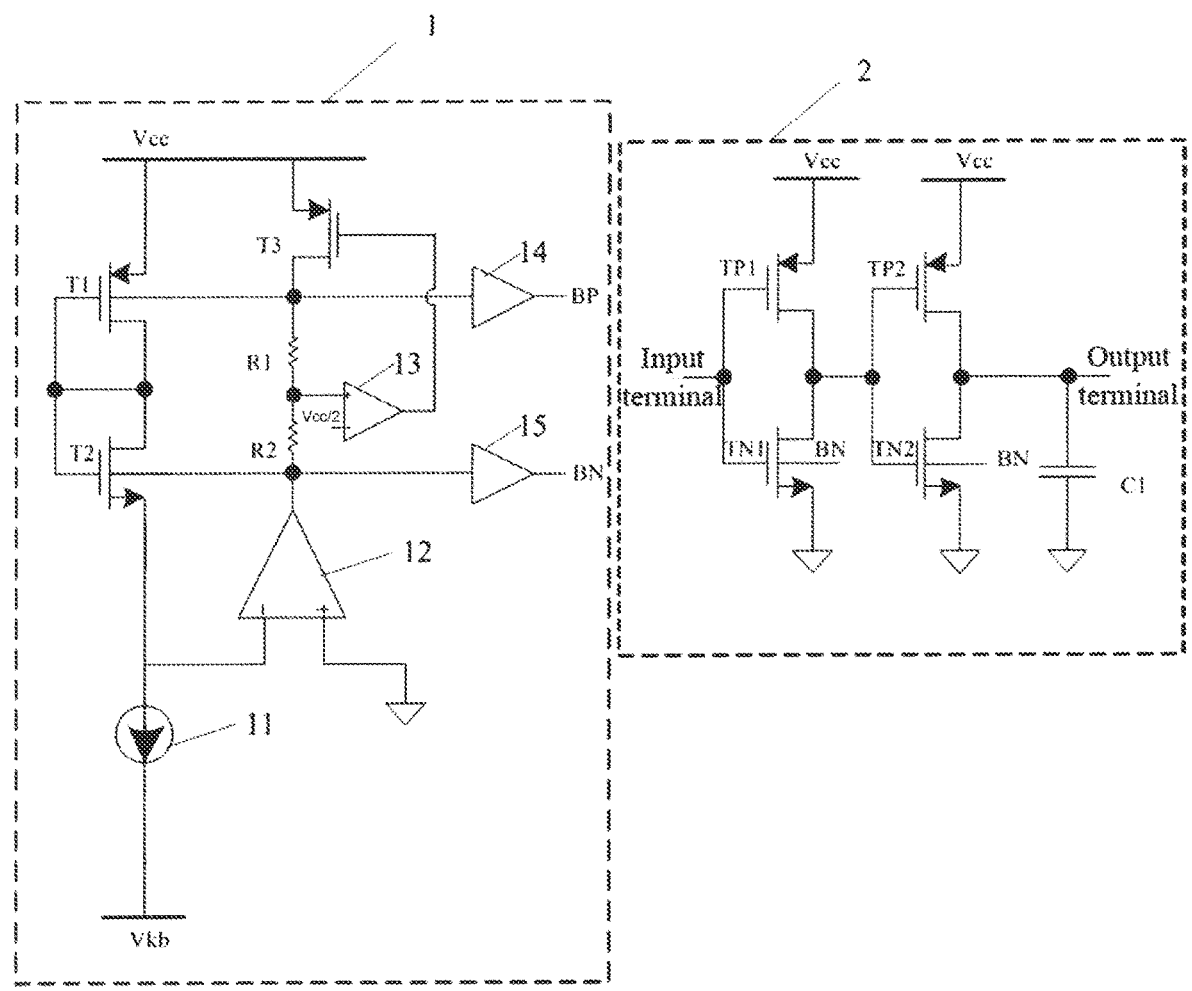
FIG. 14 is a schematic structural diagram of a delay circuit according to an embodiment of the disclosure.

FIG. 14 is a schematic structural diagram of a delay circuit according to an embodiment of the disclosure. As shown in FIG. 14, the delay circuit according to the embodiment includes a potential generating circuit 1 and a delay unit 2. The potential generating circuit 1 is the circuit shown in FIG. 11, the description of the specific structure of the potential generating circuit 1 may refer to the description in the embodiment shown in FIG. 11, which will not be elaborated here. The potential generating circuit 1 outputs a first substrate potential BP and a second substrate potential BN. The delay unit 2 includes a first inverter, a second inverter, and a capacitor C1. The first inverter includes a P-type transistor TP1 and an N-type transistor TN1. The second inverter includes a P-type transistor TP2 and an N-type transistor TN2. A substrate terminal of the N-type transistor TN1 in the delay unit 2 is connected to the second substrate potential BN, and a substrate terminal of the N-type transistor TN2 is also connected to the second substrate potential BN. In the delay circuit according to the embodiment, the potential generating circuit 1 provides the second substrate potential BN that varies with a variation of a first parameter to the substrate terminals of the N-type transistor TN1 and the N-type transistor TN2 in the delay unit 2. When an input terminal of the delay unit 2 refers to a rising edge, a variation of a falling edge delay time of the delay circuit may be adjusted, so that there is a slight variation of the falling edge delay time of the delay circuit. Thus, the influence of a manufacturing process of the delay circuit, a power supply voltage of the delay circuit, and an operating temperature of the delay circuit on the rising edge delay time T of the delay circuit may be reduced, so that the rising edge delay time T may be with a slight variation, and thus the control capability of the delay circuit to accuracy of the delay time can be improved.

It should be understood that in another delay circuit, a substrate terminal of the P-type transistor TP1 in the delay unit 2 is connected to the first substrate potential BP, and a substrate terminal of the P-type transistor TP2 is connected to the first substrate potential BP, so that the variation of the falling edge delay time of the delay circuit may be adjusted and the falling edge delay time of the delay circuit may be with a slight variation.

Figure 15:
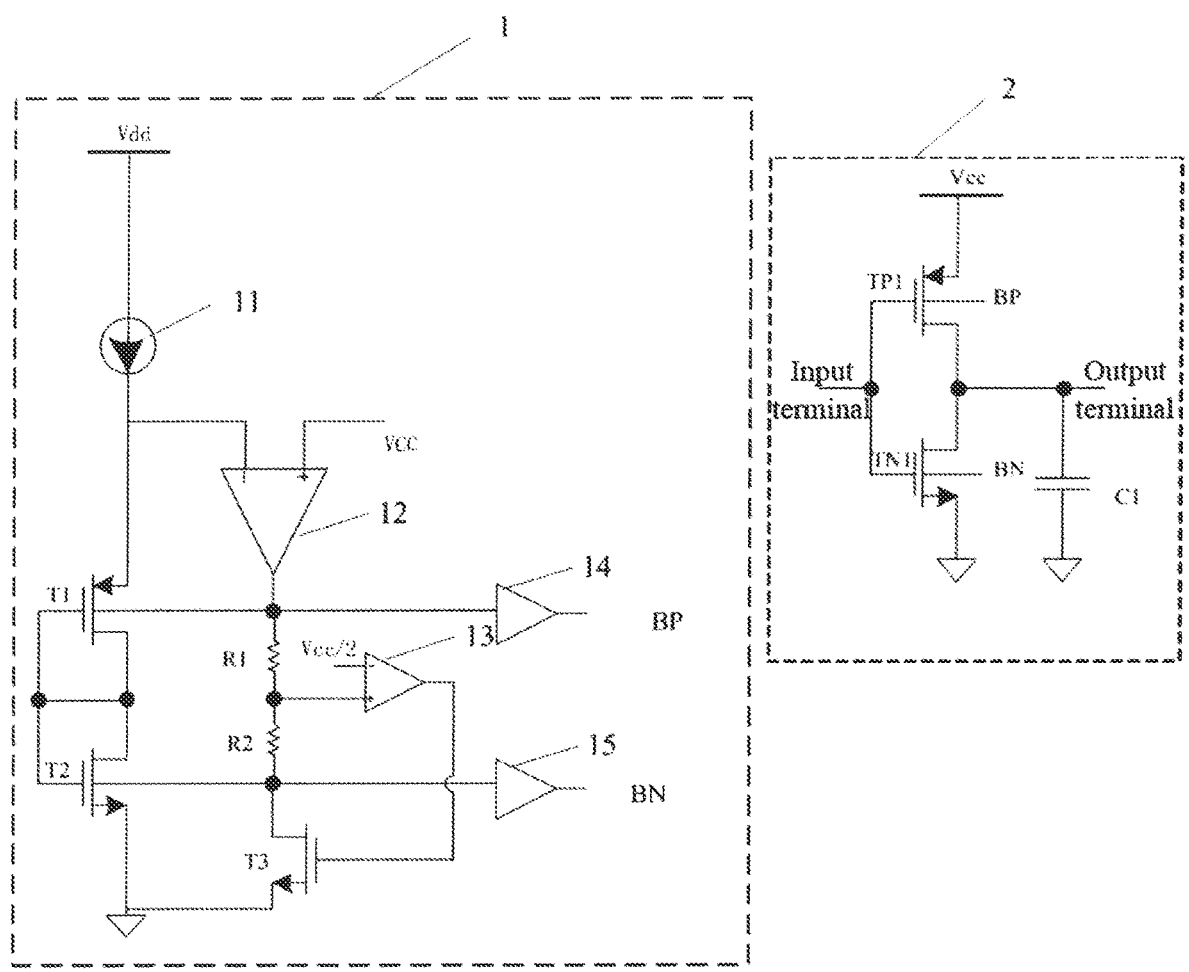
FIG. 15 is a schematic structural diagram of a delay circuit according to an embodiment of the disclosure.

FIG. 15 is a schematic structural diagram of a delay circuit according to an embodiment of the disclosure. As shown in FIG. 15, the difference of the delay circuit in this embodiment and the delay circuit shown in FIG. 13 lies in: the potential generating circuit 1 in this embodiment is the circuit shown in FIG. 12, and the other structures are the same, and the effects achieved are also the same, which will not be elaborated here.

The embodiment of the disclosure further provides a delay circuit, including the potential generating circuit shown in any of FIGS. 9 to 12 and a delay unit. The delay unit includes a first inverter. The first inverter includes a fourth transistor and a fifth transistor. A substrate terminal of the fourth transistor is connected to the first substrate potential, and a substrate terminal of the fifth transistor is connected to the second substrate potential.

In the delay circuit provided in the embodiment, since the first substrate potential in the potential generating circuit may vary with any of the power supply voltage, the operating temperature, and the manufacturing process, the first substrate potential that the varies with a variation of a first parameter may be provided to the substrate terminal of the fourth transistor. Since the second substrate potential of the second transistor may vary with a variation of any of the power supply voltage, the operating temperature, and the manufacturing process, the second substrate potential that varies with the variation of the first parameter may be provided to the substrate terminal of the fifth transistor. Thus, a current flowing through the two transistors of the first inverter may be adjusted, and a variation of the current flowing through the two transistors of the inverter may be compensated, so that a delay time T of the delay circuit may be with a slight variation, and thus the control capability of the delay circuit to accuracy of the delay time can be improved.

In the foregoing two delay circuits, a ratio of a channel length of the first transistor T1 to a channel length of the fourth transistor is denoted as H, a ratio of a channel length of the second transistor T2 to a channel length of the fifth transistor is denoted as L, a ratio of a channel width of the first transistor T1 to a channel width of the fourth transistor is denoted as M, and a ratio of a channel width of the second transistor T2 to a channel width of the fifth transistor is denoted as N, where H is equal to L, M is equal to N, and alternatively, H, L, M, and N may be 1. Alternatively, the first transistor and the fourth transistor may be of the same type, and the second transistor and the fifth transistor may be of the same type.

Figure 16:
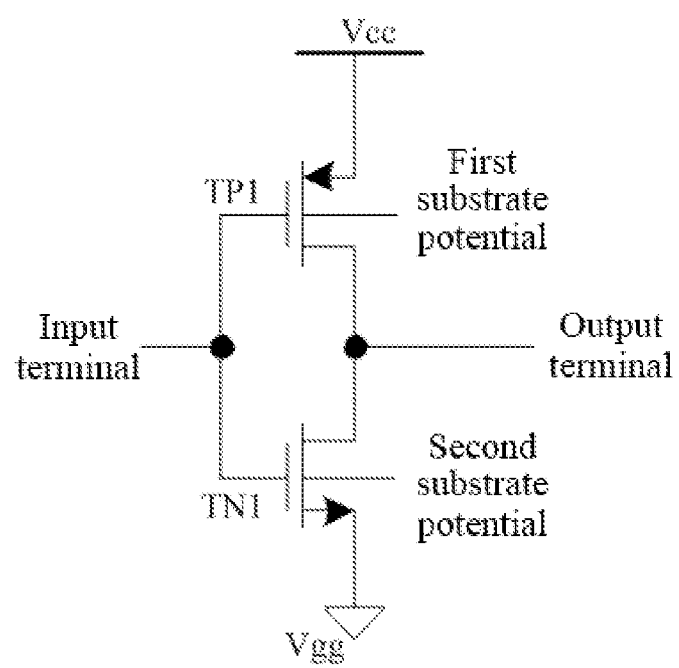
FIG. 16 is a schematic structural diagram of an inverter according to an embodiment of the disclosure.

The embodiment of this disclosure further provides an inverter. FIG. 16 is a schematic structural diagram of an inverter according to an embodiment of the disclosure. As shown in FIG. 16, the inverter includes a P-type transistor TP1 and an N-type transistor TN1.

A source terminal of the P-type transistor TP1 is connected to a power supply terminal. A drain terminal of the P-type transistor TP1 is connected to a drain terminal of the N-type transistor TN1. A source terminal of the N-type transistor TN1 is connected to a ground terminal. A gate terminal of the P-type transistor TP1 is connected to a gate terminal of the N-type transistor TN1 and the gate terminal of the P-type transistor TP1 serves as an input terminal of the inverter. The drain terminal of the P-type transistor serves as an output terminal of the inverter.

A substrate terminal of the P-type transistor TP1 is connected to a first substrate potential. A substrate terminal of the N-type transistor TN1 is connected to a second substrate potential. Both of the first substrate potential and the second substrate potential may vary with of a first parameter. The first parameter refers to any of a power supply voltage of the inverter, an operating temperature of the inverter, and a manufacturing process of the inverter.

When the first parameter refers to the power supply voltage of the inverter or the operating temperature of the inverter, the first substrate potential rises along with an increase of the first parameter, and falls along with a decrease of the first parameter; the second substrate potential falls along with the increase of the first parameter, and rises along with the decrease of the first parameter.

In the inverter provided in the embodiment, since the first substrate potential may vary with any of the power supply voltage, the operating temperature, and the manufacturing process, the first substrate potential that varies with the first parameter may be provided to the substrate terminal of TP1. Since the second substrate potential may vary with any of the power supply voltage, the operating temperature, and the manufacturing process, the second substrate potential that varies with the first parameter may be provided to the substrate terminal of TN1. Thus, a current flowing through the P-type transistor and the N-type transistor of the inverter may be adjusted, and a variation of the current flowing through the two transistors of the inverter may be compensated, so that a delay time T of the delay circuit may be with a slight variation, and thus the control capability of the delay circuit to accuracy of the delay time can be improved.

Figure 17:
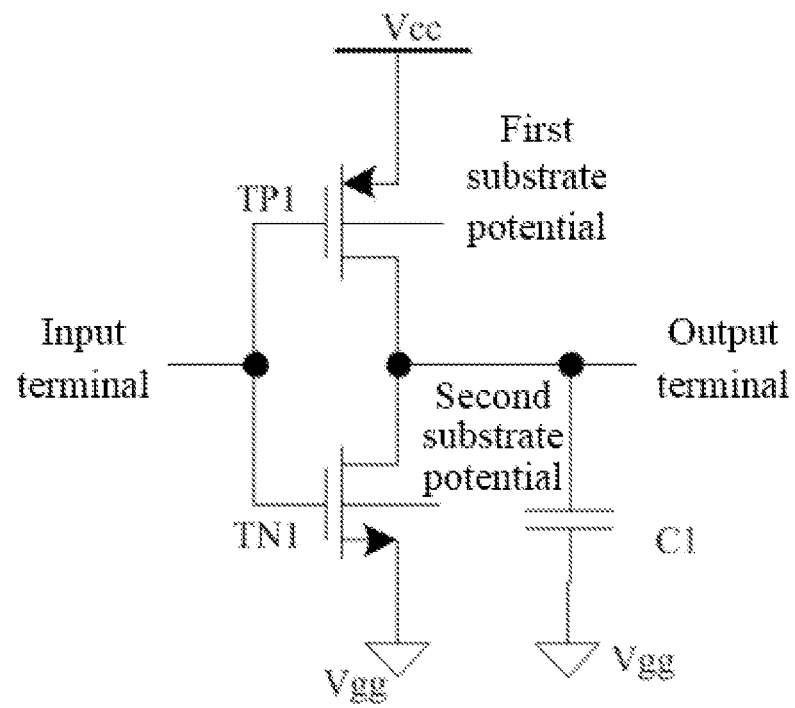
FIG. 17 is a schematic structural diagram of a delay circuit according to an embodiment of the disclosure.

The embodiment of the disclosure further provides a delay circuit. FIG. 17 is a schematic structural diagram of a delay circuit according to an embodiment of the disclosure. As shown in FIG. 17, the delay circuit according to the embodiment may include the inverter shown in FIG. 16 and a capacitor C1. One terminal of the capacitor C1 is connected to the ground terminal. In an implementation, the capacitor C1 may be a capacitor array.

The delay circuit provided in the embodiment may compensate the variation of the current flowing through the two transistors of the inverter, so that the delay time T of the inverter may have less variation, further the delay time T of the delay circuit may be with a slight variation, and thus the control capability of the delay circuit to the accuracy of the delay time can be improved.

The embodiment of this disclosure further provides a logic gate circuit, including a P-type transistor and an N-type transistor. A substrate terminal of the P-type transistor is connected to a first substrate potential. A substrate terminal of the N-type transistor is connected to a second substrate potential. Both of the first substrate potential and the second substrate potential may vary with a first parameter, so that a delay time of the logic gate circuit from an input terminal to an output terminal may vary with a variation of the first parameter within a first range. The first parameter refers to any of a power supply voltage of the logic gate circuit, an operating temperature of the logic gate circuit, and a manufacturing process of the logic gate circuit.

Specifically, the first range is a small range, for example, a range close to 0, such as, the first range being 1%, 3% or 5%, so that the delay time of the logic gate circuit from the input terminal to the output terminal, may be with a slight variation when there is a variation of any of the power supply voltage, the operating temperature, and the manufacturing process, and thus the control capability of the logic gate circuit to accuracy of the delay time can be improved.

Embodiment 2

Figure 18:
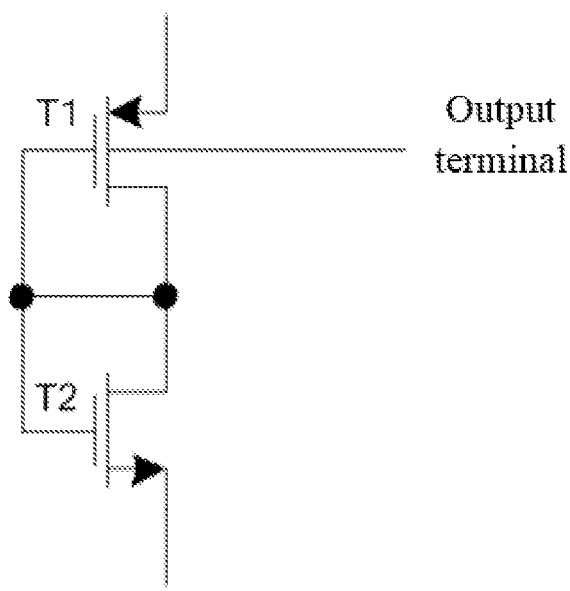
FIG. 18 is a schematic structural diagram of a potential generating circuit according to an embodiment of the disclosure.

FIG. 18 is a schematic structural diagram of a potential generating circuit according to an embodiment of the disclosure. As shown in FIG. 18, the potential generating circuit according to this embodiment may include a first transistor T1 and a second transistor T2. A potential of a substrate terminal of the first transistor T1 varies with a first parameter. The first parameter refers to any of a power supply voltage of the potential generating circuit, an operating temperature of the potential generating circuit, and a manufacturing process of the potential generating circuit.

A gate terminal of the first transistor T1 is connected to a drain terminal thereof. The substrate terminal of the first transistor T1 serves as an output terminal of the potential generating circuit. A gate terminal of the second transistor T2 is connected to a drain terminal thereof.

Specifically, the potential of the substrate terminal of the first transistor T1 is a potential output from the output terminal. The potential of the substrate terminal of the first transistor T1 varies with the variation of the first parameter. Thus, the potential generating circuit provided in the embodiment can output a potential that varies with any of the power supply voltage, the operating temperature, and the manufacturing process.

Specifically, when the first parameter refers to the power supply voltage of the potential generating circuit or the operating temperature of the potential generating circuit, the potential of the substrate terminal of the first transistor T1 varies with the first parameter. In particular, the variation may include that the potential of the substrate terminal of the first transistor T1 rises along with an increase of the first parameter, and falls along with a decrease of the first parameter, that is, the potential and the first parameter are directly proportional.

In an implementation, the first transistor T1 is a P-type transistor, and the second transistor T2 is an N-type transistor.

In an implementation, a source terminal of the first transistor T1 is connected to a first voltage node, a source terminal of the second transistor T2 is connected to a second voltage node, a drain terminal of the first transistor T1 is connected to a drain terminal of the second transistor T2, and a substrate terminal of the second transistor T2 is connected to the second voltage node.

Figure 19:
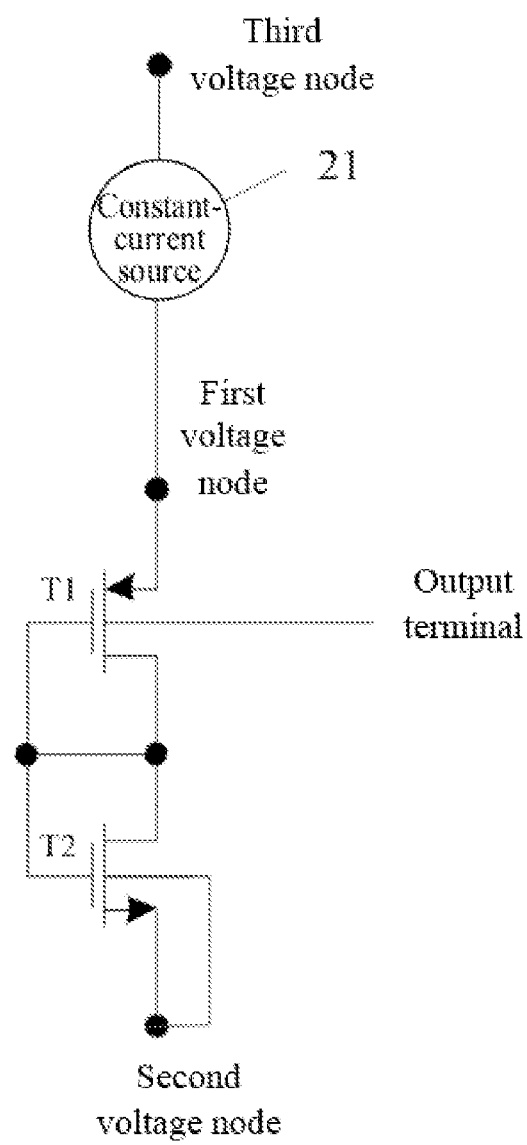
FIG. 19 is a schematic structural diagram of a potential generating circuit according to an embodiment of the disclosure.

In the implementation, FIG. 19 is a schematic structural diagram of a potential generating circuit according to an embodiment of the disclosure. As shown in FIG. 19, based on the circuit shown in FIG. 18, the potential generating circuit according to this embodiment further includes a constant-current source 21. A first terminal of the constant-current source 21 is connected to the first voltage node, and a second terminal of the constant-current source 21 is connected to a third voltage node.

Figure 20:
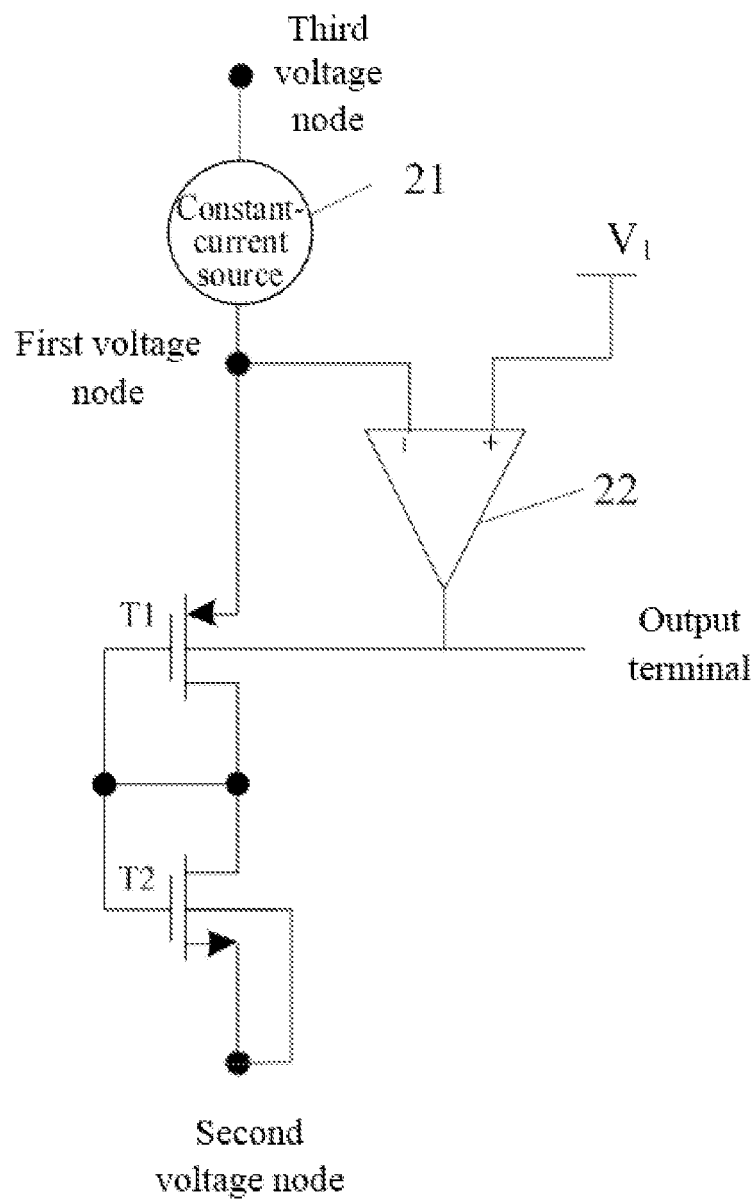
FIG. 20 is a schematic structural diagram of a potential generating circuit according to an embodiment of the disclosure.

FIG. 20 is a schematic structural diagram of a potential generating circuit according to an embodiment of the disclosure. As shown in FIG. 20, based on the circuit shown in FIG. 19, the potential generating circuit according to this embodiment may further include an error amplifier 22 which forms a feedback loop with the first transistor T1. Here, the substrate terminal of the first transistor T1 is connected to a voltage node of the first feedback loop.

As shown in FIG. 20, alternatively, a negative input terminal of the error amplifier 22 is connected to the first voltage node, a positive input terminal of the error amplifier 22 is connected to a first reference voltage $V_1$, and an output terminal of the error amplifier 22 is connected to the substrate terminal of the first transistor T1.

In the embodiment, the first reference voltage $V_1$ may be connected to a power supply terminal, and a potential of the third voltage node is greater than that of the first reference voltage $V_1$.

In the potential generating circuit shown in FIG. 20, the potential of the third voltage node is greater than that of the first reference voltage $V_1$, and the potential of the first voltage node is less than that of the third voltage node. For example, the voltage of the third voltage node may be Vdd, and the first reference voltage $V_1$ may be equal to Vcc, where Vdd is greater than Vcc.

The potential generating circuit shown in any of FIGS. 18 to 20 is provided with the first transistor and the second transistor. The gate terminal of the first transistor is connected to the drain terminal thereof. The substrate terminal of the first transistor serves as the output terminal of the potential generating circuit. The gate terminal of the second transistor is connected to the drain terminal thereof. Since the potential of the substrate terminal of the first transistor varies with the first parameter, the output terminal can output a potential that varies with any of the power supply voltage, the operating temperature, and the manufacturing process.

Figure 21:
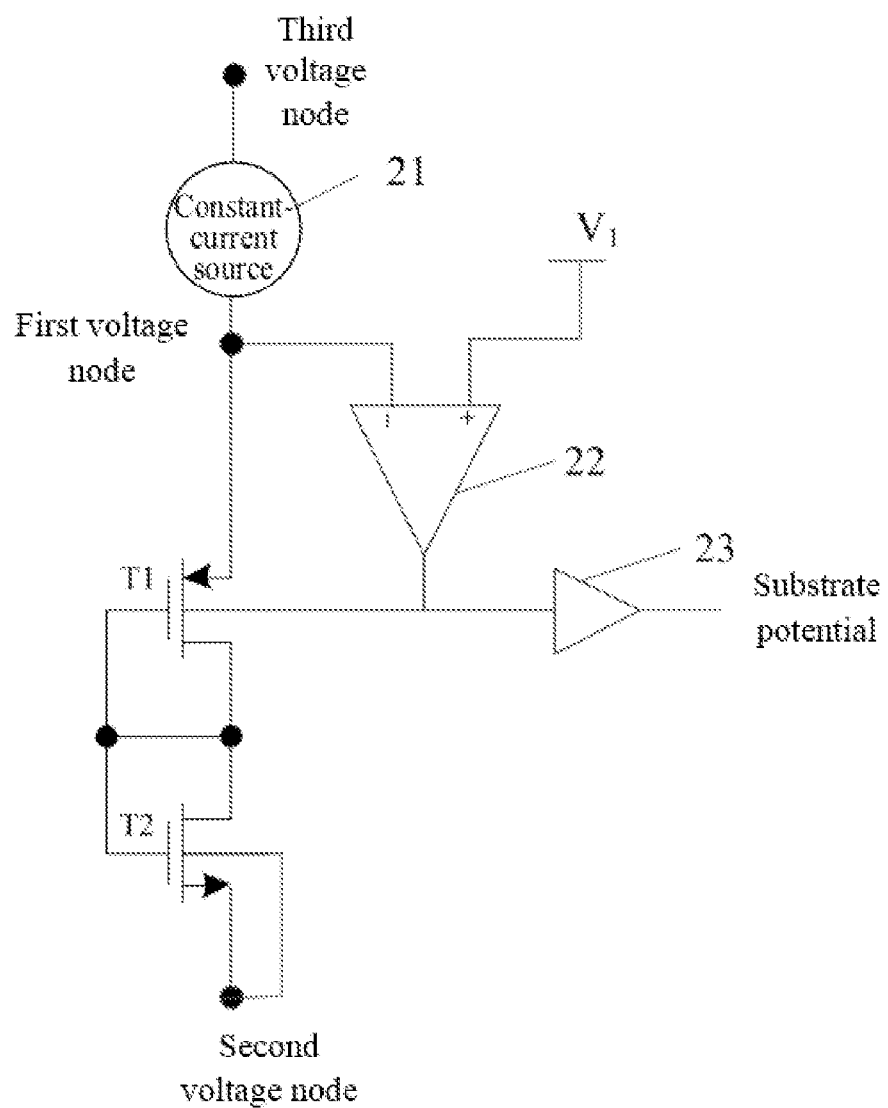
FIG. 21 is a schematic structural diagram of a potential generating circuit according to an embodiment of the disclosure.

FIG. 21 is a schematic structural diagram of a potential generating circuit according to an embodiment of the disclosure. As shown in FIG. 21, based on the potential generating circuit shown in FIG. 20, the potential generating circuit according to this embodiment may further include a buffer 23. The buffer 23 is connected to the output terminal, and the buffer 23 outputs a substrate potential. A value of the substrate potential is equal to a potential value of the substrate terminal of the first transistor T1. An input potential of the buffer 23 is equal to an output potential thereof. The buffer 23 is configured to improve the driving capability of the potential of the substrate terminal of the first transistor T1, and can also isolate the substrate terminal of the first transistor T1 to prevent the potential of the substrate terminal of the first transistor T1 from being interfered.

Figure 22:
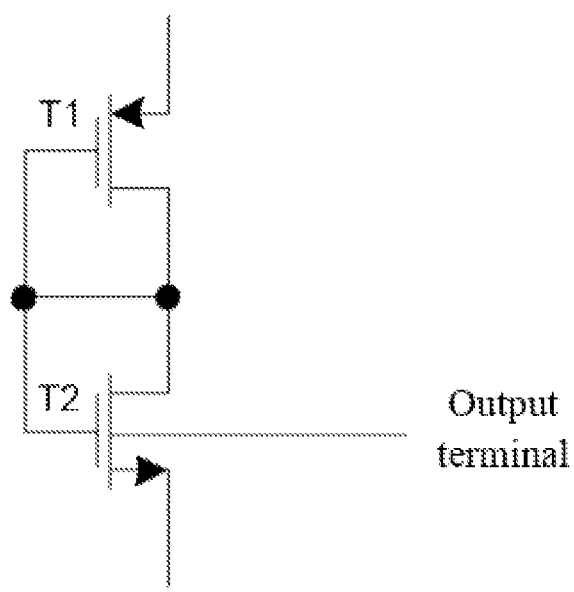
FIG. 22 is a schematic structural diagram of a potential generating circuit according to an embodiment of the disclosure.

Another type of potential generating circuit is shown below with reference to FIGS. 22 to 25. FIG. 22 is a schematic structural diagram of a potential generating circuit according to an embodiment of the disclosure. As shown in FIG. 22, the potential generating circuit according to this embodiment may include a first transistor T1 and a second transistor T2. A potential of a substrate terminal of the second transistor T2 varies with a first parameter. The first parameter refers to any of a power supply voltage of the potential generating circuit, an operating temperature of the potential generating circuit, and a manufacturing process of the potential generating circuit.

A gate terminal of the first transistor T1 is connected to a drain terminal thereof. A gate terminal of the second transistor T2 is connected to a drain terminal thereof. The substrate terminal of the second transistor serves as an output terminal of the potential generating circuit.

Specifically, the potential of the substrate terminal of the second transistor T2 is a potential output from the output terminal. The potential of the substrate terminal of the second transistor T2 varies with the first parameter. Thus, the potential generating circuit provided in the embodiment can output a potential that varies with any of the power supply voltage, the operating temperature, and the manufacturing process.

Specifically, when the first parameter refers to the power supply voltage of the potential generating circuit or the operating temperature of the potential generating circuit, the potential of the substrate terminal of the second transistor T2 varies with the first parameter. In particular, the variation may include that the potential of the substrate terminal of the second transistor T2 falls along with an increase of the first parameter and rises along with a decrease of the first parameter.

In an implementation, the first transistor T1 is a P-type transistor, and the second transistor T2 is an N-type transistor.

In an implementation, a source terminal of the first transistor T1 is connected to a first voltage node, a source terminal of the second transistor T2 is connected to a second voltage node, a drain terminal of the first transistor T1 is connected to a drain terminal of the second transistor T2, and a substrate terminal of the first transistor T1 is connected to the first voltage node.

Figure 23:
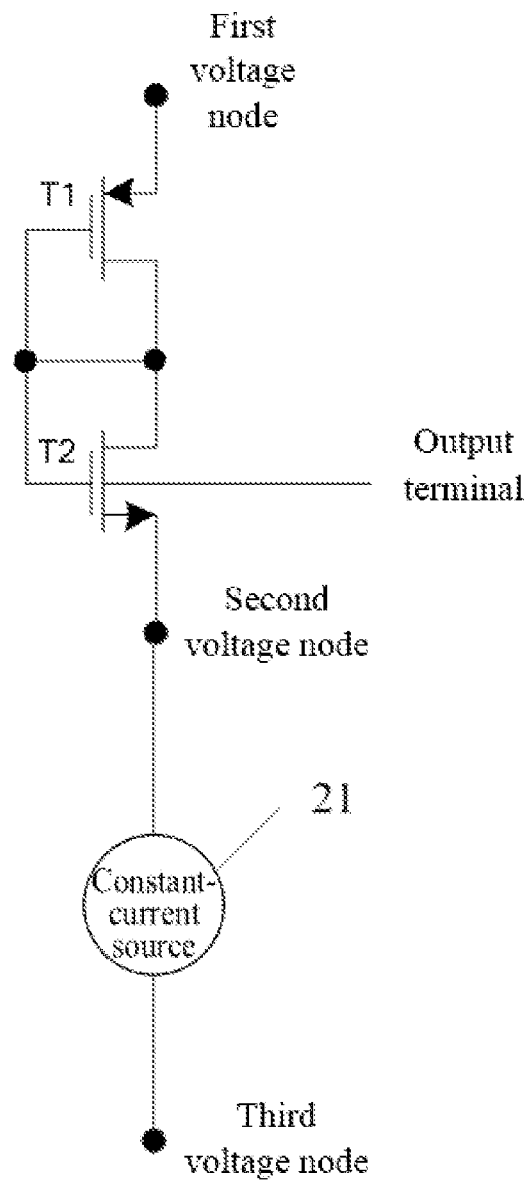
FIG. 23 is a schematic structural diagram of a potential generating circuit according to an embodiment of the disclosure.

In the implementation, FIG. 23 is a schematic structural diagram of a potential generating circuit according to an embodiment of the disclosure. As shown in FIG. 23, based on the circuit shown in FIG. 22, the potential generating circuit according to this embodiment may further include a constant-current source 21. A first terminal of the constant-current source 21 is connected to a third voltage node, and a second terminal of the constant-current source 21 is connected to the second voltage node.

Figure 24:
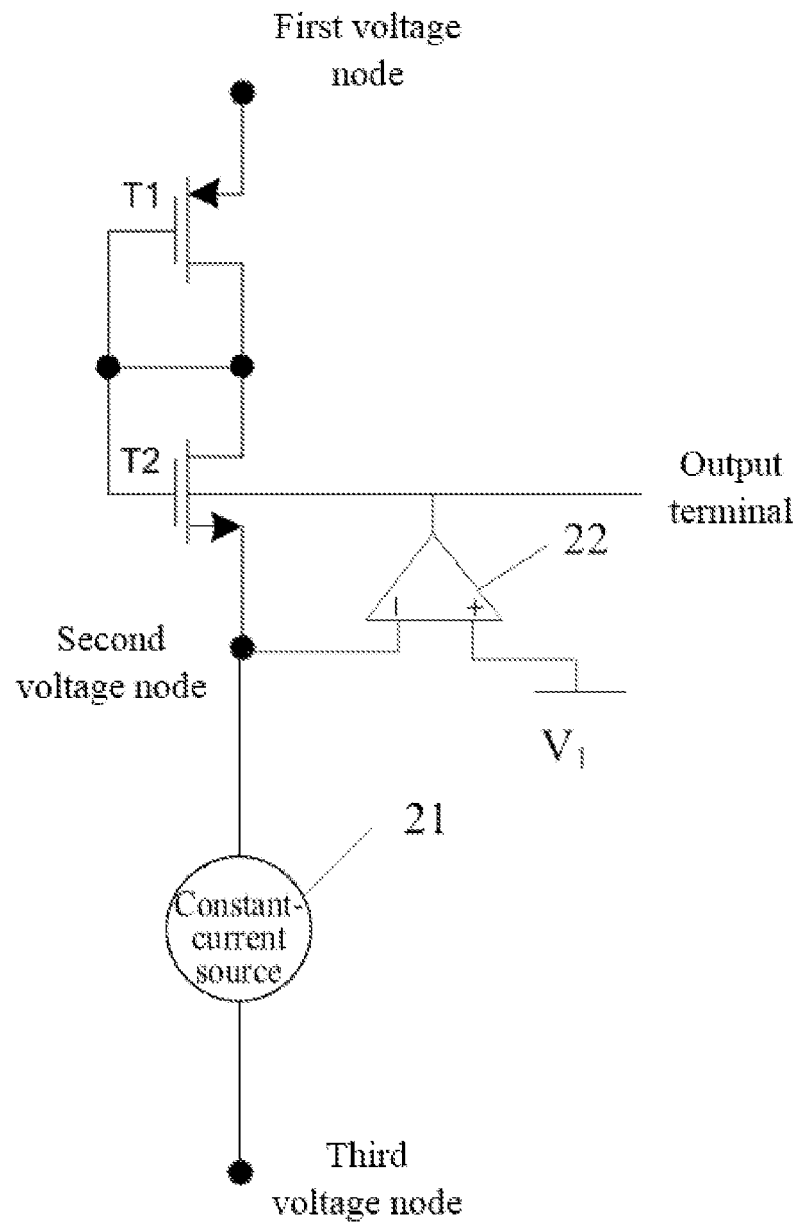
FIG. 24 is a schematic structural diagram of a potential generating circuit according to an embodiment of the disclosure.

FIG. 24 is a schematic structural diagram of a potential generating circuit according to an embodiment of the disclosure. As shown in FIG. 24, based on the circuit shown in FIG. 23, the potential generating circuit according to this embodiment may further include an error amplifier 22 which forms a feedback loop with the second transistor T2. Here, the substrate terminal of the second transistor T2 is connected to a voltage node of the first feedback loop.

As shown in FIG. 24, alternatively, a negative input terminal of the error amplifier 22 is connected to the second voltage node, a positive input terminal of the error amplifier 22 is connected to a first reference voltage $V_1$, and an output terminal of the error amplifier 22 is connected to the substrate terminal of the second transistor T2.

In the embodiment, the first voltage node may be connected to a power supply terminal Vcc, the first reference voltage $V_1$ may be connected to a ground terminal Vss, and a potential of the third voltage node is less than that of the first reference voltage $V_1$.

In the potential generating circuit shown in FIG. 24, the first voltage node is connected to the power supply terminal Vcc, the first reference voltage $V_1$ is connected to the ground terminal Vss, and the potential of the third voltage node is less than that of $V_1$. For example, the potential of the third voltage node is less than 0, and the potential of the second voltage node is greater than that of the third voltage node.

The potential generating circuit shown in any of FIGS. 22 to 24 is provided with the first transistor and the second transistor. The gate terminal of the first transistor is connected to the drain terminal thereof. The gate terminal of the second transistor is connected to the drain terminal thereof. The potential of the substrate terminal of the second transistor T2 varies with the first parameter. The substrate terminal of the second transistor T2 serves as an output terminal of the potential generating circuit. Since the potential of the substrate terminal of the second transistor varies with the first parameter, the output terminal can output a potential that varies with any of the power supply voltage, the operating temperature, and the manufacturing process.

Figure 25:
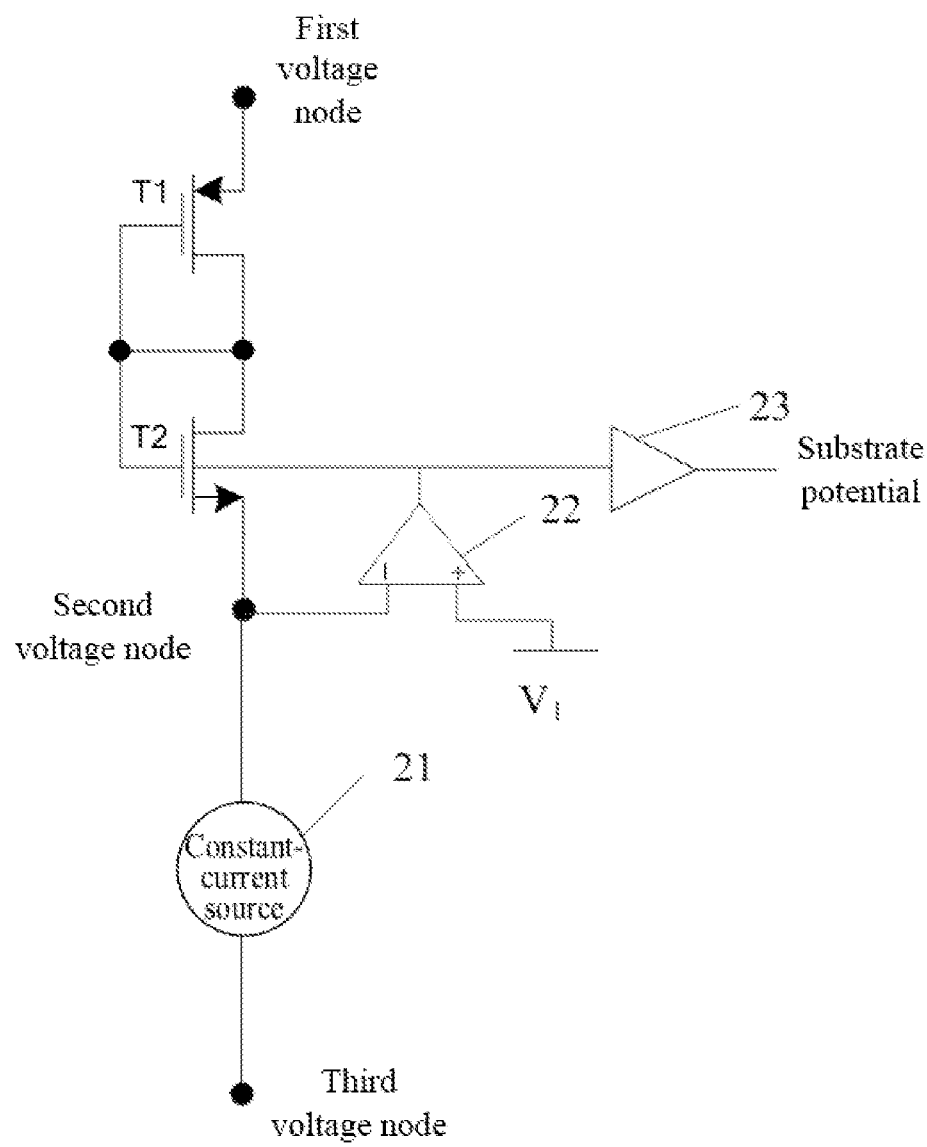
FIG. 25 is a schematic structural diagram of a potential generating circuit according to an embodiment of the disclosure.

FIG. 25 is a schematic structural diagram of a potential generating circuit according to an embodiment of the disclosure. As shown in FIG. 25, based on the potential generating circuit shown in FIG. 24, the potential generating circuit according to this embodiment may further include a buffer 23. The buffer 23 is connected to the output terminal, and the buffer 23 outputs a substrate potential. A value of the substrate potential is equal to a potential value of the substrate terminal of the second T2. An input potential of the buffer 23 is equal to an output potential thereof. The buffer 23 is configured to improve the driving capability of the potential of the substrate terminal of the second transistor T2, and can also isolate the substrate terminal of the second transistor T2 to prevent the potential of the substrate terminal of the second transistor T2 from being interfered.

The structure of the potential generating circuit of this disclosure will be illustrated below with reference to the specific embodiments. The specific structure of the potential generating circuit of this disclosure is not limited to any of the following structures.

Figure 26:
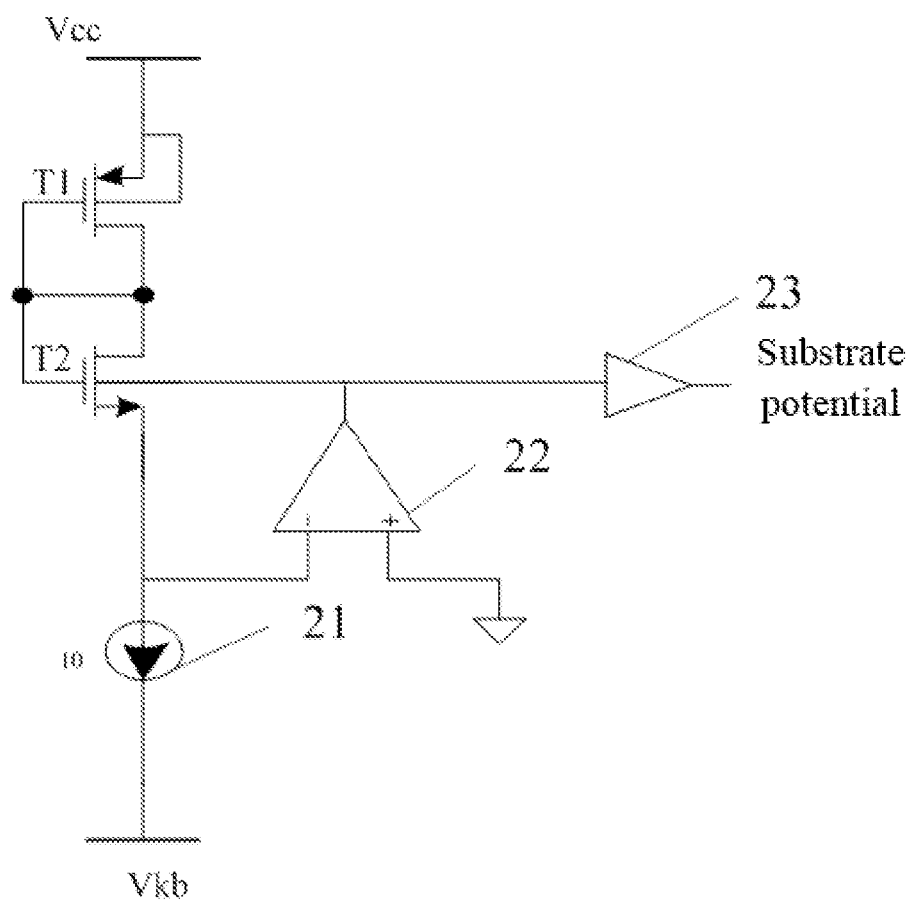
FIG. 26 is a schematic structural diagram of a potential generating circuit according to an embodiment of the disclosure.

FIG. 26 is a schematic structural diagram of a potential generating circuit according to an embodiment of the disclosure. As shown in FIG. 26, the potential generating circuit according to this embodiment may include a first transistor T1, a second transistor T2, a constant-current source 21, an error amplifier 22, and a buffer 23.

In this embodiment, the first transistor T1 is a P-type transistor, and the second transistor T2 is an N-type transistor. A gate terminal of the first transistor T1 is connected to a drain terminal thereof. A gate terminal of the second transistor T2 is connected to a drain terminal thereof. A source terminal of the first transistor T1 is connected to a power supply terminal Vcc. A source terminal of the second transistor T2 is connected to a first terminal of a constant-current source 21. The drain terminal of the first transistor T1 is connected to the drain terminal of the second transistor T2. A second terminal of the constant-current source 21 is connected to Vkb, and a potential of Vkb is less than 0.

The error amplifier 22 and the second transistor T2 form a first feedback loop. A negative input terminal of the error amplifier 22 is connected to the source terminal of the second transistor T2 and the first terminal of the constant-current source 21. A positive input terminal of the error amplifier 22 is connected to a ground terminal. An output terminal of the first amplifier 22 is connected to a substrate terminal of the second transistor T2.

The second buffer 23 is connected to the substrate terminal of the second transistor T2, and the second buffer 23 outputs a substrate potential. A value of the substrate potential is equal to a potential value of the substrate terminal of the second transistor T2.

In this embodiment, the potential of the substrate terminal of the second transistor T2 varies with a first parameter. Specifically, the potential of the substrate terminal of the second transistor T2 falls along with an increase of a first parameter, and rises along with a decrease of the first parameter. The first parameter refers to any of a power supply voltage of the potential generating circuit, an operating temperature of the potential generating circuit and a manufacturing process of the potential generating circuit.

Taking the first parameter referring to the operating temperature as an example, the principle that the potential of the substrate terminal of the second transistor T2 varies with the first parameter will be illustrated below in detail.

A current flowing through the second transistor T2 is $Id=\mu*Cox*(W/L)*(Vgs-Vth)^2$, where $\mu$ is an electronic mobility, and Vth is a threshold voltage. For example, when the operating temperature increases, the electronic mobility $\mu$ decreases, the current Id flowing through the second transistor T2 is caused to be decreased, and a delay time of a corresponding inverter is caused to be prolonged. Here, if Vgs-Vth is adjusted to be greater, a current variation caused by a decrease of the electronic mobility $\mu$ may be compensated. The specific adjusted value may be set according to actual requirements. In the potential generating circuit shown in FIG. 26, if the temperature rises, the electronic mobility $\mu$ decreases, and the current Id flowing through the second transistor T2 decreases. In order to keep the current of the constant-current source constant, the substrate potential of the second transistor T2 needs to be decreased. And here, the substrate potential falls along with an increase of the temperature.

When the first parameter refers to the power supply voltage and the manufacturing process, a variation of the power supply voltage and the manufacturing process may cause a variation of the current Id flowing through the second transistor T2, thereby resulting in a variation of the delay time. The principle of compensation is similar to the foregoing principle, which will not be elaborated here.

Figure 27:
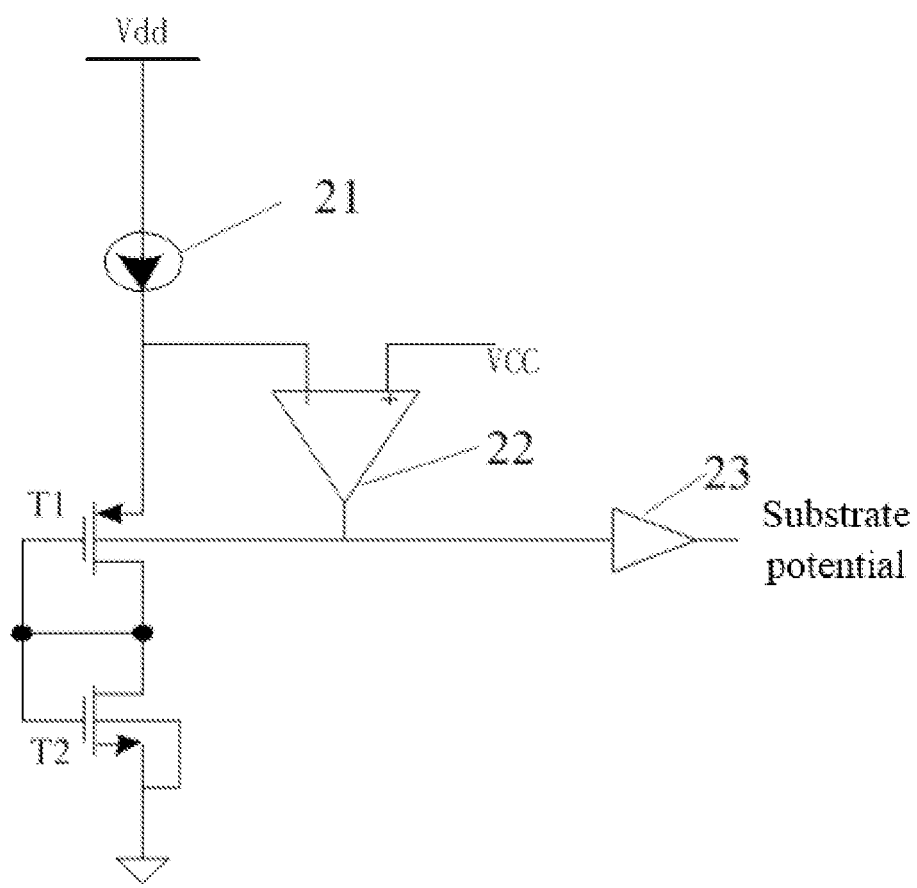
FIG. 27 is a schematic structural diagram of a potential generating circuit according to an embodiment of the disclosure.

FIG. 27 is a schematic structural diagram of a potential generating circuit according to an embodiment of the disclosure. As shown in FIG. 27, the potential generating circuit according to this embodiment may include a first transistor T1, a second transistor T2, a constant-current source 21, an error amplifier 22, and a buffer 23.

In this embodiment, the first transistor T1 is a P-type transistor, and the second transistor T2 is an N-type transistor. A gate terminal of the first transistor T1 is connected to a drain terminal thereof. A gate terminal of the second transistor T2 is connected to a drain terminal thereof. A source terminal of the first transistor T1 is connected to a first terminal of the constant-current source 21. A source terminal of the second transistor T2 is connected to a ground terminal. The drain terminal of the first transistor T1 is connected to the drain terminal of the second transistor T2. A second terminal of the constant-current source 21 is connected to Vdd.

The error amplifier 22 and the first transistor T1 form a first feedback loop. A negative input terminal of the error amplifier 22 is connected to the source terminal of the first transistor T1 and the first terminal of the constant-current source 21. A positive input terminal of the error amplifier 22 is connected to a power supply terminal Vcc. An output terminal of the amplifier 22 is connected to a substrate terminal of the first transistor T1.

Vdd is greater than Vcc.

The buffer 23 is connected to the substrate terminal of the first transistor T1, and the buffer 23 outputs a substrate potential. A value of the substrate potential is equal to a potential value of the substrate terminal of the first transistor T1.

In this embodiment, the potential of the substrate terminal of the first transistor T1 varies with a first parameter. Specifically, the potential of the substrate terminal of the first transistor T1 rises along with an increase of the first parameter, and falls along with a decrease of the first parameter. The first parameter refers to any of a power supply voltage of the potential generating circuit, an operating temperature of the potential generating circuit, and a manufacturing process of the potential generating circuit.

Taking the first parameter referring to the operating temperature as an example, the principle that the potential of the substrate terminal of the first transistor T1 varies with the first parameter will be illustrated below in detail.

A current flowing through the first transistor T1 is $Id=\mu*Cox*(W/L)*(Vgs-Vth)^2$, where $\mu$ is an electronic mobility, and Vth is a threshold voltage. For example, when the operating temperature increases, the electronic mobility $\mu$ decreases, the current Id flowing through the first transistor T1 is caused to be decreased, and a delay time of a corresponding inverter is caused to be prolonged. Here, if Vgs-Vth is adjusted to be greater, a current variation caused by a decrease of the electronic mobility $\mu$ may be compensated. The specific adjusted value may be set according to actual requirements. In the potential generating circuit shown in FIG. 26, if the temperature rises, the electronic mobility $\mu$ decreases, and the current Id flowing through the first transistor T1 also decreases. In order to keep the current of the constant-current source constant, the substrate potential of the first transistor T1 needs to be decreased. And here, the substrate potential falls along with an increase of the temperature.

When the first parameter refers to the power supply voltage and the manufacturing process, a variation of the power supply voltage and the manufacturing process may cause a variation of the current Id flowing through the second transistor T2, thereby resulting in a variation of the delay time. The principle of compensation is similar to the foregoing principle, which will not be elaborated here.

The embodiment of this disclosure further provides a delay circuit, including the potential generating circuit shown in any of FIGS. 18 to 21 and FIG. 27 and a delay unit.

The delay unit includes a first inverter. The first inverter includes a fourth transistor and a fifth transistor. A substrate terminal of the fourth transistor is connected to the potential of the substrate terminal of the first transistor, and a substrate terminal of the fifth transistor is connected to the ground terminal. The fourth transistor is a P-type transistor, and the fifth transistor is an N-type transistor.

Alternatively, a ratio of a channel length of the first transistor to a channel length of the fourth transistor is denoted as H, a ratio of a channel length of the second transistor to a channel length of the fifth transistor is denoted as L, a ratio of a channel width of the first transistor to a channel width of the fourth transistor is denoted as M, and a ratio of a channel width of the second transistor to a channel width of the fifth transistor is denoted as N, where H is equal to L, and M is equal to N; and alternatively, H, L, M, and N may be 1. Alternatively, the first transistor and the fourth transistor may be of the same type, and the second transistor and the fifth transistor may be of the same type.

In the delay circuit provided in the embodiment, since the potential of the first transistor in the potential generating circuit may vary with any of the power supply voltage, the operating temperature, and the manufacturing process, a substrate potential that varies with the first parameter may be provided to the substrate terminal of the P-type transistor in the inverter. Thus, a current flowing through the P-type transistor of the inverter may be adjusted, and a variation of the current flowing through the P-type transistor of the inverter may be compensated, so that a delay time T of the delay circuit may be with a slight variation, and thus the control capability of the delay circuit to accuracy of the delay time can be improved.

The delay circuit provided in the embodiment can be applied to scenarios that require precise control of a rising edge delay time of the delay circuit. For example, the delay circuit can be applied to a Dynamic Random Access Memory (DRAM), and the influence of the variation of any of the power supply voltage, the operating temperature, and the manufacturing process on the delay time can be simultaneously compensated; so that there is a slight variation of the delay time T, and thus the control capability of the delay circuit to accuracy of the delay time can be improved.

The embodiment of this disclosure further provides a delay circuit, including the potential generating circuit shown in any of FIGS. 22 to 26. The delay unit includes a first inverter. The first inverter includes a fourth transistor and a fifth transistor. A substrate terminal of the fourth transistor is connected to the potential of the substrate terminal of the first transistor, and a substrate terminal of the fifth transistor is connected to the power supply terminal. The fourth transistor is a P-type transistor, and the fifth transistor is an N-type transistor.

Alternatively, a ratio of a channel length of the first transistor to a channel length of the fourth transistor is denoted as H, a ratio of a channel length of the second transistor T2 to a channel length of the fifth transistor is denoted as L, a ratio of a channel width of the first transistor to a channel width of the fourth transistor is denoted as M, and a ratio of a channel width of the second transistor to a channel width of the fifth transistor is denoted as N, where H is equal to L, and M is equal to N; and alternatively, H, L, M, and N may be 1. Alternatively, the first transistor and the fourth transistor may be of the same type, and the second transistor and the fifth transistor may be of the same type.

In the delay circuit provided in the embodiment, since the potential of the second transistor in the potential generating circuit may vary with any of the power supply voltage, the operating temperature, and the manufacturing process, a substrate potential that varies with the first parameter may be provided to the substrate terminal of the N-type transistor in the inverter. Thus, a current flowing through the N-type transistor of the inverter may be adjusted, and a variation of the current flowing through the N-type transistor of the inverter may be compensated, so that a falling edge delay time T of the delay circuit may be with a slight variation, and thus the control capability of the delay circuit to accuracy of the falling edge delay time can be improved.

The delay circuit provided in this disclosure can be applied to scenarios that require precise control of a falling edge delay time of the delay circuit. For example, the delay circuit can be applied to a Dynamic Random Access Memory (DRAM), and the influence of a variation of any of the power supply voltage, the operating temperature, and the manufacturing process on the delay time can be simultaneously compensated; so that there is a slight variation of the delay time T, and thus the control capability of the delay circuit to accuracy of the falling edge delay time can be improved.

The embodiment of this disclosure further provides a delay circuit, including a first potential generating circuit, and a second potential generating circuit.

The first potential generating circuit is the potential generating circuit shown in any of FIGS. 18 to 21, and FIG. 27.

The second potential generating circuit is the potential generating circuit shown in any of FIGS. 22 to 26.

The delay unit includes a first inverter. The first inverter includes a fourth transistor and a fifth transistor. A substrate terminal of the fourth transistor is connected to the potential of the substrate terminal of the first transistor in the first potential generating circuit. A substrate terminal of the fifth transistor is connected to the potential of the substrate terminal of the second transistor in the second potential generating circuit. The fourth transistor is a P-type transistor, and the fifth transistor is an N-type transistor.

Alternatively, a ratio of a channel length of the first transistor in the first potential generating circuit to a channel length of the fourth transistor is denoted as H1, a ratio of a channel length of the second transistor in the first potential generating circuit to a channel length of the fifth transistor is denoted as L1, a ratio of a channel width of the first transistor in the first potential generating circuit to a channel width of the fourth transistor is denoted as M1, and a ratio of a channel width of the second transistor in the first potential generating circuit to a channel width of the fifth transistor is denoted as N1, where H1 is equal to L1, and M1 is equal to N1; and alternatively, H1, L1, M1, and N1 may be 1.

A ratio of a channel length of the first transistor in the second potential generating circuit to a channel length of the fourth transistor is denoted as H2, a ratio of a channel length of the second transistor in the second potential generating circuit to a channel length of the fifth transistor is denoted as L2, a ratio of a channel width of the first transistor in the second potential generating circuit to a channel width of the fourth transistor is denoted as M2, and a ratio of a channel width of the second transistor in the second potential generating circuit to a channel width of the fifth transistor is denoted as N2, where H2 is equal to L2, and M2 is equal to N2. Optionally, H2, L2, M2, and N2 may be 1.

The delay circuit provided in this disclosure can be applied to scenarios that require precise control of a rising edge delay time of the delay circuit and a falling edge delay time of the delay circuit. For example, the delay circuit can be applied to a Dynamic Random Access Memory (DRAM), and the influence of a variation of any of the power supply voltage, the operating temperature, and the manufacturing process on the rising edge delay time and the falling edge delay time can be simultaneously compensated; so that there is a slight variation of the rising edge delay time T and the falling edge delay time T, and thus the control capability of the delay circuit to the accuracy of the rising edge delay time and the falling edge delay time can be improved.

It should be noted that in the delay circuit provided in the embodiment, connection relationships between the potential generating circuit shown in the foregoing two embodiments and the inverter in the delay unit may be set according to the rising edge delay and/or the falling edge delay implemented through the delay unit. For example, a rising edge delay is implemented by a certain delay circuit, the certain delay circuit includes an inverter, and the inverter includes a P-type transistor and an N-type transistor. A first potential generating circuit is arranged in the certain delay circuit, which can provide a substrate potential that varies with the first parameter to the substrate terminal of the P-type transistor in the inverter, so that a current flowing through the P-type transistor in the inverter may be adjusted, the variation of the current flowing through the P-type transistor in the inverter can be compensated, and a rising edge delay time of the delay circuit may be with a slight variation. For another example, a falling edge delay is implemented by a certain delay circuit, the certain delay circuit includes an inverter, and the inverter includes a P-type transistor and an N-type transistor. A second potential generating circuit is arranged in the certain delay circuit, which can provide a substrate potential that varies with the first parameter to the substrate terminal of the N-type transistor in the inverter, so that a current flowing through the N-type transistor in the inverter may be adjusted, the variation of the current flowing through the N-type transistor in the inverter can be compensated, and a falling edge delay time of the delay circuit may be with a slight variation. For another example, both of a rising edge delay and a falling edge delay are implemented by a certain delay circuit, the certain delay circuit includes an inverter, and the inverter includes a P-type transistor and an N-type transistor. Both of a first potential generating circuit and a second potential generating circuit are arranged in the certain delay circuit. The first potential generating circuit can provide a substrate potential that varies with the first parameter to the substrate terminal of the P-type transistor in the inverter, so that a current flowing through the P-type transistor in the inverter may be adjusted, a variation of the current flowing through the P-type transistor in the inverter can be compensated, and the rising edge delay time of the certain delay circuit may be with a slight variation. The second potential generating circuit can provide a substrate potential that varies with the first parameter to the substrate terminal of the N-type transistor in the inverter, so that a current flowing through the N-type transistor in the inverter may be adjusted, the variation of the current flowing through the N-type transistor in the inverter can be compensated, and the falling edge delay time of the certain delay circuit may be with a slight variation. Therefore, both of the rising edge delay time and the falling edge delay time of the certain delay circuit may be with a slight variation. Thus, the control capability of the delay circuit to accuracy of the delay time (including the rising edge delay time and the falling edge delay time) can be improved.

Figure 28:
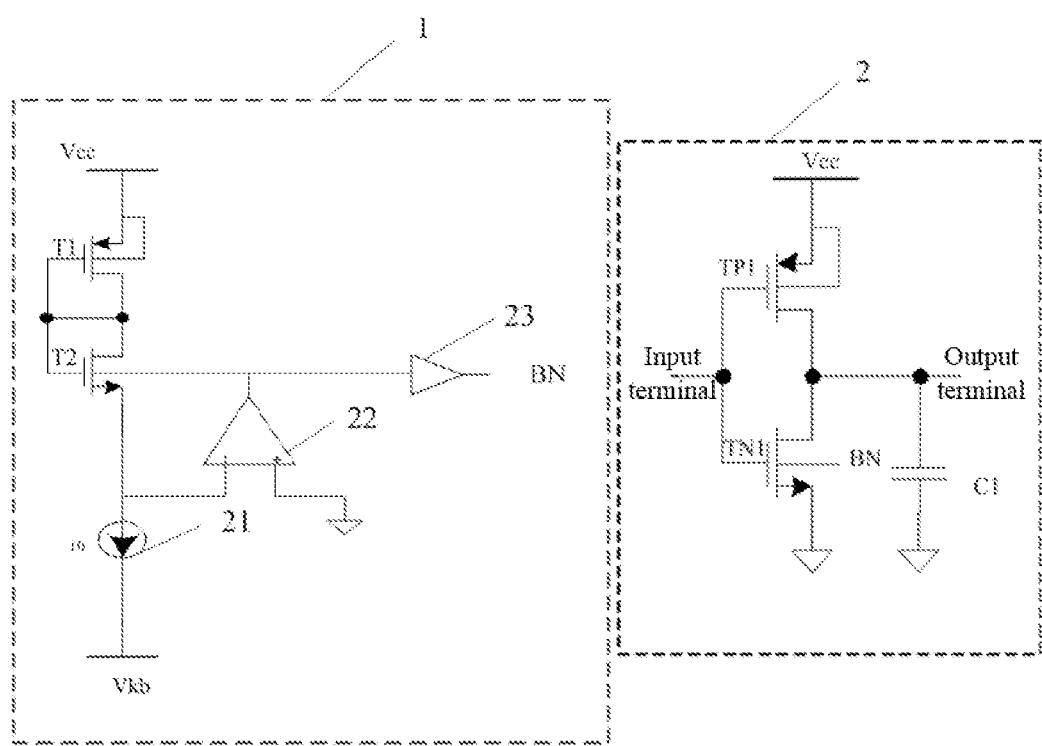
FIG. 28 is a schematic structural diagram of a delay circuit according to an embodiment of the disclosure.

Examples of the delay circuit in three types are illustrated below with reference to FIGS. 28 to 30. FIG. 28 is a schematic structural diagram of a delay circuit according to an embodiment of the disclosure. As shown in FIG. 28, the delay circuit according to the embodiment includes a potential generating circuit 1 and a delay unit 2. The potential generating circuit 1 is the circuit shown in FIG. 26, the description of the specific structure of the potential generating circuit 1 may refer to the description in the embodiment shown in FIG. 26, which will not be elaborated here. The potential generating circuit 1 outputs a substrate potential BN. The delay unit 2 includes an inverter and a capacitor C1. The inverter includes a P-type transistor TP1 and an N-type transistor TN1. A substrate terminal of the P-type transistor TP1 is connected to a power supply terminal Vcc, and a substrate terminal of the N-type transistor TN1 is connected to the substrate potential BN. In the delay circuit according to the embodiment, the potential generating circuit 1 provides the substrate potential that varies with a first parameter to the substrate terminals of the N-type transistor in the delay unit 2, a variation of a falling edge delay time of the delay circuit may be adjusted, so that the falling edge delay time of the delay circuit may be with a slight variation. Thus, the influence of a manufacturing process of the delay circuit, a power supply voltage of the delay circuit, and an operating temperature of the delay circuit on the falling edge delay time T of the delay circuit may be reduced, so that the falling edge delay time T may be with a slight variation, and thus the control capability of the delay circuit to accuracy of the falling edge delay time can be improved.

Figure 29:
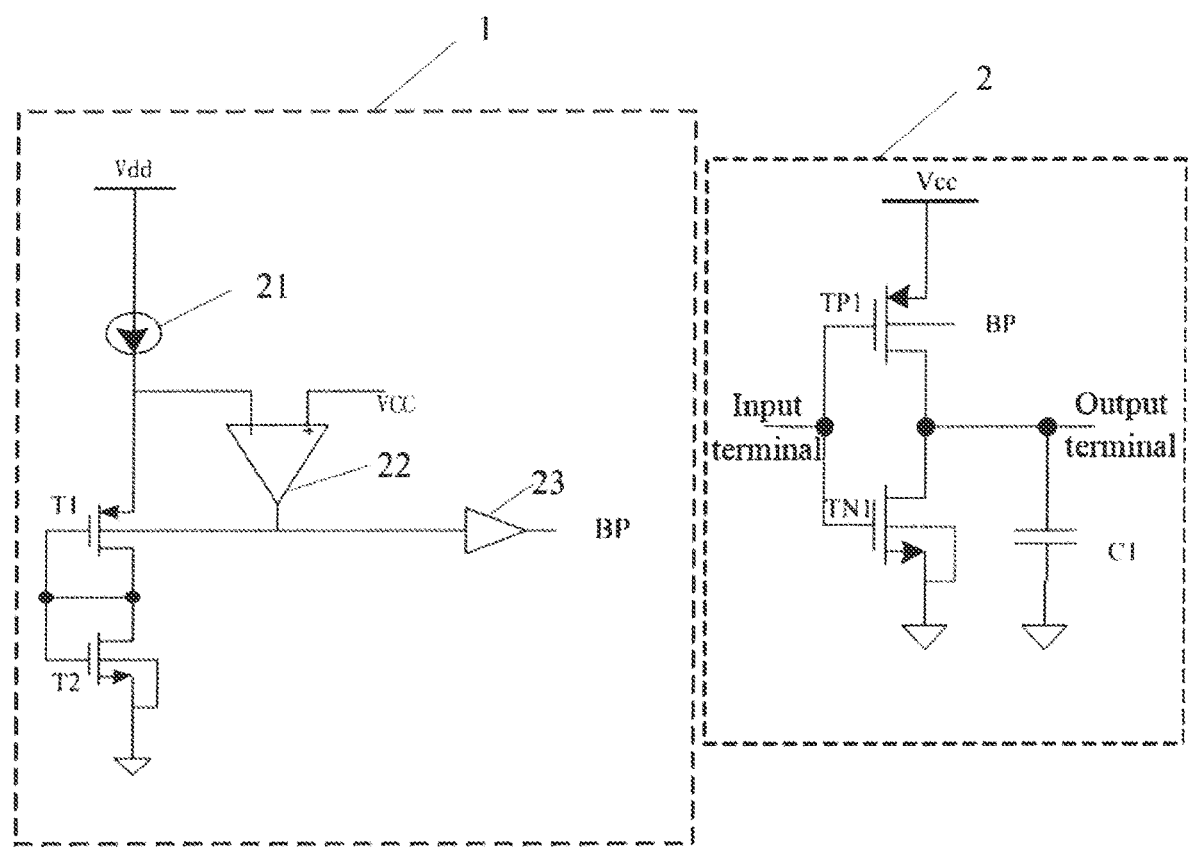
FIG. 29 is a schematic structural diagram of a delay circuit according to an embodiment of the disclosure.

FIG. 29 is a schematic structural diagram of a delay circuit according to an embodiment of the disclosure. As shown in FIG. 29, the delay circuit according to the embodiment includes a potential generating circuit 1 and a delay unit 2. The potential generating circuit 1 is the circuit shown in FIG. 27, the description of the specific structure of the potential generating circuit 1 may refer to the description in the embodiment shown in FIG. 27, which will not be elaborated here. The potential generating circuit 1 outputs a substrate potential BP. The delay unit 2 includes an inverter and a capacitor C1. The inverter includes a P-type transistor TP1 and an N-type transistor TN1. A substrate terminal of the P-type transistor TP1 is connected to the substrate potential BP, and a substrate terminal of the N-type transistor TN1 is connected to a ground terminal. In the delay circuit according to the embodiment, the potential generating circuit 1 provides the substrate potential that varies with a first parameter to the substrate terminal of the P-type transistor in the delay unit 2, a variation of a rising edge delay time of the delay circuit may be adjusted, so that there is a slight variation of the rising edge delay time of the delay circuit. Thus, the influence of a manufacturing process of the delay circuit, a power supply voltage of the delay circuit, and an operating temperature of the delay circuit on the rising edge delay time T of the delay circuit may be reduced, so that the rising edge delay time T may be with a slight variation, and thus the control capability of the delay circuit to accuracy of the rising edge delay time can be improved.

Figure 30:
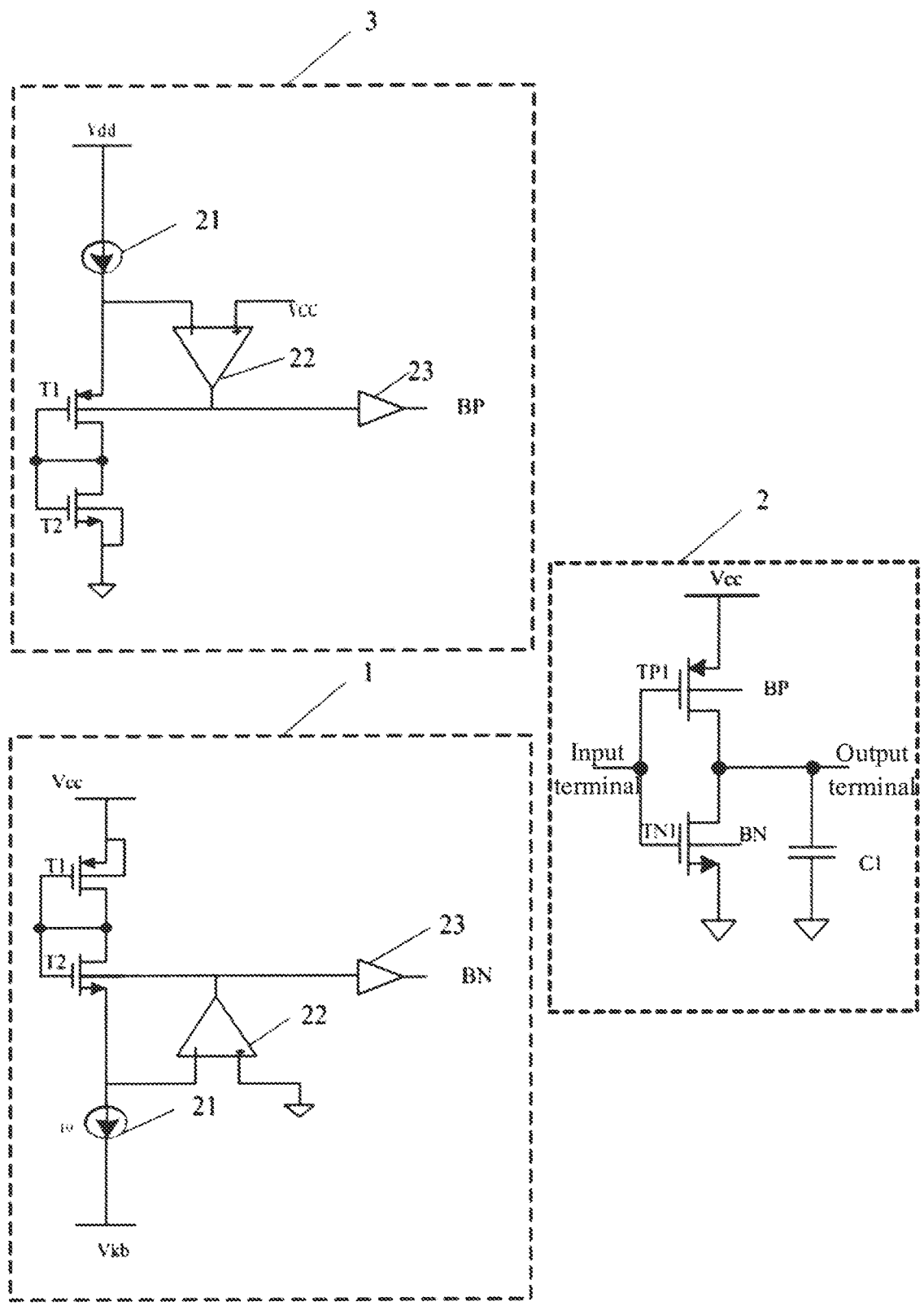
FIG. 30 is a schematic structural diagram of a delay circuit according to an embodiment of the disclosure.

FIG. 30 is a schematic structural diagram of a delay circuit according to an embodiment of the disclosure. As shown in FIG. 30, the delay circuit according to the embodiment includes a first potential generating circuit 1, a second potential generating circuit 3, and a delay unit 2. The first potential generating circuit 1 is the circuit shown in FIG. 27, the description of the specific structure of the first potential generating circuit 1 may refer to the description in the embodiment shown in FIG. 27, which will not be elaborated here. The first potential generating circuit 1 outputs a substrate potential BN. The second potential generating circuit 3 is the circuit shown in FIG. 28, the description of the specific structure of the second potential generating circuit 3 may refer to the description in the embodiment shown in FIG. 28, which will not be elaborated here. The second potential generating circuit 3 outputs a substrate potential BP. The delay unit 2 includes an inverter and a capacitor C1. The inverter includes a P-type transistor TP1 and an N-type transistor TN1. A substrate terminal of the P-type transistor TP1 is connected to the substrate potential BP output by the second potential generating circuit 3. A substrate terminal of the N-type transistor TN1 is connected to the substrate potential BN output by the first potential generating circuit 1. In the delay circuit according to the embodiment, the potential generating circuit 1 provides a substrate potential that varies with a first parameter to the substrate terminal of the N-type transistor in the delay unit 2, and a variation of a rising edge delay time of the delay circuit may be adjusted, so that there is a slight variation of the rising edge delay time of the delay circuit. In addition, the potential generating circuit 3 provides a substrate potential that varies with the first parameter to the substrate terminal of the P-type transistor in the delay unit 2, and a variation of a falling edge delay time of the delay circuit may be adjusted, so that there is a slight variation of the falling edge delay time of the delay circuit. Thus, the influence of the manufacturing process of the delay circuit, the power supply voltage of the delay circuit, and the operating temperature of the delay circuit to the delay time T (including the rising edge delay time and the falling edge delay time) may be reduced, so that the delay time T may be with a slight variation, and thus the control capability of the delay circuit to accuracy of the delay time can be improved.

Figure 31:
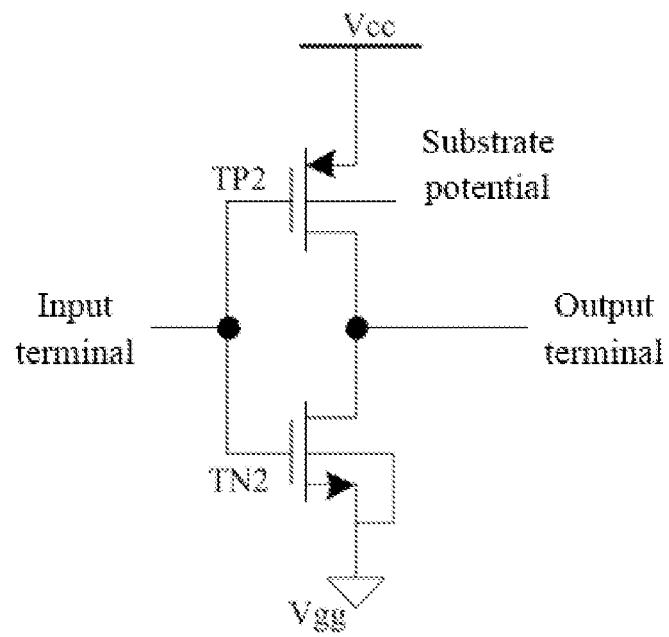
FIG. 31 is a schematic structural diagram of an inverter according to an embodiment of the disclosure.

The embodiment of this disclosure further provides an inverter. FIG. 31 is a schematic structural diagram of an inverter according to an embodiment of the disclosure. As shown in FIG. 31, the inverter includes a P-type transistor TP2 and an N-type transistor TN2.

A source terminal of the P-type transistor TP2 is connected to a power supply terminal. A drain terminal of the P-type transistor TP2 is connected to a drain terminal of the N-type transistor TN2. A source terminal of the N-type transistor TN2 is connected to a ground terminal. A gate terminal of the P-type transistor TP2 is connected to a gate terminal of the N-type transistor TN2, and the gate terminal of the P-type serves as an input terminal of the inverter. The drain terminal of the P-type transistor TP2 serves as an output terminal of the inverter.

A substrate terminal of the P-type transistor TP2 is connected to the first substrate potential. A substrate terminal of the N-type transistor TN2 is connected to the ground terminal. The substrate potential varies with a first parameter. The first parameter refers to any of a power supply voltage of the inverter, an operating temperature of the inverter, and a manufacturing process of the inverter.

When the first parameter refers to the power supply voltage of the inverter or the operating temperature of the inverter, the substrate potential rises along with an increase of the first parameter and falls along with a decrease of the first parameter.

In the inverter provided in the embodiment, since the substrate potential may vary with any of the power supply voltage, the operating temperature, and the manufacturing process, the substrate potential that varies with the first parameter may be provided to the substrate terminal of the P-type transistor TP2. Thus, a current flowing through the P-type transistor TP2 may be adjusted, and a variation of the current flowing through the P-type transistor TP2 may be compensated, so that a rising edge delay time T of the inverter may be with a slight variation, and thus the control capability of the inverter to accuracy of the rising edge delay time can be improved.

Figure 32:
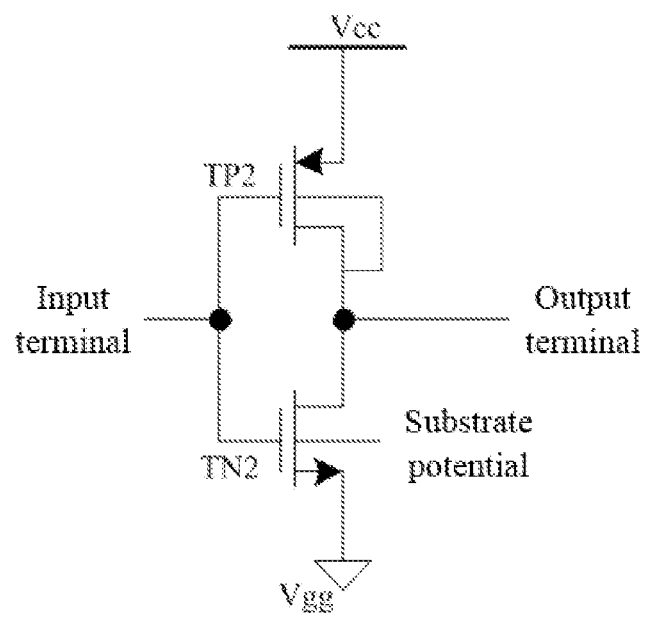
FIG. 32 is a schematic structural diagram of an inverter according to an embodiment of the disclosure.

FIG. 32 is a schematic structural diagram of an inverter according to an embodiment of the disclosure. As shown in FIG. 32, the inverter includes a P-type transistor TP2 and an N-type transistor TN2. A source terminal of the P-type transistor TP2 is connected to a power supply terminal. A drain terminal of the P-type transistor TP2 is connected to a drain terminal of the N-type transistor TN2. A source terminal of the N-type transistor TN2 is connected to a ground terminal. A gate terminal of the P-type transistor TP2 is connected to a gate terminal of the N-type transistor TN2, and the gate terminal of the P-type serves as an input terminal of the inverter. The drain terminal of the P-type transistor TP2 serves as an output terminal of the inverter.

A substrate terminal of the N-type transistor TN2 is connected to the first substrate potential. A substrate terminal of the P-type transistor TP2 is connected to the power supply terminal. The substrate potential varies with a first parameter. The first parameter refers to any of a power supply voltage of the inverter, an operating temperature of the inverter, and a manufacturing process of the inverter.

When the first parameter refers to the power supply voltage of the inverter or the operating temperature of the inverter, the substrate potential falls along with an increase of the first parameter and rises along with a decrease of the first parameter.

In the inverter provided in the embodiment, since the substrate potential may vary with any of the power supply voltage, the operating temperature, and the manufacturing process, the substrate potential that varies with the first parameter may be provided to the substrate terminal of the N-type transistor TN2. Thus, a current flowing through the N-type transistor TN2 may be adjusted, and a variation of the current flowing through the N-type transistor TN2 may be compensated, so that a falling edge delay time T of the inverter may be with a slight variation, and thus the control capability of the inverter to accuracy of the falling edge delay time can be improved.

Figure 33:
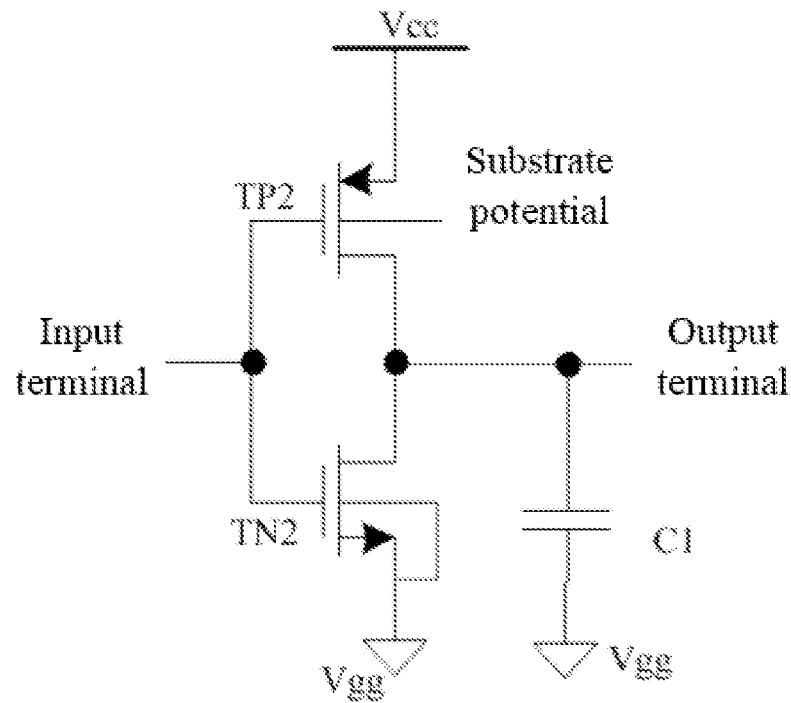
FIG. 33 is a schematic structural diagram of a delay circuit according to an embodiment of the disclosure.

The embodiment of this disclosure further provides a delay circuit. FIG. 33 is a schematic structural diagram of a delay circuit according to an embodiment of the disclosure. As shown in FIG. 33, the delay circuit according to the embodiment may include the inverter shown in FIG. 31 and a capacitor C1. One terminal of the capacitor C1 is connected to the ground terminal. In an implementation, the capacitor C1 may be a capacitor array.

In the delay circuit provided in the embodiment, a variation of a current flowing through the P-type transistor TP2 of the inverter may be compensated, so that a rising edge delay time T of the inverter may be with a slight variation, further a rising edge delay time T of the delay circuit may be with a slight variation, and thus the control capability of the delay circuit to accuracy of the rising edge delay time can be improved.

Figure 34:
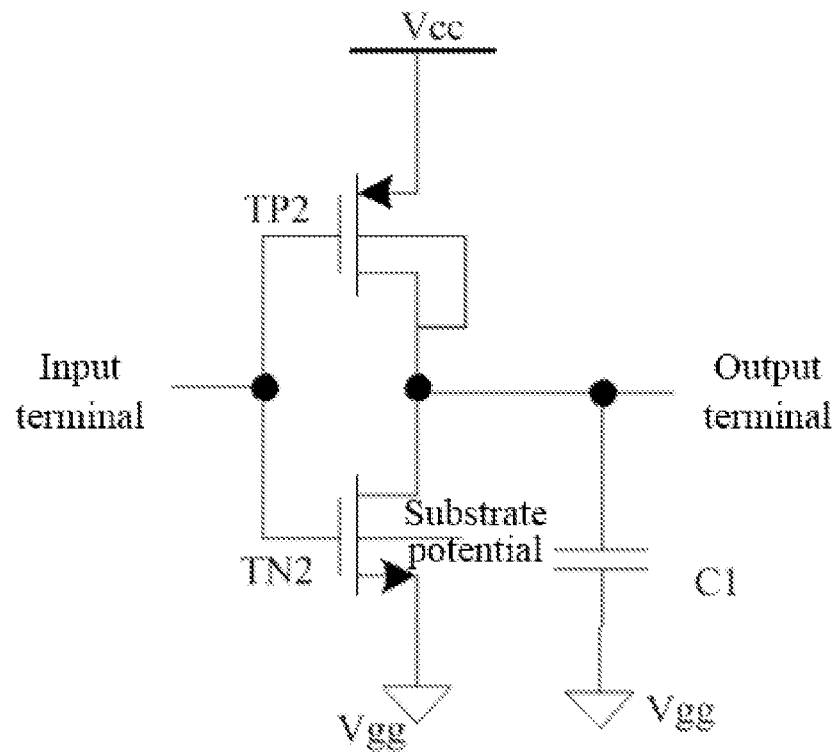
FIG. 34 is a schematic structural diagram of a delay circuit according to an embodiment of the disclosure.

The embodiment of this disclosure further provides a delay circuit. FIG. 34 is a schematic structural diagram of a delay circuit according to an embodiment of the disclosure. As shown in FIG. 34, the delay circuit according to the embodiment may include the inverter shown in FIG. 32 and a capacitor C1. One terminal of the capacitor C1 is connected to the ground terminal. In an implementation, the capacitor C1 may be a capacitor array.

In the delay circuit provided in the embodiment, a variation of a current flowing through the N-type transistor TNP2 of the inverter may be compensated, so that a falling edge delay time T of the inverter may be with a slight variation, further a falling edge delay time T of the delay circuit may be with a slight variation, and thus the control capability of the delay circuit to accuracy of the falling edge delay time can be improved.

The embodiment of this disclosure further provides a logic gate circuit, including a P-type transistor and an N-type transistor. A substrate terminal of the P-type transistor is connected to a substrate potential. A substrate terminal of the N-type transistor is connected to a ground terminal. The substrate potential varies with a first parameter, so that a delay time of the logic gate circuit from an input terminal to an output terminal varies along with the variation of the first parameter within a first range. The first parameter refers to any of a power supply voltage of the logic gate circuit, an operating temperature of the logic gate circuit, and a manufacturing process of the of the logic gate circuit.

Specifically, the first range is a small range, for example, a range close to 0, such as, the first range being 1%, 3% or 5%, so that a rising edge delay time of the logic gate circuit from the input terminal to the output terminal may be with a slight variation when there is the variation of any of the power supply voltage, the working temperature and the manufacturing process, and thus the control capability of the logic gate circuit to accuracy of the rising edge delay time can be improved.

The embodiment of this disclosure further provides a logic gate circuit, including a P-type transistor and an N-type transistor. A substrate terminal of the N-type transistor is connected to a substrate potential. A substrate terminal of the P-type transistor is connected to a power supply terminal. The substrate potential varies with a first parameter, so that a delay time of the logic gate circuit from an input terminal to an output terminal varies along with the variation of the first parameter within a first range. The first parameter refers to any of a power supply voltage of the logic gate circuit, an operating temperature of the logic gate circuit, and a manufacturing process of the logic gate circuit.

Specifically, the first range is a small range, for example, a range close to 0, such as, the first range being 1%, 3% or 5%, so that a falling edge delay time of the logic gate circuit from the input terminal to the output terminal may be with a slight variation, when there is the variation of any of the power supply voltage, the working temperature and the manufacturing process, and thus the control capability of the logic gate circuit to accuracy of the falling edge delay time can be improved.

Embodiment 3

Figure 35:
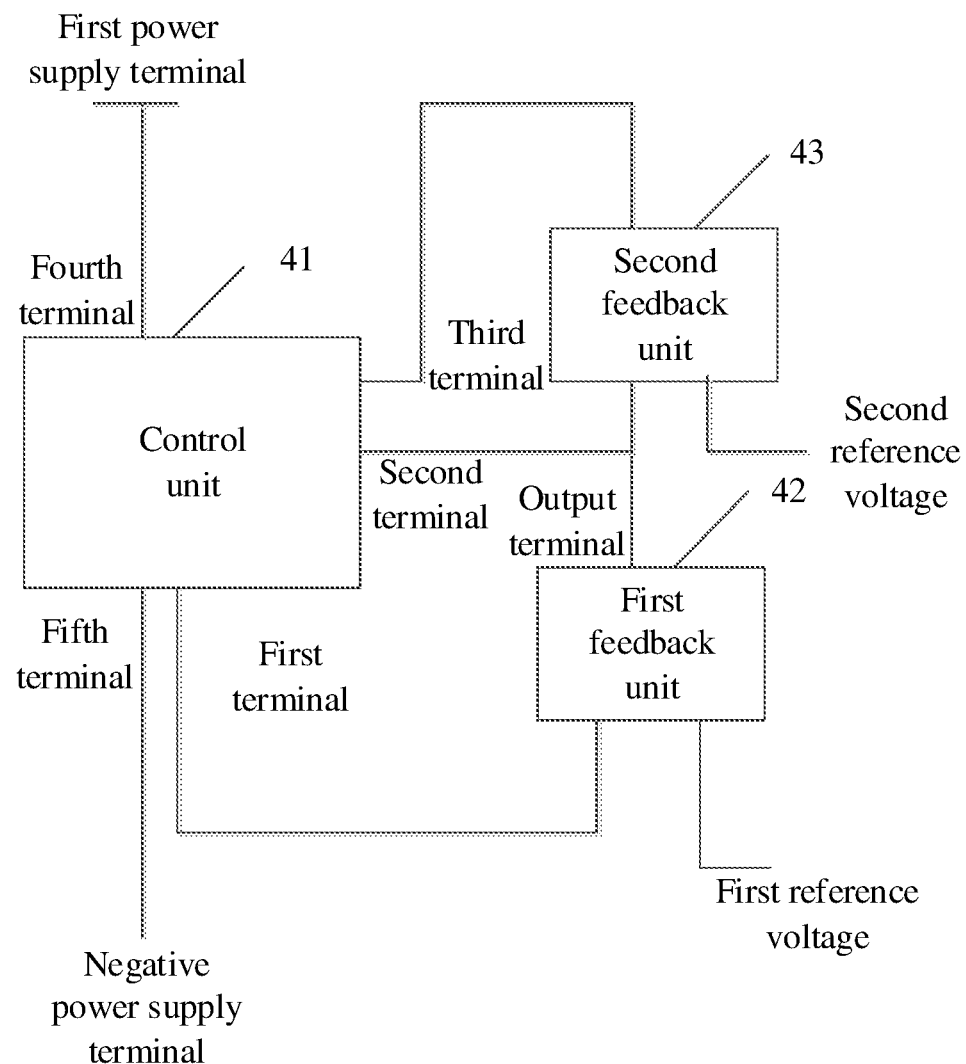
FIG. 35 is a schematic structural diagram of a control circuit according to an embodiment of the disclosure.

FIG. 35 is a schematic structural diagram of a control circuit according to an embodiment of the disclosure. As shown in FIG. 35, the control circuit according to the embodiment may include a control unit 41, a first feedback unit 42, and a second feedback unit 43. The first feedback unit 42 is configured to output a first feedback signal according to a voltage of the control unit 41 and a first reference voltage. A first terminal of the first feedback unit 42 is connected to a first terminal of the control unit. A second terminal of the first feedback unit 42 serves as an input terminal of the first reference voltage. An output terminal of the first feedback unit 42 is connected to a second terminal of the control unit 41 and a first terminal of the second feedback unit 43.

The second feedback unit 42 is configured to output a second feedback signal according to an output voltage of the first feedback unit 42 and a second reference voltage. The second terminal of the second feedback unit 43 serves as an input terminal of the second reference voltage. An output terminal of the second feedback unit 43 is connected to a third terminal of the control unit 41.

The control unit 41 is configured to adjust a voltage of the second terminal of the control unit 41 according to the first feedback signal, and adjust a voltage of the third terminal of the control unit 41 according to the second feedback signal, so as to allow a variation current of the control unit 41 with a first parameter to be within a first range. The first parameter includes at least one of a manufacturing process of the control circuit, a power supply voltage of the control circuit, and an operating temperature of the control circuit. A fourth terminal of the control unit 41 is connected to a first power supply terminal, and a fifth terminal of the control unit 41 is connected to a negative power supply terminal. Specifically, the first range is a small range, for example, a range close to 0, such as, the first range being 1%, 3%, or 5%, so that the current variation of the control unit 41 with the first parameter may be slight.

Figure 36:
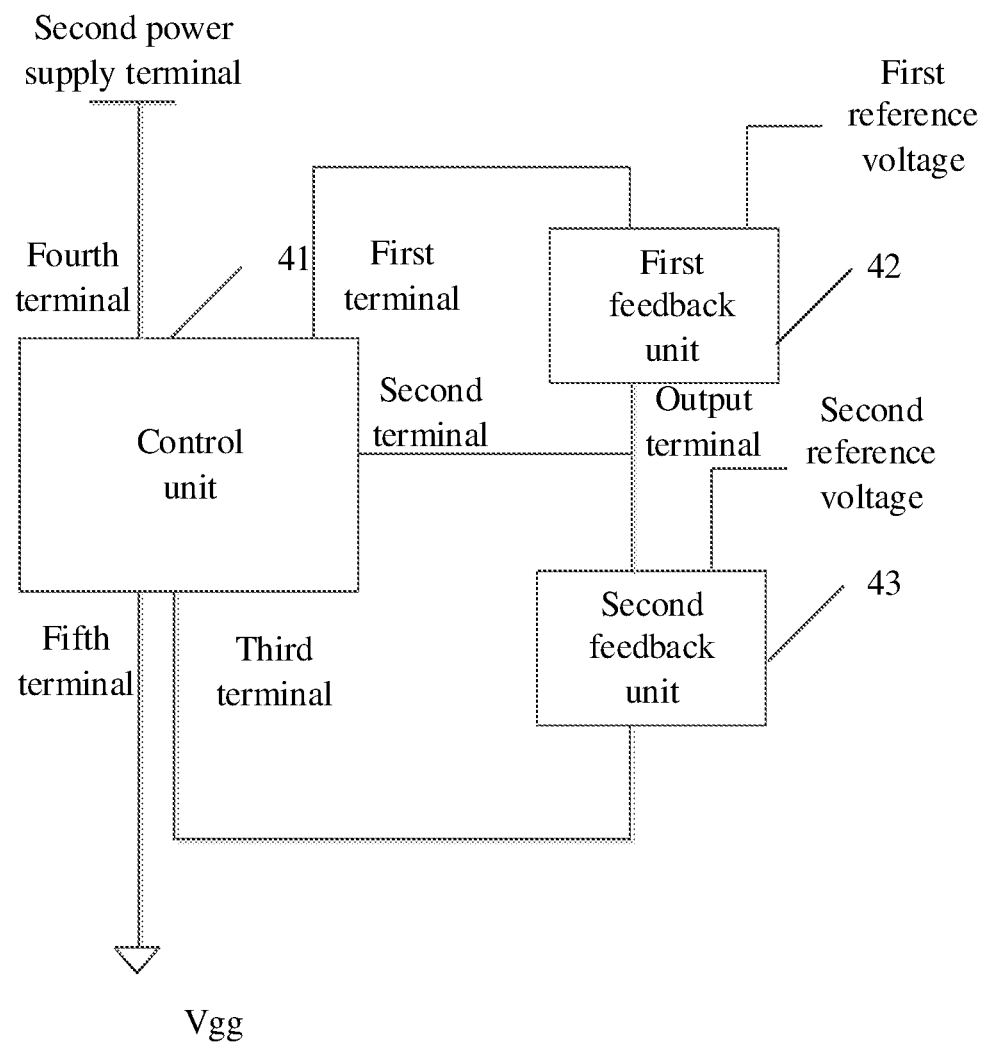
FIG. 36 is a schematic structural diagram of a control circuit according to an embodiment of the disclosure.

FIG. 36 is a schematic structural diagram of a control circuit according to an embodiment of the disclosure. As shown in FIG. 36, the difference of this embodiment and the embodiment shown in FIG. 35 lies in: a fourth terminal of the control unit 41 is connected to a second power supply terminal, and a fifth terminal of the control unit 41 is connected to a ground terminal Vgg.

The control circuit shown in FIGS. 35 and 36 is provided with a control unit, a first feedback unit and a second feedback unit. A first terminal of the first feedback unit is connected to a first terminal of the control unit. A second terminal of the first feedback unit serves as an input terminal of a first reference voltage. An output terminal of the first feedback unit is connected to a second terminal of the control unit and a first terminal of the second feedback unit. A second terminal of the second feedback unit serves as an input terminal of a second reference voltage. An output terminal of the second feedback unit is connected to a third terminal of the control unit. The first feedback unit is configured to output a first feedback signal according to a voltage of the control unit and the first reference voltage. The second feedback unit is configured to output a second feedback signal according to an output voltage of the first feedback unit and the second reference voltage. The control unit is configured to adjust a voltage of the second terminal of the control unit according to the first feedback unit, and adjust a voltage of the third terminal of the control unit according to the second feedback signal, so as to allow a current variation of the control unit with a first parameter to be within a first range. Here, the first parameter refers to any of a power supply voltage, an operating temperature, and a manufacturing process, so that the second terminal of the control unit and the third terminal of the control unit can respectively output a voltage that varies with any of the power supply voltage, the operating temperature, and the manufacturing process.

Figure 37:
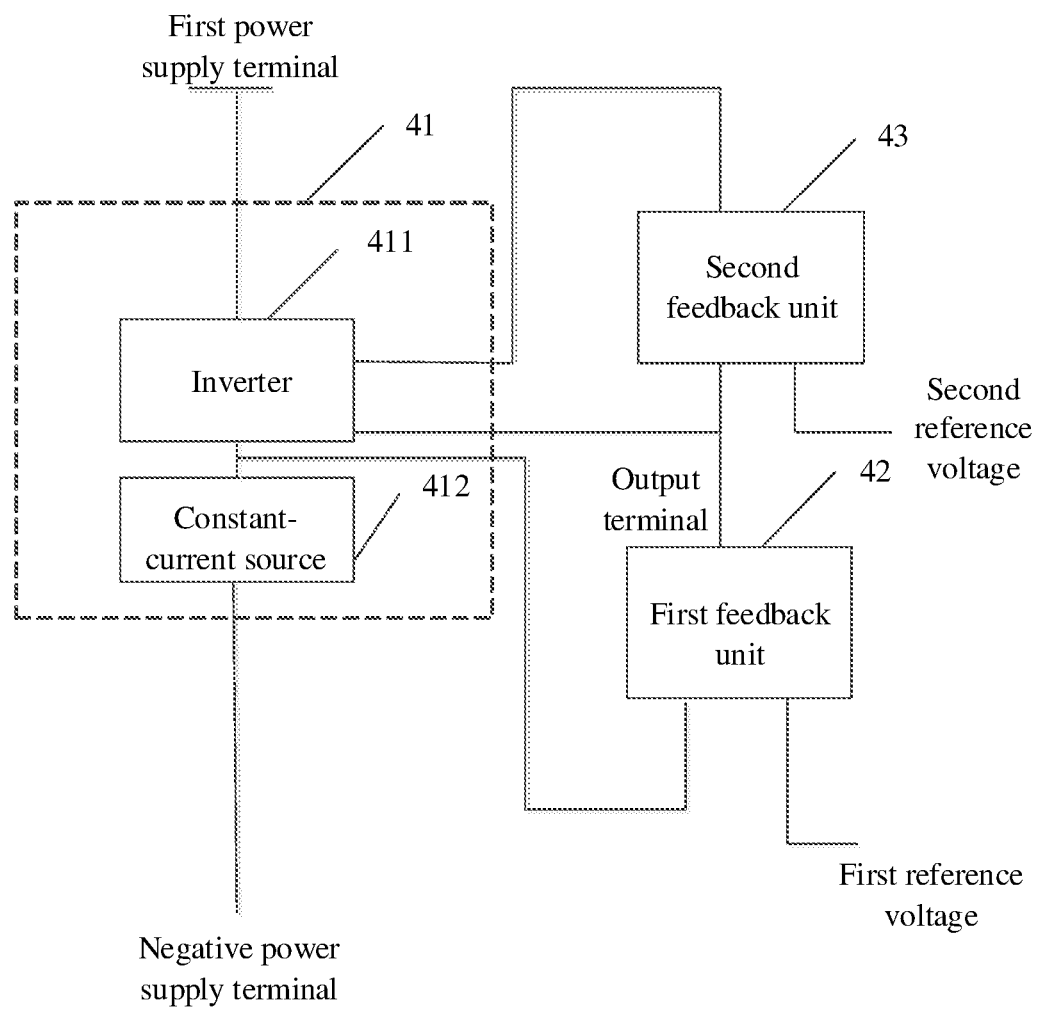
FIG. 37 is a schematic structural diagram of a control circuit according to an embodiment of the disclosure.

FIG. 37 is a schematic structural diagram of a control circuit according to an embodiment of the disclosure. As shown in FIG. 37, according to the control circuit from this embodiment based on the circuit shown in FIG. 35, the control unit 41 may further include an inverter 411 and a constant-current source 412. Here, a first terminal of the inverter 411 is connected to a first power supply terminal.

A first terminal of the constant-current source 412 is connected to a second terminal of the inverter 411. A second terminal of the constant-current source 412 is connected to a negative power supply terminal.

An input terminal of the inverter 411 is short connected with an output terminal thereof.

Figure 38:
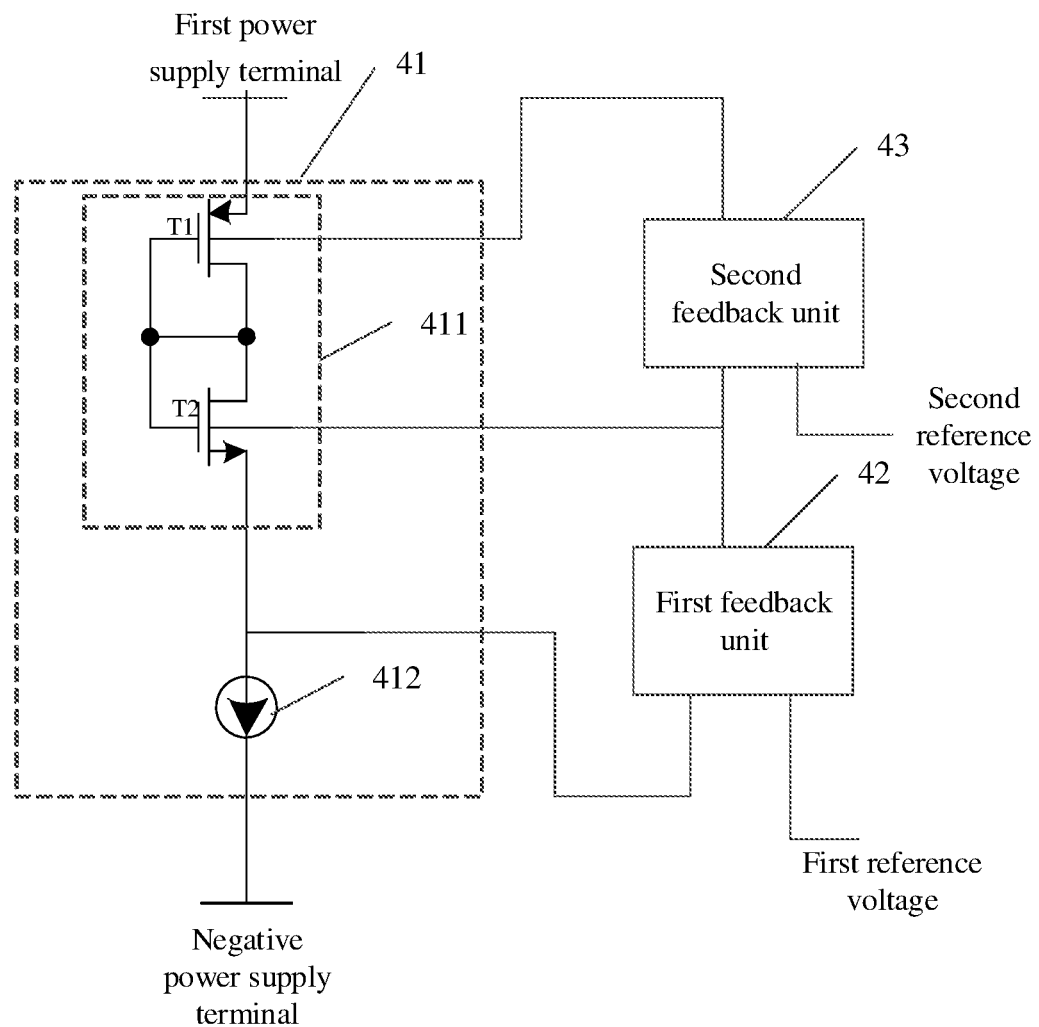
FIG. 38 is a schematic structural diagram of a control circuit according to an embodiment of the disclosure.

FIG. 38 is a schematic structural diagram of a control circuit according to an embodiment of the disclosure. As shown in FIG. 38, according to the control circuit from this embodiment based on the circuit shown in FIG. 37, the inverter 411 may further a first transistor T1 and a second transistor T2. A substrate terminal of the first transistor T1 is connected to the output terminal of the second feedback unit 43, and a substrate terminal of the second transistor T2 is connected to the output terminal of the first feedback unit 42.

A first terminal of the first transistor T1 is connected to a first power supply terminal, a second terminal of the first transistor T1 is connected to a first terminal of the second transistor T2, a control terminal of the first transistor T1 is connected to a control terminal of the second transistor T2, and a second terminal of the second transistor T2 is connected to a first terminal of the constant-current source 412.

In the embodiment, the control unit 41 is configured to adjust a voltage of the substrate terminal of the second transistor T2 according to the first feedback signal, and adjust a voltage of the substrate terminal of the first transistor T1 according to the second feedback signal.

In the control circuit according to the embodiment, the control unit is configured to adjust a voltage of the substrate terminal of the second transistor according to the first feedback signal, and adjust a voltage of the substrate terminal of the first transistor according to the second feedback signal, so as to allow a current variation of the control unit with a first parameter to be within the first range, so that the substrate terminal of the first transistor and the substrate terminal of the second transistor can respectively output a voltage that varies with any of the power supply voltage, the operating temperature, and the manufacturing process.

Figure 39:
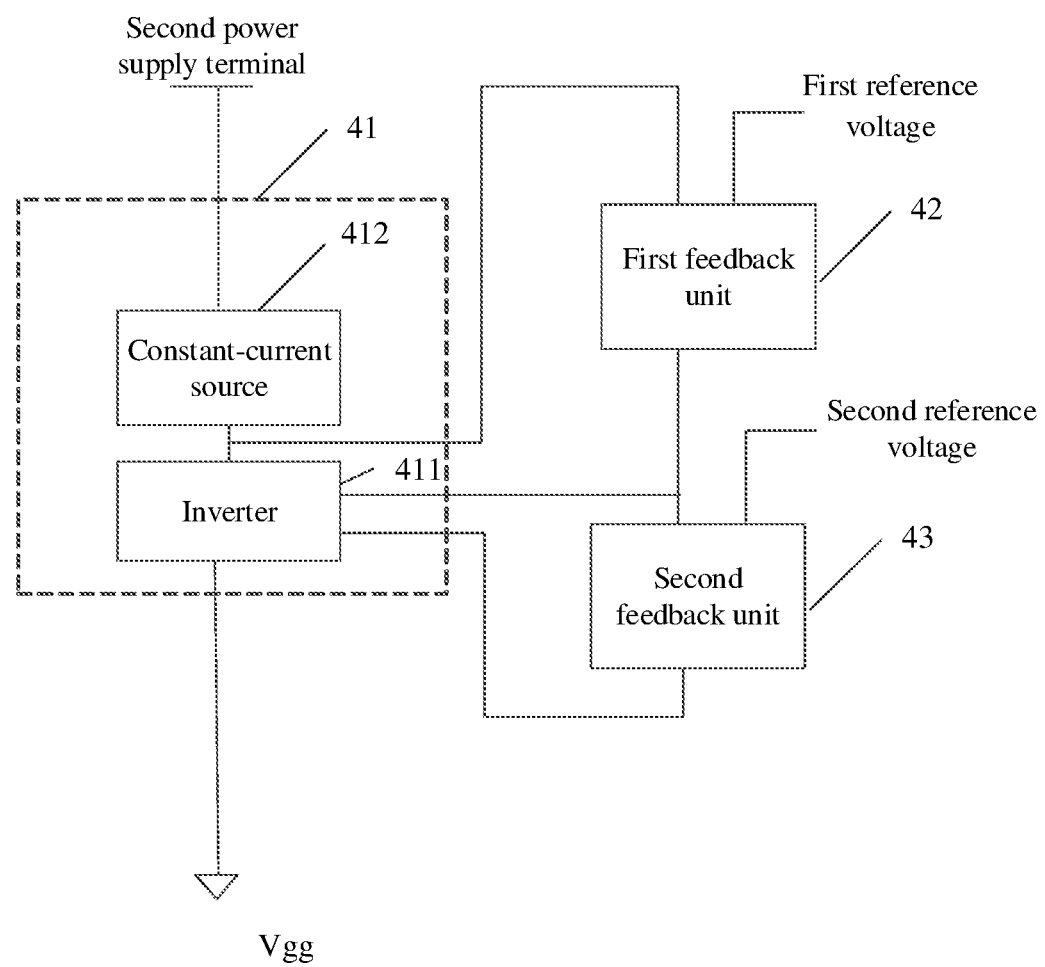
FIG. 39 is a schematic structural diagram of a control circuit according to an embodiment of the disclosure.

FIG. 39 is a schematic structural diagram of a control circuit according to an embodiment of the disclosure. As shown in FIG. 39, according to the control circuit from this embodiment based on the circuit shown in FIG. 36, the control unit 41 may further include an inverter 411 and a constant-current source 412. Here, a first terminal of the inverter 411 is connected to a ground terminal.

A first terminal of the constant-current source 412 is connected to a second terminal of the inverter 411. A second terminal of the constant-current source 412 is connected to a second power supply terminal.

An input terminal of the inverter 411 is short connected with an output terminal thereof.

Figure 40:
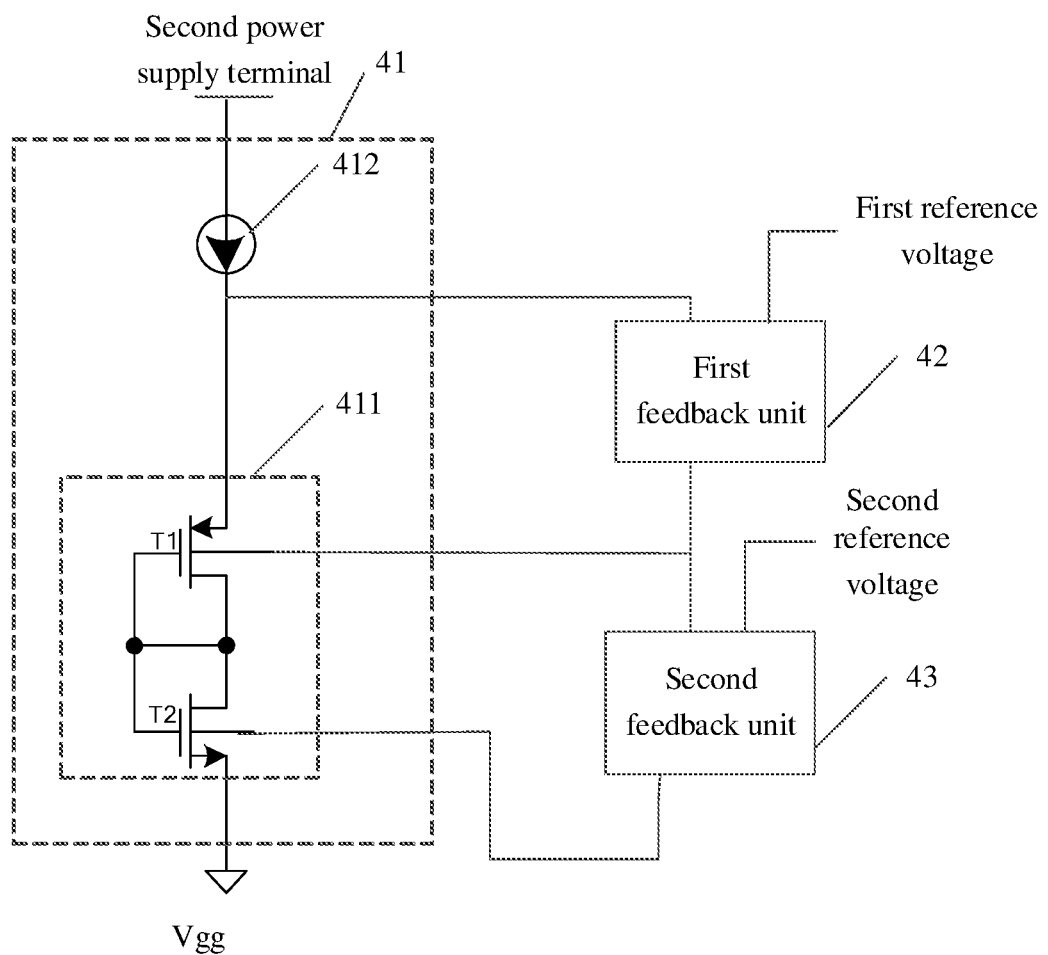
FIG. 40 is a schematic structural diagram of a control circuit according to an embodiment of the disclosure.

FIG. 40 is a schematic structural diagram of a control circuit according to an embodiment of the disclosure. As shown in FIG. 40, according to the control circuit from this embodiment based on the circuit shown in FIG. 39, the inverter 411 may further include a first transistor T1 and a second transistor T2. A substrate terminal of the first transistor T1 is connected to the output terminal of the first feedback unit 42, and a substrate terminal of the second transistor T2 is connected to the output terminal of the second feedback unit 43.

A first terminal of the first transistor T1 is connected to a first terminal of the constant-current source 412, a second terminal of the first transistor T1 is connected to a first terminal of the second transistor T2, a control terminal of the first transistor T1 is connected to a control terminal of the second transistor T2, and a second terminal of the second transistor T2 is connected to a ground terminal.

In the embodiment, the control unit 41 is configured to adjust a voltage of the substrate terminal of the second transistor T2 according to the first feedback signal, and adjust a voltage of the substrate terminal of the first transistor T1 according to the second feedback signal.

In the control circuit according to the embodiment, the control unit is configured to adjust a voltage of the substrate terminal of the second transistor according to the first feedback signal, and adjust a voltage of the substrate terminal of the first transistor according to the second feedback signal, so as to allow a current variation of the control unit with a first parameter to be within a first range, so that the substrate terminal of the first transistor and the substrate terminal of the second transistor can respectively output a voltage that varies with any of the power supply voltage, the operating temperature, and the manufacturing process.

In the control circuit shown in FIGS. 38 and 40, the first transistor is a P-type transistor, and the second transistor is an N-type transistor.

The specifically implementable structures of the first feedback unit and the second feedback unit will be illustrated in detail below with reference to the accompany drawings.

Figure 41:
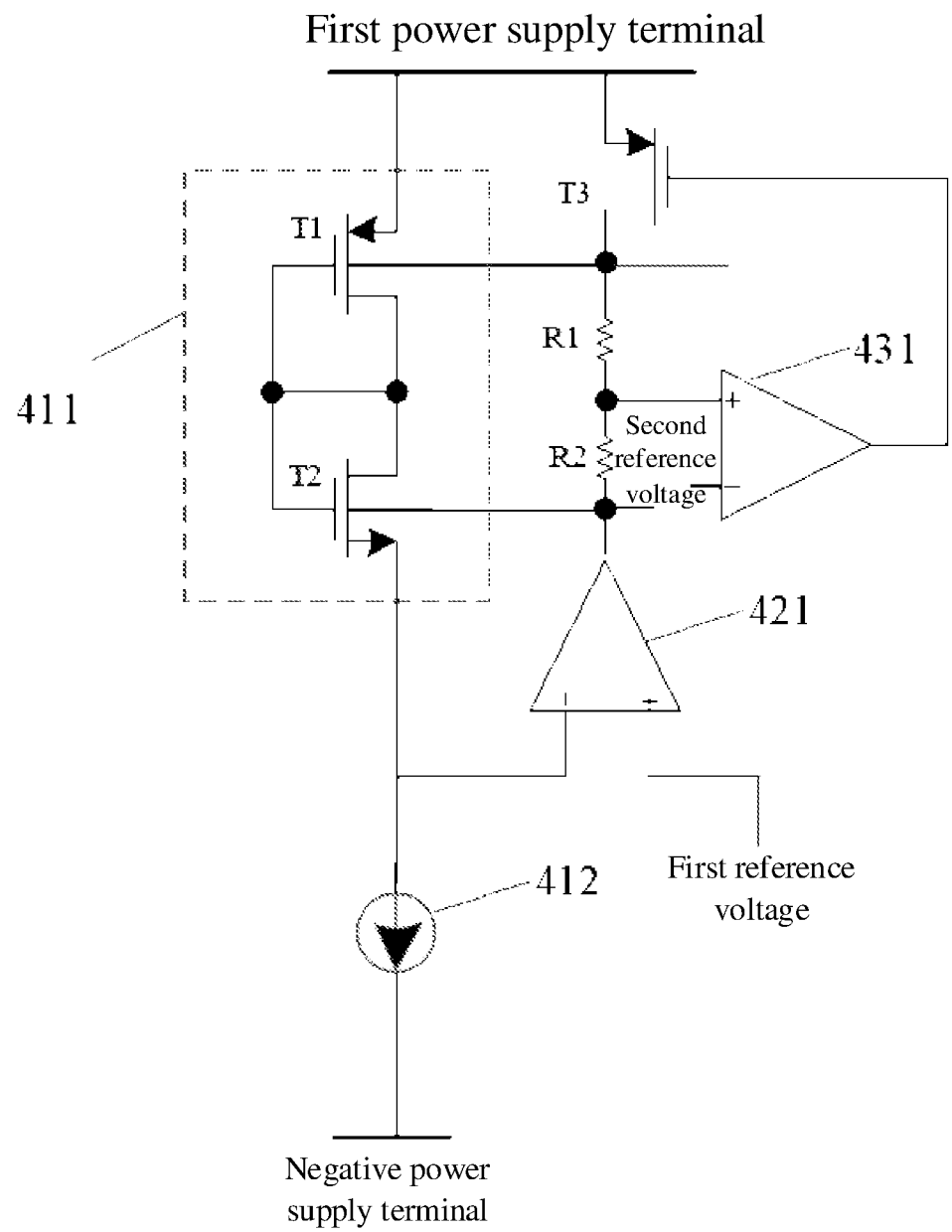
FIG. 41 is a schematic structural diagram of a control circuit according to an embodiment of the disclosure.

FIG. 41 is a schematic structural diagram of a control circuit according to an embodiment of the disclosure. As shown in FIG. 41, according to the control circuit from the embodiment based on the circuit shown in FIG. 38, the first feedback unit 42 may further include a first error amplifier 421. A negative input terminal of the first error amplifier 421 is connected to the first terminal of the control unit 41. A positive input terminal of the first error amplifier 421 serves as the input terminal of the first reference voltage. An output terminal of the first error amplifier 421 is connected to the second terminal of the control unit 41 and the first terminal of a second feedback unit 43.

As shown in FIG. 41, the second feedback unit 43 may further include a second error amplifier 431, a first resistor R1, a second resistor R2, and a third transistor T3. A negative input terminal of the second error amplifier 431 serves as the input terminal of the second reference voltage. A positive input terminal of the second error amplifier 431 is connected to a first terminal of the first resistor R1 and a first terminal of the second resistor R2. An output terminal of the second error amplifier 431 is connected to a control terminal of the third transistor T3.

A second terminal of the first resistor R1 is connected to a first terminal of the third transistor T3 and the third terminal of the control unit 41.

A second terminal of the second resistor R2 is connected with the output terminal of the first feedback unit 42 and the second terminal of the control unit 41.

A second terminal of the third transistor T3 is connected to a first power supply terminal.

Figure 42:
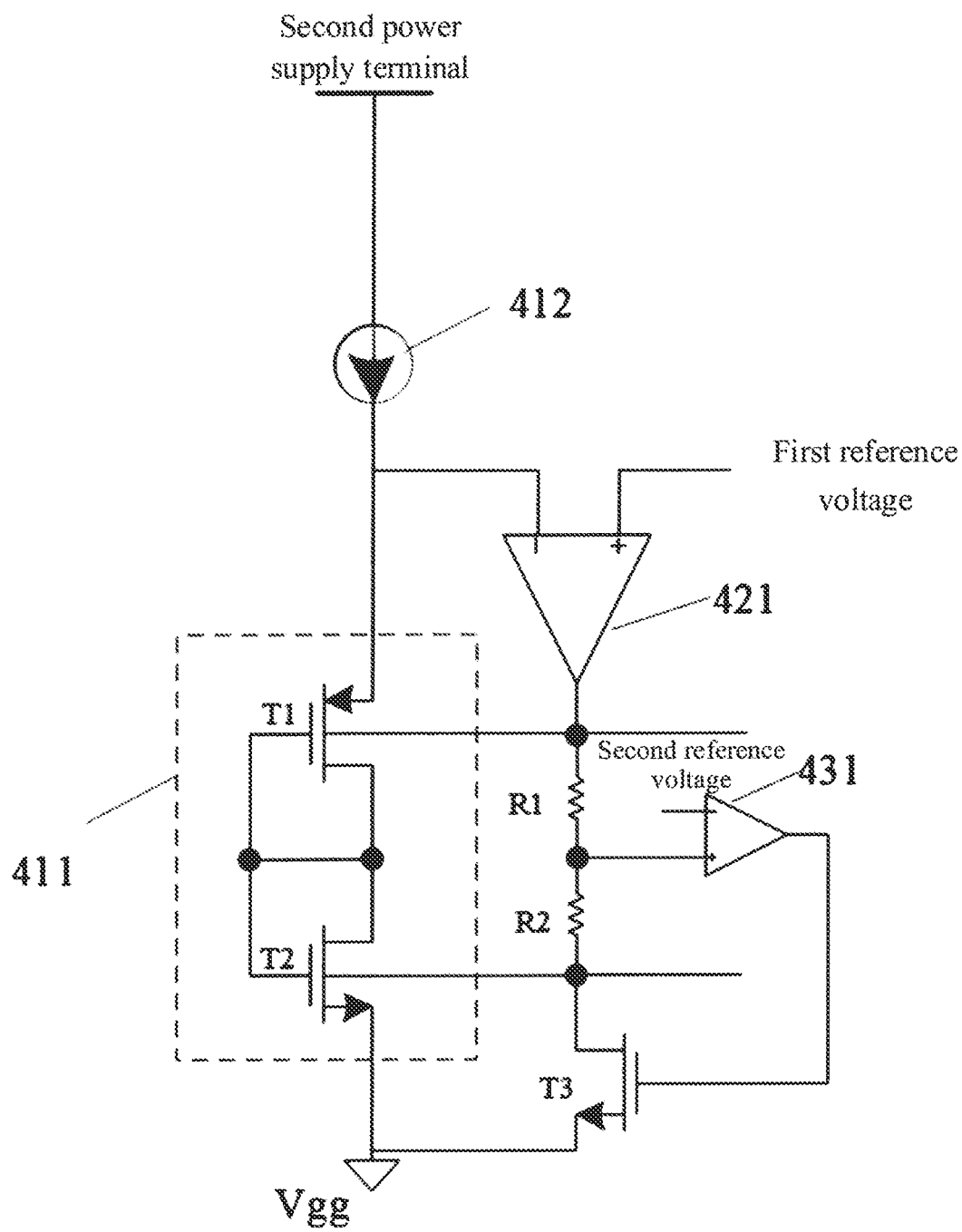
FIG. 42 is a schematic structural diagram of a control circuit according to an embodiment of the disclosure.

FIG. 42 is a schematic structural diagram of a control circuit according to an embodiment of the disclosure. As shown in FIG. 42, according to the control circuit from the embodiment based on the circuit shown in FIG. 40, the first feedback unit 42 may further include a first error amplifier 421. A negative input terminal of the first error amplifier 421 is connected to the first terminal of the control unit 41 A positive input terminal of the first error amplifier 421 serves as the input terminal of the first reference voltage. An output terminal of the first error amplifier 421 is connected to the second terminal of the control unit 41 and the first terminal of a second feedback unit 43.

As shown in FIG. 42, the second feedback unit 43 may further include a second error amplifier 431, a first resistor R1, a second resistor R2, and a third transistor T3. A negative input terminal of the second error amplifier 431 serves as the input terminal of the second reference voltage.

A positive input terminal of the second error amplifier 431 is connected to a first terminal of the first resistor R1 and a first terminal of the second resistor R2. An output terminal of the second error amplifier 431 is connected to a control terminal of the third transistor T3.

A second terminal of the first resistor R1 is connected to the output terminal of the first feedback unit 42 and the second terminal of the control unit 41.

A second terminal of the second resistor R2 is connected to a first terminal of the third transistor T3 and the third terminal of the control unit 41.

A second terminal of the third transistor T3 is connected to a ground terminal.

Figure 43:
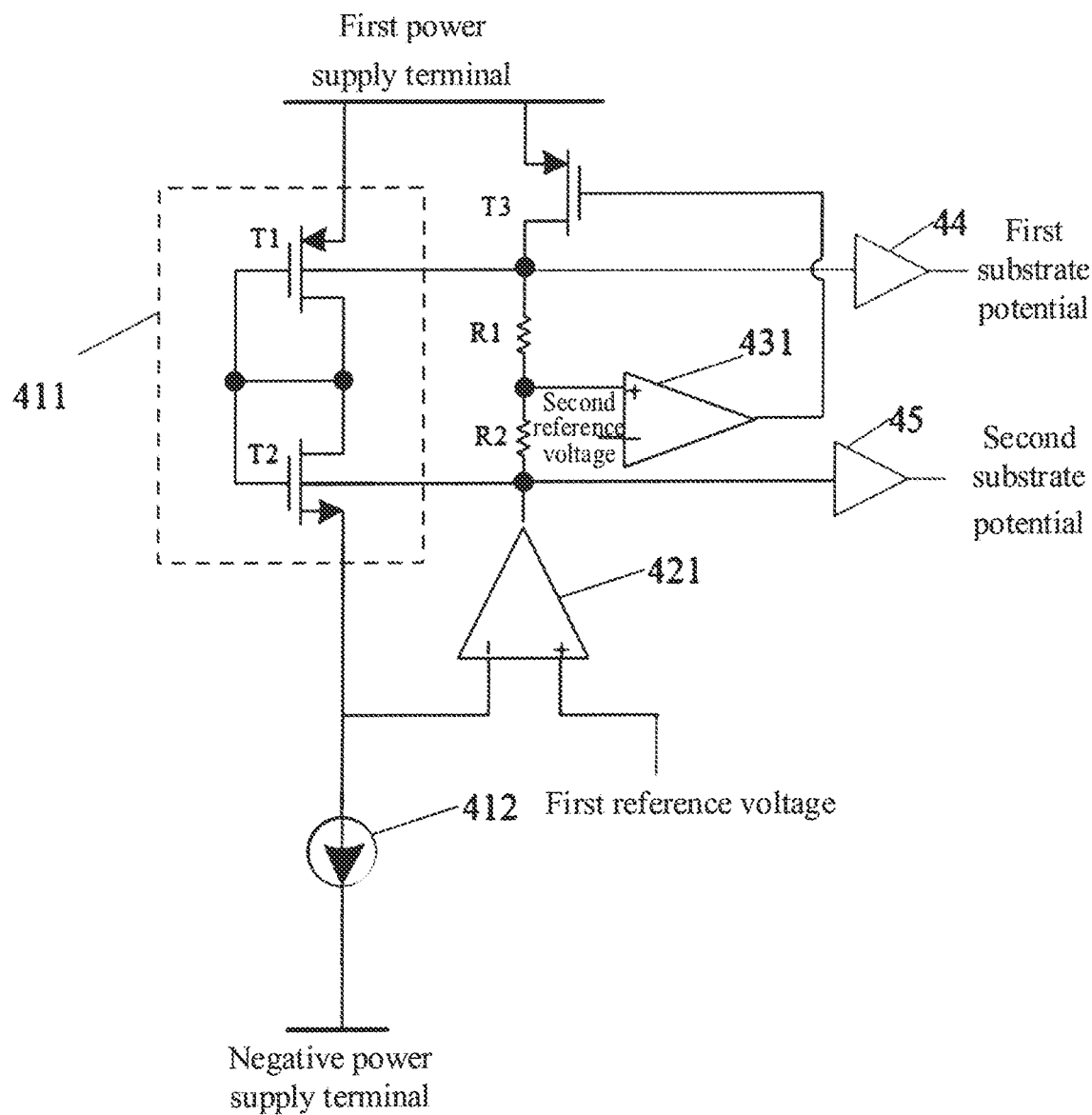
FIG. 43 is a schematic structural diagram of a control circuit according to an embodiment of the disclosure.
Figure 44:
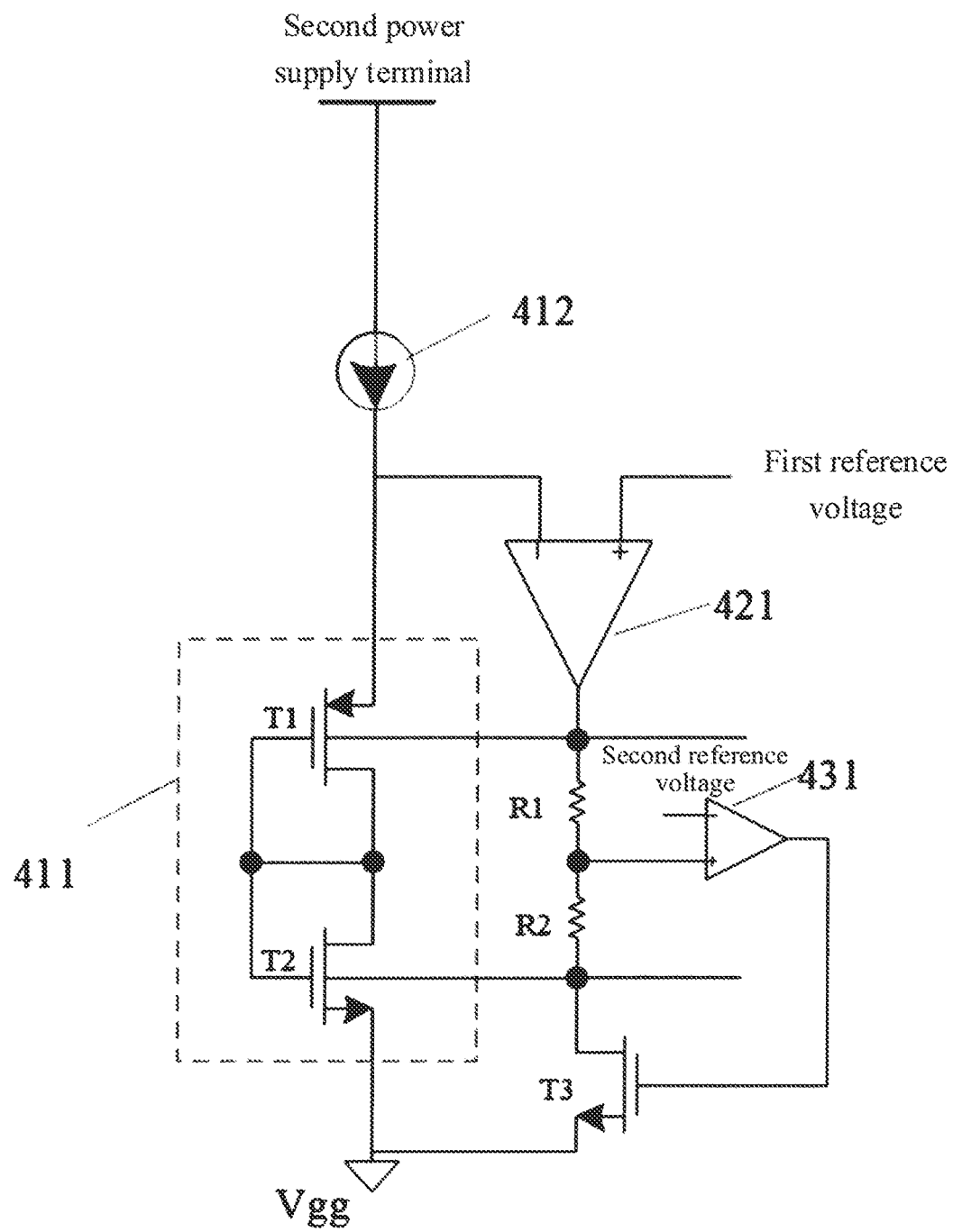
FIG. 44 is a schematic structural diagram of a control circuit according to an embodiment of the disclosure.

The control circuit shown in FIG. 41 or FIG. 42 may further include a first buffer and a second buffer. FIG. 43 is a schematic structural diagram of a control circuit according to an embodiment of the disclosure. FIG. 44 is a schematic structural diagram of a control circuit according to an embodiment of the disclosure. As shown in FIGS. 43 and 44, based on the control circuit shown in FIG. 41 or FIG. 42, the control circuit may further include a first buffer 44 and a second buffer 45. The first buffer 44 is connected to the substrate terminal of the first transistor T1, and the first buffer 44 outputs a first substrate voltage. A value of the first substrate voltage is equal to a voltage value of the substrate terminal of the first transistor T1. An input voltage of the first buffer 44 is equal to and an output voltage of the first buffer 44. The first buffer 44 is configured to improve the driving capability of the potential of the substrate terminal of the first transistor T1, and can also isolate the substrate terminal of the first transistor T1 to prevent the potential of the substrate terminal of the first transistor T1 from being interfered.

The second buffer 45 is connected to the substrate terminal of a second transistor T2, and the second buffer 45 outputs a second substrate voltage. A value of the second substrate voltage is equal to a voltage value of the substrate terminal of the first transistor T1. The second buffer 45 is configured to improve the driving capability of the potential of the substrate terminal of the second transistor T2, and can also isolate the substrate terminal of the second transistor T2 to prevent the potential of the substrate terminal of the second transistor T2 from being interfered.

It should be noted that in the control circuit shown in FIGS. 35 to 44, a voltage of the first power supply terminal is, for example, Vcc, and the second reference voltage may be Vcc/2. A voltage of the negative power supply terminal may be a value less than 0, and the first reference voltage may be 0.

A voltage of the second power supply terminal is greater than the first reference voltage. A value of the second reference voltage may be a half of the first reference voltage. For example, the voltage of the second power supply terminal is Vdd, the first reference voltage is Vcc, where Vdd is greater than Vcc, and the value of the second reference voltage may be Vcc/2.

The structure of the control circuit of this disclosure will be illustrated below with reference to the specific embodiments. The specific structure of the control circuit of this disclosure is not limited to any of the following structures.

Specifically, the specific structure of the control circuit according to the embodiment may refer to the circuit structures shown in FIGS. 11 and 12. The potential generating circuit shown in FIGS. 11 and 12 is the control circuit in the embodiment, and the potential generating circuit and the control circuit have the same working principle. The details can be referred to the description of the embodiment shown in FIGS. 11 and 12, which will not be elaborated here.

The embodiment of this disclosure further provides a delay circuit, including the control circuit shown in any of FIGS. 35 to 44 and a delay unit. The second terminal of the control unit in the control circuit is connected to a first terminal of the delay unit, and the third terminal of the control unit is connected to a second terminal of the delay unit. The control circuit is configured to control a variation of the rising edge delay time and/or the falling edge delay time of the delay unit with the first parameter to be within the first range.

Alternatively, the delay unit includes an inverter, and the inverter includes a fourth transistor and a fifth transistor. The third terminal of the control unit is connected to a substrate terminal of the fourth transistor. The second terminal of the control unit is connected to a substrate terminal of the fifth transistor.

Alternatively, the fourth transistor is a P-type transistor, and the fifth transistor is an N-type transistor.

In the embodiment, alternatively, the control circuit in the delay circuit is the control circuit shown in any of FIG. 38, FIG. 40, and FIGS. 41 to 44, a ratio of a channel length of the first transistor to a channel length of the fourth transistor is denoted as H, a ratio of a channel length of the second transistor to a channel length of the fifth transistor is denoted as L, a ratio of a channel width of the first transistor to a channel width of the fourth transistor is denoted as M, and a ratio of a channel width of the second transistor to a channel width of the fifth transistor is denoted as N, where H is equal to L, and M is equal to N.

Thus, in the delay circuit provided in the embodiment, the second terminal and the third terminal of the control unit can respectively output a voltage that varies with the first parameter (any of the power supply voltage, the operating temperature, and the manufacturing process). A first substrate voltage that varies with the first parameter may be provided to the substrate terminal of the fourth transistor, and a second substrate voltage that varies with the first parameter may be provided to the substrate terminal of the fifth transistor. Thus, a variation of current flowing through the two transistors of the inverter with the first parameter may be adjusted to be within a first range, and the variation of the current flowing through the two transistors of the inverter may be compensated, so that a delay time T of the delay circuit may be with a slight variation, and thus the control capability of the delay circuit to accuracy of the delay time can be improved.

It should be noted that, in the embodiment of this disclosure, connection relationships between the control circuit and inverters may be set according to the number of the inverters included in the delay circuit and the requirements for compensation of the delay time. A substrate terminal of a P-type transistor in each inverter is connected to a substrate terminal of a P-type transistor of the control circuit, so that a variation of a rising edge delay time of the delay circuit may be adjusted. A substrate terminal of an N-type transistor in the inverter is connected to a substrate terminal of an N-type transistor of the control circuit, so that a variation of a falling edge delay time of the delay circuit may be adjusted. Specifically, the connection relationships between the control circuit and the inverters may be set according to the variation of the rising edge delay time and/or the falling edge delay time required to be adjusted. The control circuit provided in the embodiment of this disclosure may be applied to the delay circuit that requires both a rising edge and/or a falling edge delay. Therefore, the influence of a manufacturing process of the delay circuit, a power supply voltage of the delay circuit, and an operating temperature of the delay circuit on the delay time T of the delay circuit can reduced, so that the delay time T (including the rising edge delay time and/or the falling edge delay time) may of the delay circuit variation, and thus the control capability of the delay circuit to accuracy of the delay time can be improved.

FIGS. 13 to 15 show examples of the delay circuit in two types, which can also be applied to this embodiment. The potential generating circuit shown in FIGS. 13 to 15 is the specific control circuit in the embodiment. The details can be referred to specific descriptions in FIGS. 15 to 18, which will not be elaborated here.

Embodiment 4

Figure 45:
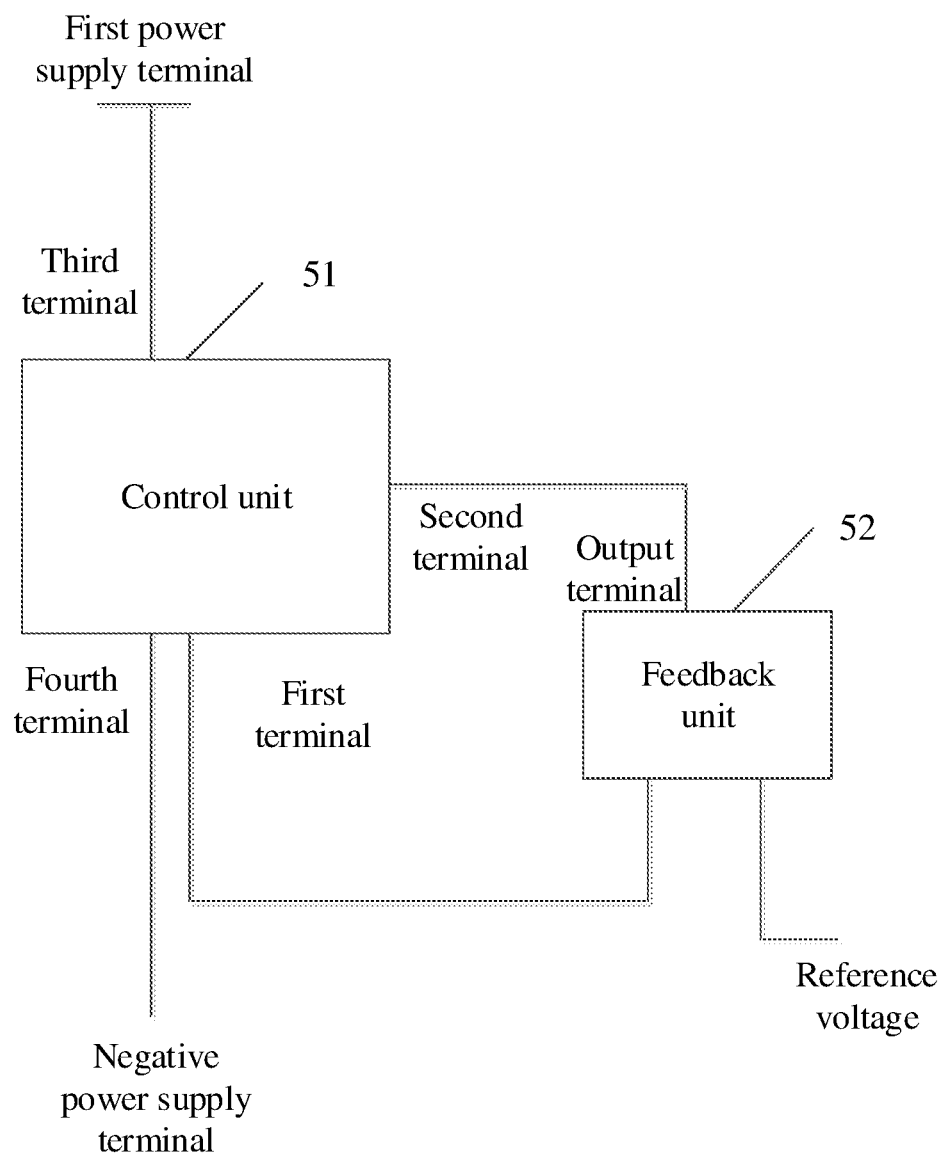
FIG. 45 is a schematic structural diagram of a control circuit according to an embodiment of the disclosure.

FIG. 45 is a schematic structural diagram of a control circuit according to an embodiment of the disclosure. As shown in FIG. 45, the control circuit according to this embodiment may include a control unit 51 and a feedback unit 52.

The feedback unit 52 is configured to output a feedback signal according to a voltage of the control unit 51 and a reference voltage. A first terminal of the feedback unit 52 is connected to a first terminal of the control unit 51. A second terminal of the feedback unit 52 serves as an input terminal of the reference voltage, and an output terminal of the feedback unit 52 is connected to a second terminal of the control unit 51.

The control unit 51 is configured to adjust a voltage of the second terminal of the control unit 51 according to the feedback signal, so as to allow a current variation of the control unit with a first parameter to be within a first range. The first parameter includes at least one of a manufacturing process of the control circuit, a power supply voltage of the control circuit, and an operating temperature of the control circuit. A third terminal of the control unit 51 is connected to a power supply terminal, and a fourth terminal of the control unit 51 is connected to a negative power supply terminal.

Specifically, the first range is a small range, for example, a range close to 0, such as, the first range being 1%, 3%, or 5%, so that the current variation of the control unit 41 with the first parameter may be slight.

Figure 46:
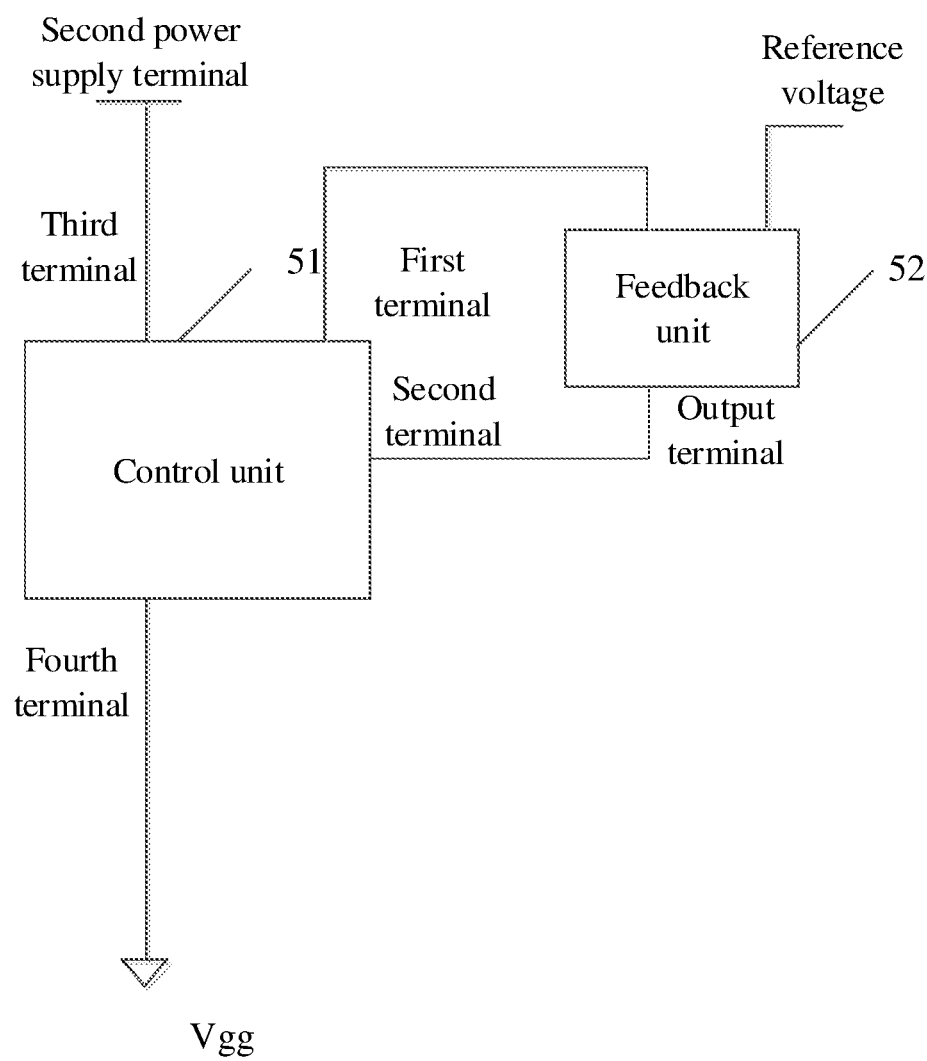
FIG. 46 is a schematic structural diagram of a control circuit according to an embodiment of the disclosure.

FIG. 46 is a schematic structural diagram of a control circuit according to an embodiment of the disclosure. As shown in FIG. 46, the difference of this embodiment and the embodiment shown in FIG. 45 lies in: a third terminal of the control unit 51 is connected to a second power supply terminal, and a fourth terminal of the control unit 51 is connected to a ground terminal Vgg.

The control circuit shown in FIGS. 45 and 46 is provided with a control unit and a feedback unit. The feedback unit is configured to output a feedback signal according to a voltage of the control unit and a reference voltage. The control unit is configured to adjust a voltage of a second terminal of the control unit according to the feedback unit, so as to allow a current variation of the control unit with a first parameter to be within a first range. Here, the first parameter refers to any of a power supply voltage, an operating temperature, and a manufacturing process, so that the second terminal of the control unit can output a voltage that varies with any of the power supply voltage, the operating temperature, and the manufacturing process.

Figure 47:
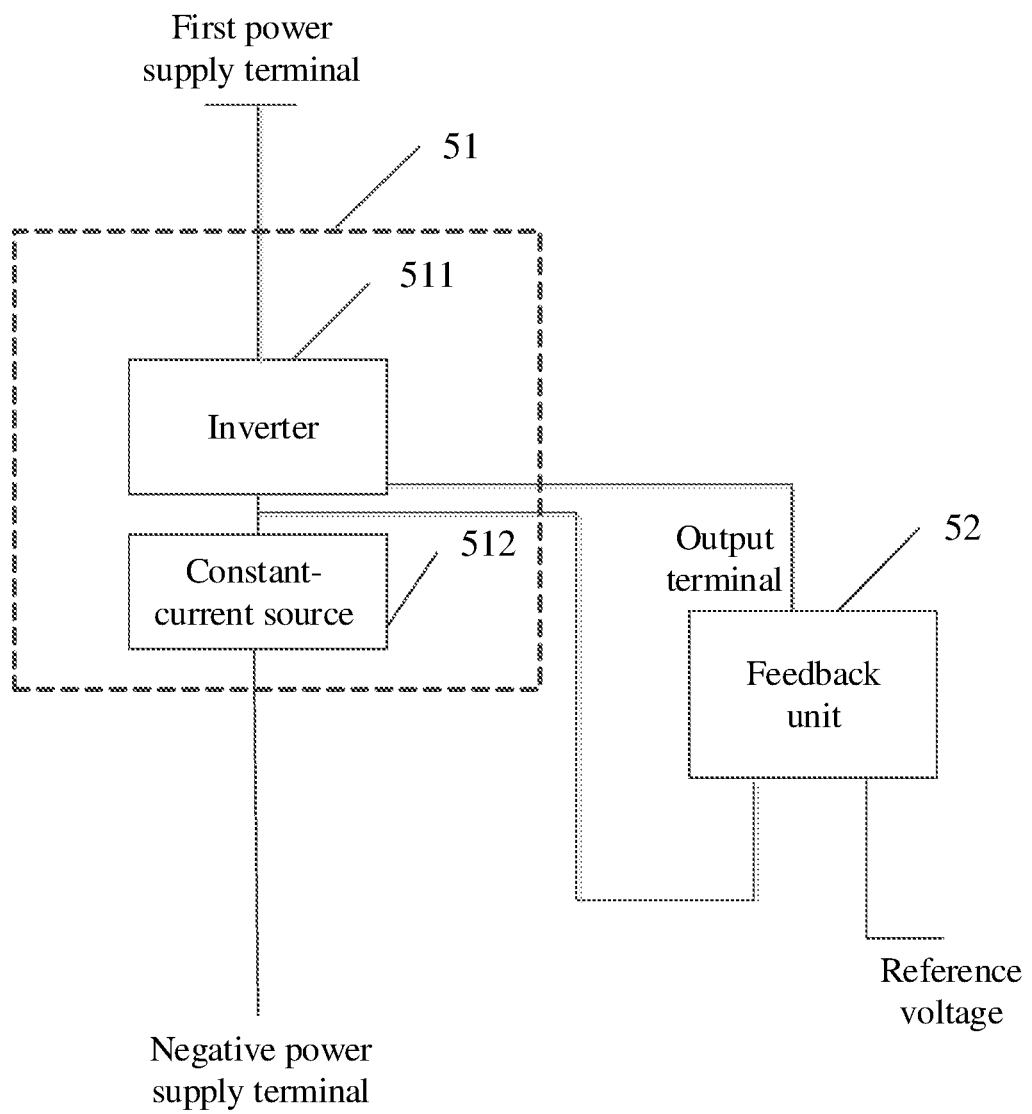
FIG. 47 is a schematic structural diagram of a control circuit according to an embodiment of the disclosure.

FIG. 47 is a schematic structural diagram of a control circuit according to an embodiment of the disclosure. As shown in FIG. 47, according to the control circuit from this embodiment based on the circuit shown in FIG. 45, the control unit 51 may further include an inverter 511 and a constant-current source 512. Here, a first terminal of the inverter 511 is connected to a first power supply terminal. A first terminal of the constant-current source 512 is connected to a second terminal of the inverter 511. A second terminal of the constant-current source 512 is connected to a negative power supply terminal. And an input terminal of the inverter 511 is connected to an output terminal thereof.

Figure 48:
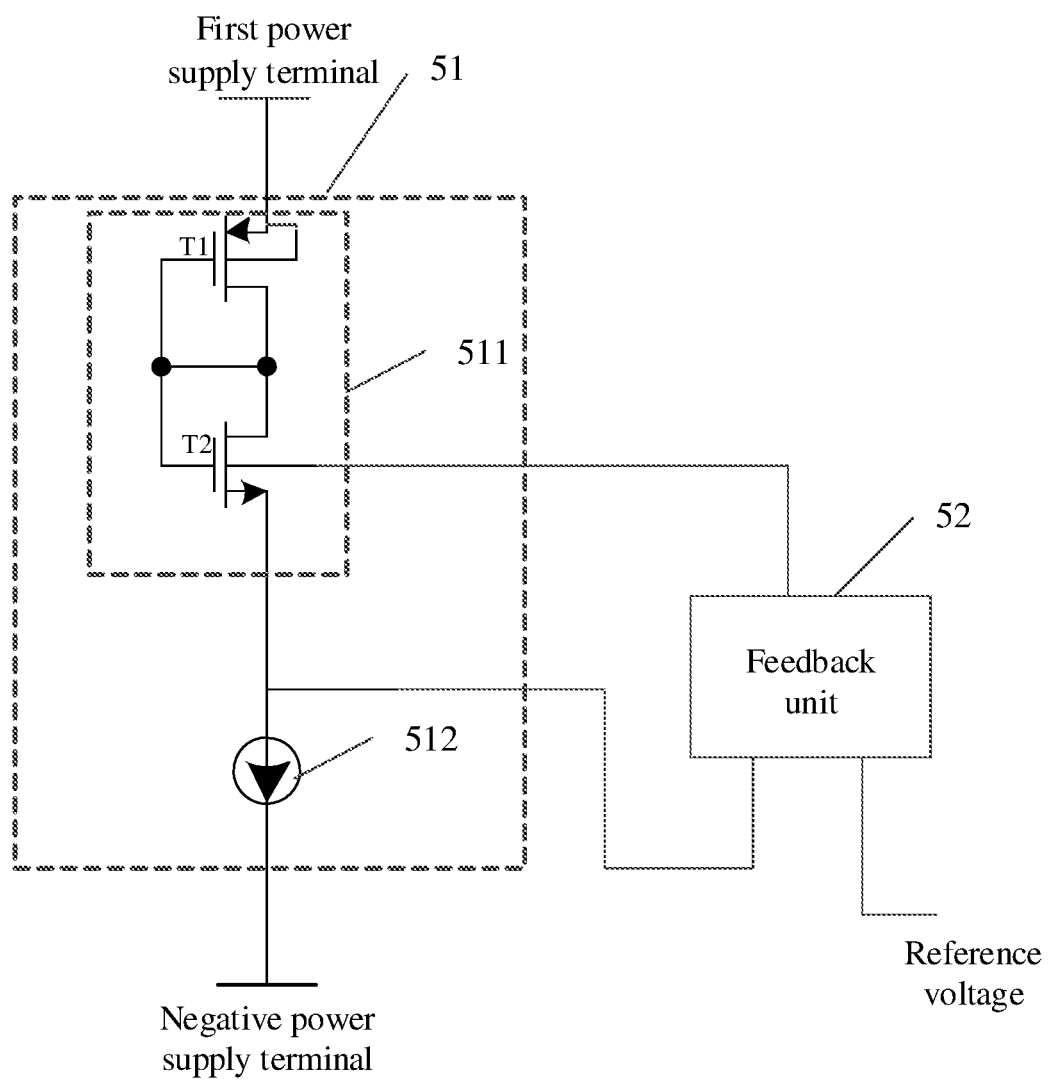
FIG. 48 is a schematic structural diagram of a control circuit according to an embodiment of the disclosure.

FIG. 48 is a schematic structural diagram of a potential generating circuit according to an embodiment of the disclosure. As shown in FIG. 48, according to the control circuit from this embodiment based on the circuit shown in FIG. 47, the inverter 511 may further include a first transistor T1 and a second transistor T2. A substrate terminal of the first transistor T1 is connected to the first power supply terminal. And a substrate terminal of the second transistor T2 is connected to the output terminal of the feedback unit 52.

A first terminal of the first transistor T1 is connected to the first power supply terminal. A second terminal of the first transistor T1 is connected to a first terminal of the second transistor T2. A control terminal of the first transistor T1 is connected to a control terminal of the second transistor T2. And a second terminal of the second transistor T2 is connected to a first terminal of the constant-current source 512.

In the embodiment, the control unit 41 is configured to adjust a voltage of the substrate terminal of the second transistor T2 according to the feedback signal.

In the control circuit according to the embodiment, the control unit is configured to adjust the voltage of the substrate terminal of the second transistor according to the feedback unit, so as to allow a current variation of the control unit to be within a first range with a first parameter. Herein, the first parameter refers to any of a power supply voltage, an operating temperature, and a manufacturing process, so that the substrate terminal of the second transistor can output a voltage that varies with any of the power supply voltage, the operating temperature, and the manufacturing process.

Figure 49:
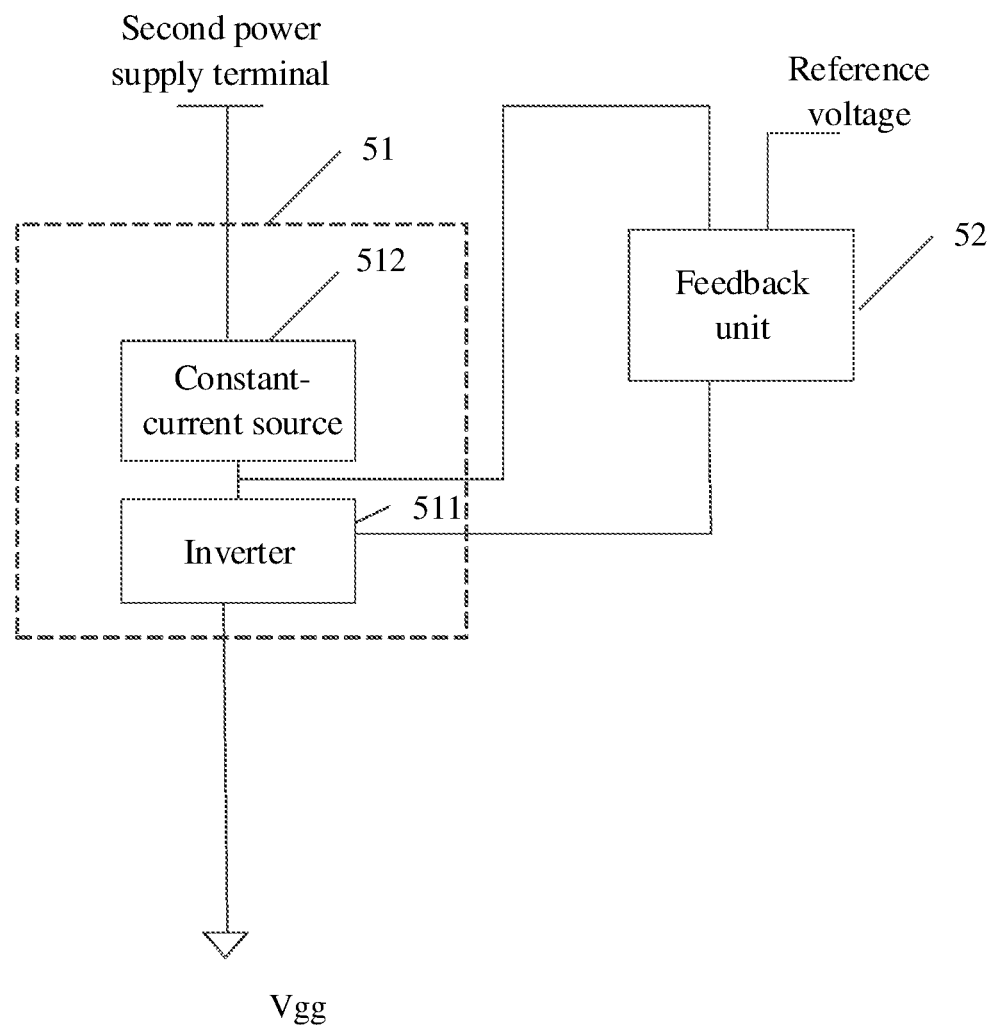
FIG. 49 is a schematic structural diagram of a control circuit according to an embodiment of the disclosure.

FIG. 49 is a schematic structural diagram of a control circuit according to an embodiment of the disclosure. As shown in FIG. 49, according to the control circuit from this embodiment based on the circuit shown in FIG. 46, the control unit 51 may further include an inverter 511 and a constant-current source 512. Here, a first terminal of the inverter 511 is connected to a ground terminal. A first terminal of the constant-current source 512 is connected to a second terminal of the inverter 511. A second terminal of the constant-current source 512 is connected to a second power supply terminal. And an input terminal of the inverter 511 is connected to an output terminal thereof.

Figure 50:
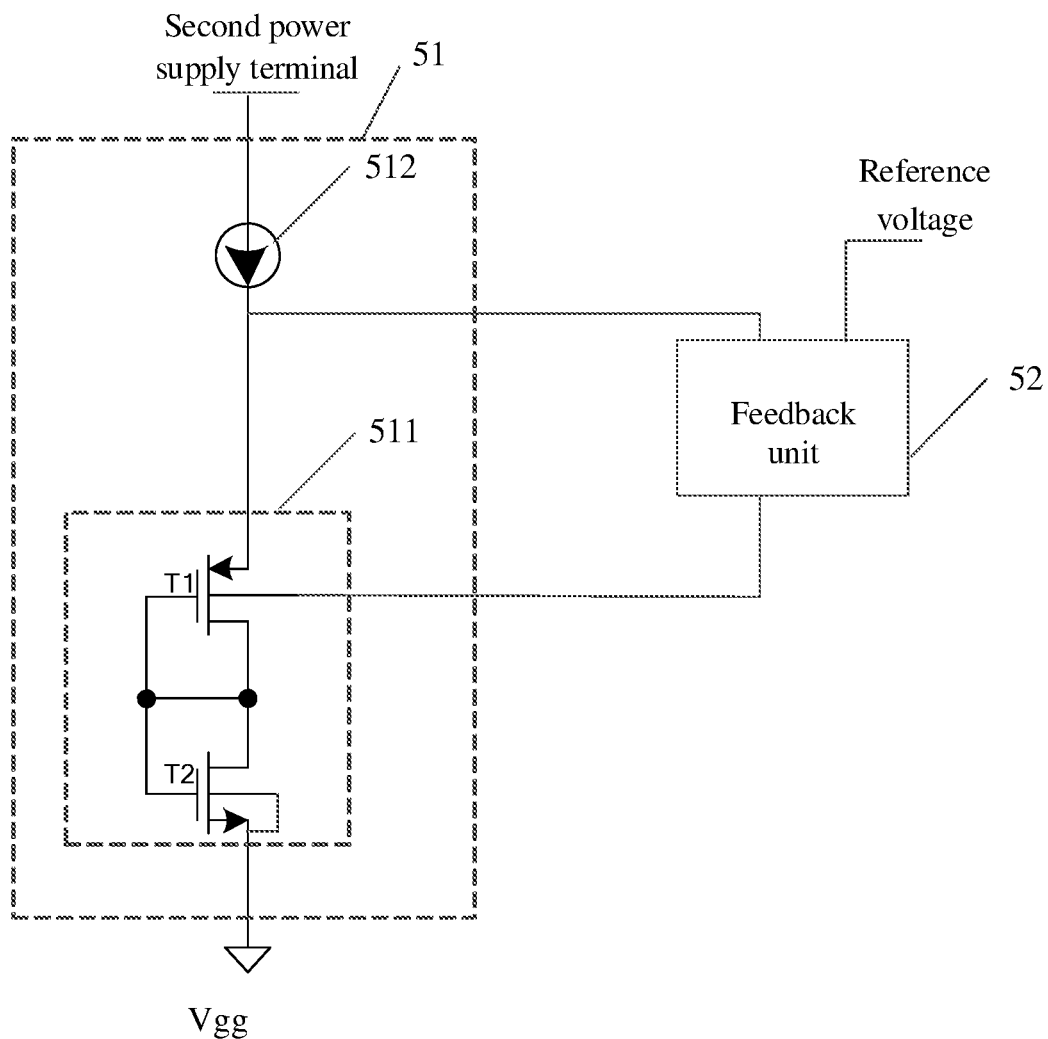
FIG. 50 is a schematic structural diagram of a control circuit according to an embodiment of the disclosure.

FIG. 50 is a schematic structural diagram of a control circuit according to an embodiment of the disclosure. As shown in FIG. 50, according to the control circuit from this embodiment based on the circuit shown in FIG. 49, the inverter 511 may further include a first transistor T1 and a second transistor T2. A substrate terminal of the first transistor T1 is connected to an output terminal of the feedback unit 42. And a substrate terminal of the second transistor T2 is connected to the ground terminal.

A first terminal of the first transistor T1 is connected to a first terminal of the constant-current source 512, a second terminal of the first transistor T1 is connected to a first terminal of the second transistor T2, a control terminal of the first transistor T1 is connected to a control terminal of the second transistor T2, and a second terminal of the second transistor T2 is connected to the ground terminal.

In the embodiment, the control unit 51 is configured to adjust a voltage of the substrate terminal of the first transistor T1 according to the feedback signal.

In the control circuit according to the embodiment, the control unit is configured to adjust a voltage of the substrate terminal of the first transistor according to the feedback signal, so as to allow a current variation of the control unit with a first parameter to be within a first range. Here, the first parameter refers to any of a power supply voltage, an operating temperature, and a manufacturing process, so that the substrate terminal of the first transistor can output a voltage that varies with any of the power supply voltage, the operating temperature, and the manufacturing process.

In the control circuit shown in FIGS. 48 and 50, the first transistor is a P-type transistor, and the second transistor is an N-type transistor.

The specifically implementable structure of the feedback unit will be illustrated in detail below with reference to the accompany drawings.

Figure 51:
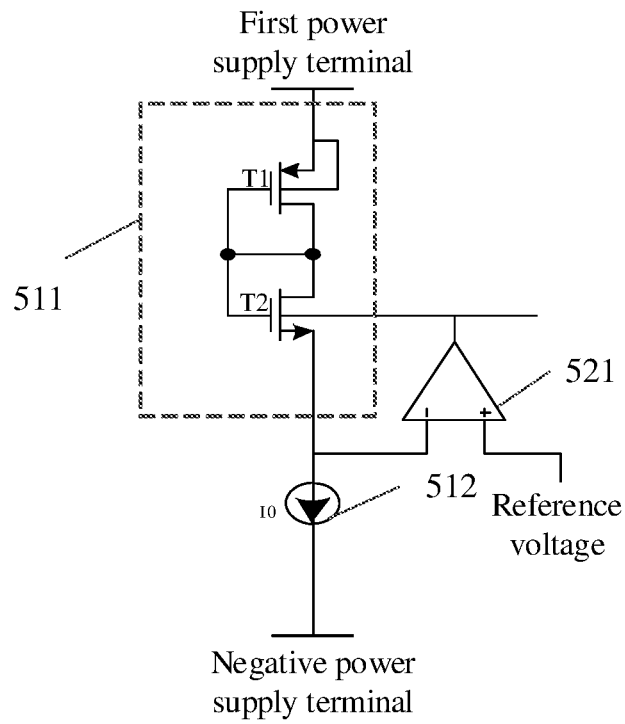
FIG. 51 is a schematic structural diagram of a control circuit according to an embodiment of the disclosure.

FIG. 51 is a schematic structural diagram of a control circuit according to an embodiment of the disclosure. As shown in FIG. 51, according to the control circuit from the embodiment based on the circuit shown in FIG. 48, the first feedback unit 52 may further include an error amplifier 521. A negative input terminal of the feedback unit 521 is connected to a first terminal of the constant-current source 512 and the second terminal of the second transistor T2. A positive input terminal of the feedback unit 521 serves as a reference voltage input terminal. An output terminal of the feedback unit 521 is connected to a substrate terminal of the second transistor T2.

Figure 52:
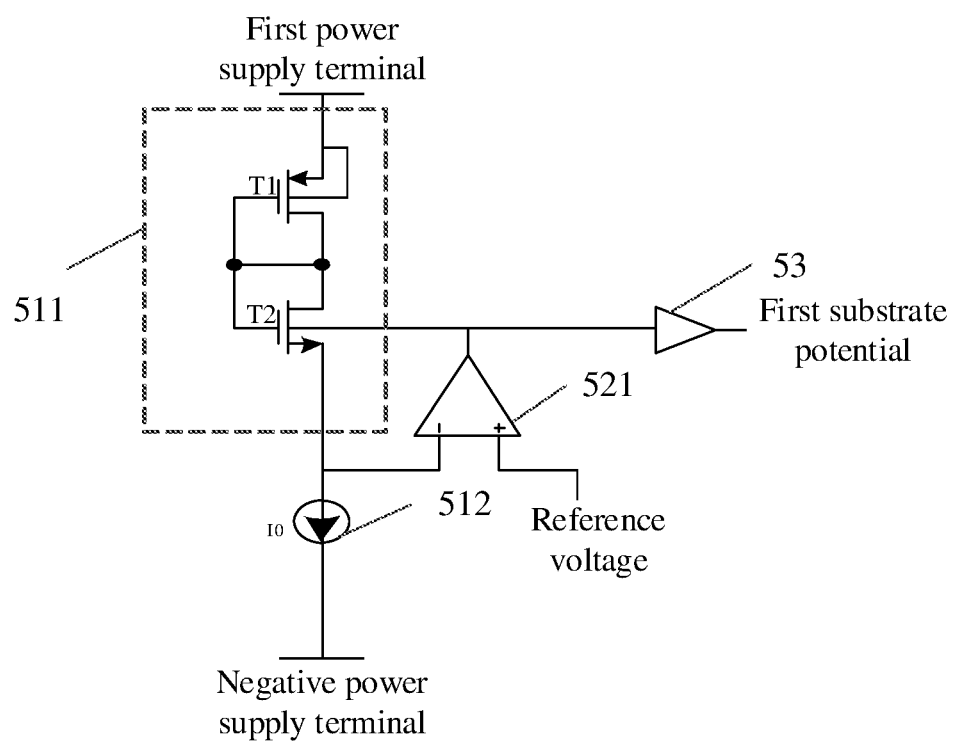
FIG. 52 is a schematic structural diagram of a control circuit according to an embodiment of the disclosure.

FIG. 52 is a schematic structural diagram of a control circuit according to an embodiment of the disclosure. As shown in FIG. 52, based on the circuit shown in FIG. 51, the control circuit according to this embodiment may further include a buffer 53.

The buffer 53 is connected to the substrate terminal of the second transistor T2, and the buffer 53 outputs a first substrate voltage. A value of the first substrate voltage is equal to a voltage value of the substrate terminal of the second transistor T2.

Figure 53:
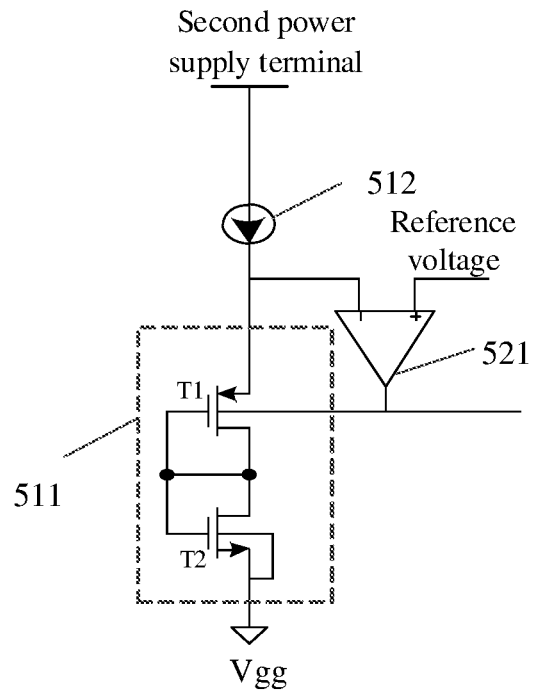
FIG. 53 is a schematic structural diagram of a control circuit according to an embodiment of the disclosure.

FIG. 53 is a schematic structural diagram of a control circuit according to an embodiment of the disclosure. As shown in FIG. 53, according to the control circuit from the embodiment based on the circuit shown in FIG. 50, the feedback unit 52 may further include an error amplifier 521. A negative input terminal of the feedback unit 521 is connected to a first terminal of the constant-current source 512 and the first terminal of the first transistor T1. The negative input terminal of the feedback unit 521 serves as a reference voltage input terminal. An output terminal of the feedback unit 521 is connected to the substrate terminal of the first transistor T1.

Figure 54:
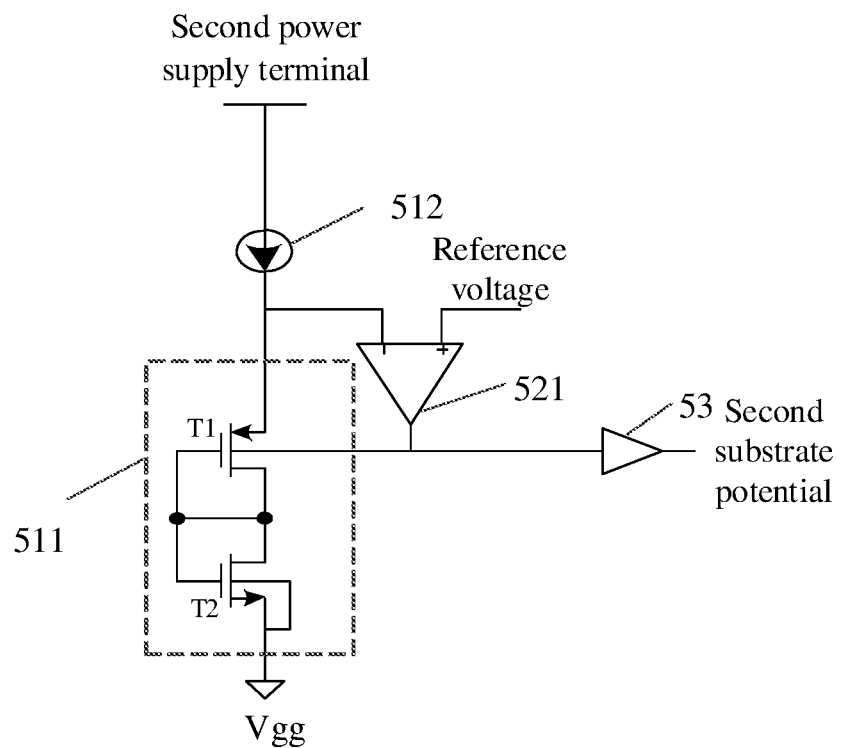
FIG. 54 is a schematic structural diagram of a control circuit according to an embodiment of the disclosure.

FIG. 54 is a schematic structural diagram of a control circuit according to an embodiment of the disclosure. As shown in FIG. 54, based on the control circuit shown in FIG. 53, the control circuit according to this embodiment may further include a buffer 53. The buffer 53 is connected to the substrate terminal of the first transistor T1 and the buffer 53 outputs a second substrate voltage. A value of the second substrate voltage is equal to a voltage value of the substrate terminal of the first transistor T1.

It should be noted that in the control circuit shown in FIGS. 45 to 54, a voltage of the first power supply terminal is, for example, Vcc, and the second reference voltage may be Vcc/2. A voltage of the negative power supply terminal may be 0 or less than 0, and the first reference voltage may be 0.

A voltage of the second power supply terminal is greater than the first reference voltage. A value of the second reference voltage may be a half of the first reference voltage. For example, the voltage of the second power supply terminal is Vdd, the first reference voltage is Vcc, where Vdd is greater than Vcc, and the value of the second reference voltage may be Vcc/2.

The structure of the control circuit of this disclosure will be illustrated below with reference to the specific embodiments. The specific structure of the control circuit of this disclosure is not limited to any of the following structures.

Specifically, the specific structure of the control circuit according to the embodiment may refer to the circuit structure shown in FIGS. 26 and 27. The potential generating circuit shown in FIGS. 26 and 27 is the control circuit in the embodiment, and the potential generating circuit and the control circuit have the same working principle. The details can be referred to the descriptions of the embodiment shown in FIGS. 26 and 27, which will not be elaborated here.

The embodiment of this disclosure further provides a delay circuit, including the control circuit shown in any of FIGS. 45 to 54 and a delay unit. The second terminal of the control unit is connected to a first terminal of the delay unit. The control circuit is configured to control a variation of a rising edge delay time and/or a falling edge delay time of the delay unit with the first parameter to be within the first range.

Alternatively, the delay unit includes an inverter, and the inverter includes a fourth transistor and a fifth transistor. The second terminal of the control unit is connected to a substrate terminal of the fourth transistor or a substrate terminal of the fifth transistor.

Alternatively, the fourth transistor is a P-type transistor, and the fifth transistor is an N-type transistor.

When a fifth terminal of the control unit is connected to the negative power supply terminal, the second terminal of the control unit is connected to a substrate terminal of the fifth transistor.

When a third terminal of the control unit is connected to the second power supply terminal and a fourth terminal of the control unit is connected to the ground terminal, the second terminal of the control unit is connected to a substrate terminal of the fourth transistor.

In the embodiment, alternatively, the control circuit in the delay circuit is the control circuit shown in any of FIG. 48, FIG. 50, or FIGS. 51 to 54, a ratio of a channel length of the first transistor to a channel length of the fourth transistor is denoted as H, a ratio of a channel length of the second transistor to a channel length of the fifth transistor is denoted as L, a ratio of a channel width of the first transistor to a channel width of the fourth transistor is denoted as M, and a ratio of a channel width of the second transistor to a channel width of the fifth transistor is denoted as N, where H is equal to L, and M is equal to N.

Thus, in the delay circuit provided in the embodiment, the second terminal of the control unit can output a voltage that varies with the first parameter (any of the power supply voltage, the operating temperature, and the manufacturing process). A substrate voltage that varies with the first parameter may be provided to the substrate terminal of the fourth transistor. Therefore, a variation of a current flowing through the fourth transistor of the inverter with the first parameter may be adjusted to be within a first range, and the variation of the current flowing through the fourth transistor of the inverter may be compensated, so that a rising edge delay time T of the delay circuit may be with a slight variation, and thus the control capability of the delay circuit to accuracy of the rising edge delay time can be improved.

Or, a first substrate voltage that varies with the first parameter may be provided to the substrate terminal of the fifth transistor. Therefore, a variation of a current flowing through the fifth transistor of the inverter with the variation of the first parameter may be adjusted to be within a first range, and the variation of the current flowing through the fifth transistor of the inverter may be compensated, so that a falling edge delay time T of the delay circuit may be with a slight variation, and thus the control capability of the delay circuit to accuracy of the falling edge delay time can be improved.

It should be noted that in the delay circuit according to the embodiment, connection relationships between the control circuit shown in the foregoing two embodiments and the inverter in the delay unit may be set according to the rising edge delay and/or the falling edge delay implemented through the delay unit. For example, a rising edge delay is implemented by a certain delay circuit, the certain delay circuit includes an inverter, and the inverter includes a P-type transistor and an N-type transistor. A first control circuit is arranged in the certain delay circuit, which can adjust a voltage of a substrate terminal of the P-type transistor in the inverter. Therefore, a current flowing through the P-type transistor in the inverter may be adjusted to allow a variation of the current flowing through the P-type transistor in the inverter with the first parameter to be within a first range, and the variation of the current flowing through the P-type transistor in the inverter can be compensated, and the rising edge delay time of the delay circuit may be with a slight variation. For another example, a falling edge delay is implemented by a certain delay circuit, the certain delay circuit includes an inverter, and the inverter includes a P-type transistor and an N-type transistor. A second control circuit is arranged in the certain delay circuit, which can adjust a voltage of a substrate terminal of the N-type transistor in the inverter, so that a current flowing through the N-type transistor in the inverter may be adjusted to allow a variation of the current flowing through the N-type transistor in the inverter with the first parameter to be within a first range. And the variation of the current flowing through the N-type transistor in the inverter can be compensated, and a falling edge delay time of the certain delay circuit may be with a slight variation. For another example, both of a rising edge delay and a falling edge delay are implemented by a certain delay circuit, the certain delay circuit includes an inverter, and the inverter includes a P-type transistor and an N-type transistor. A first control circuit and a second control circuit are arranged in the delay circuit. The first control circuit can adjust a voltage of a substrate terminal of the P-type transistor in the inverter, so that a current flowing through the P-type transistor in the inverter may be adjusted to allow the variation of the current flowing through the P-type transistor in the inverter with the variation of the first parameter to be within a first range. And the variation of the current flowing through the P-type transistor in the inverter can be compensated, and a rising edge delay time of the delay circuit may be with a slight variation. The second control circuit can adjust a voltage of a substrate terminal of the N-type transistor in the inverter, so that a current flowing through the N-type transistor in the inverter may be adjusted to allow a variation of the current flowing through the N-type transistor in the inverter with the variation of the first parameter to be within the first range. And the variation of the current flowing through the N-type transistor in the inverter can be compensated, and a falling edge delay time of the delay circuit may be with a slight variation. Therefore, both of the rising edge delay time T and the falling edge delay time T of the delay circuit may be with a slight variation. Thus, the control capability of the delay circuit to accuracy of the delay time (including the rising edge delay time and the falling edge delay time) can be improved.

Examples of the delay circuit in two types are illustrated in FIGS. 28 to 30, which can also be applied to this embodiment. The potential generating circuit shown in FIGS. 28 to 30 is the specific control circuit in this embodiment. The specific descriptions can be referred in FIGS. 28 to 30, which will not be elaborated here.

For example, the constant-current source in the above embodiments can be a mirror current source. A current of a mirror terminal can be a current independent of temperature coefficients, or the current of the mirror terminal is unrelated to a temperature, a voltage, or the like. The constant-current source in the above embodiments may also be implemented in other manners.

This disclosure provides a control circuit and a delay circuit, for reducing influences of a manufacturing process of the delay circuit, a power supply voltage of the delay circuit, and an operating temperature of the delay circuit on a delay time T of the delay circuit, so as to make less variation of the delay time T.

In a first aspect, this disclosure provides a control circuit, including a control unit and a feedback unit.

The feedback unit is configured to output a feedback signal according to a voltage of the control unit and a reference voltage. A first terminal of the feedback unit is connected to a first terminal of the control unit, a second terminal of the feedback unit serves as an input terminal of the reference voltage, and an output terminal of the feedback unit is connected to a second terminal of the control unit.

The control unit is configured to adjust a voltage of the second terminal of the control unit according to the feedback signal, so as to allow a current variation of the control unit with a first parameter to be within a first range. The first parameter includes at least one of a manufacturing process of the control circuit, a power supply voltage of the control circuit, and an operating temperature of the control circuit. A third terminal of the control unit is connected to a first power supply terminal, and a fourth terminal of the control unit is connected to a negative power supply terminal, or, the third terminal of the control unit is connected to a second power supply terminal, and the fourth terminal of the control unit is connected to a ground terminal.

Alternatively, when the fourth terminal of the control unit is connected to the first power supply terminal and a fifth terminal of the control unit is connected to the negative power supply terminal, the control unit includes an inverter and a constant-current source, the following operations are performed:

a first terminal of the inverter is connected to the first power supply terminal;

a first terminal of the constant-current source is connected to a second terminal of the inverter, and a second terminal of the constant-current source is connected to the negative power supply terminal;

an input terminal of the inverter is short connected with an output terminal of the inverter;

Alternatively, the inverter includes a first transistor and a second transistor, a substrate terminal of the first transistor is connected to the first power supply terminal, and a substrate terminal of the second transistor is connected to the output terminal of the feedback unit.

A first terminal of the first transistor is connected to the first power supply terminal, a second terminal of the first transistor is connected to a first terminal of the second transistor, a control terminal of the first transistor is connected to a control terminal of the second transistor, and a second terminal of the second transistor is connected to the first terminal of the constant-current source.

The control unit is configured to adjust a voltage of the substrate terminal of the second transistor according to the feedback signal.

Alternatively, when the third terminal of the control unit is connected to the second power supply terminal and the fourth terminal of the control unit is connected to the ground terminal, the following operations are performed:

the control unit includes an inverter and a constant-current source;

a first terminal of the inverter is connected to the ground terminal;

a first terminal of the constant-current source is connected to a second terminal of the inverter, and a second terminal of the constant-current source is connected to the second power supply terminal;

an input terminal of the inverter is short connected with an output terminal of the inverter.

Alternatively, the inverter includes a first transistor and a second transistor, a substrate terminal of the first transistor is connected to the output terminal of the feedback unit, and a substrate terminal of the second transistor is connected to the ground terminal.

A first terminal of the first transistor is connected to the first terminal of the constant-current source, a second terminal of the first transistor is connected to a first terminal of the second transistor, a control terminal of the first transistor is connected to a control terminal of the second transistor, and a second terminal of the second transistor is connected to the ground terminal.

The control unit is configured to adjust a voltage of the substrate terminal of the first transistor according to the feedback signal.

Alternatively, the first transistor is a P-type transistor, and the second transistor is an N-type transistor.

Alternatively, the feedback unit includes an error amplifier.

A negative input terminal of the error amplifier is connected to the first terminal of the constant-current source and the second terminal of the second transistor, a positive input terminal of the error amplifier serves as the input terminal of the reference voltage, and an output terminal of the error amplifier is connected to the substrate terminal of the second transistor.

Alternatively, the feedback unit further includes a buffer.

The buffer is connected to the substrate terminal of the second transistor and he the buffer is configured to output a first substrate voltage, a value of the first substrate voltage being equal to a voltage value of the substrate terminal of the second transistor.

Alternatively, the feedback unit includes an error amplifier.

A negative input terminal of the error amplifier is connected to the first terminal of the constant-current source and the first terminal of the first transistor, the negative input terminal of the error amplifier serves as the input terminal of the reference voltage, and an output terminal of the error amplifier is connected to the substrate terminal of the first transistor.

Alternatively, the feedback unit further includes a buffer.

The buffer is connected to the substrate terminal of the first transistor and the buffer is configured to output a second substrate voltage, a value of the second substrate voltage being equal to a voltage value of the substrate terminal of the first transistor.

In a second aspect, this disclosure provides a delay circuit, including a delay unit and the control circuit as described above. The second terminal of the control unit is connected to a first terminal of the delay unit, and the control unit is configured to control a variation of at least one of a rising edge delay time of the delay unit or a falling edge delay time of the delay unit with the first parameter, to be within the first range.

Alternatively, the delay unit includes an inverter, the inverter includes a fourth transistor and a fifth transistor, and the second terminal of the control unit is connected to a substrate terminal of the fourth transistor or a substrate terminal of the fifth transistor.

Alternatively, the fourth transistor is a P-type transistor, and the fifth transistor is an N-type transistor.

When the fourth terminal of the control unit is connected to the first power supply terminal and the fifth terminal of the control unit is connected to the negative power supply terminal, the second terminal of the control unit is connected to the substrate terminal of the fifth transistor.

When the third terminal of the control unit is connected to the second power supply terminal and the fourth terminal of the control unit is connected to the ground terminal, the second terminal of the control unit is connected to a substrate terminal of the fourth transistor.

The control circuit and the delay circuit provided in this disclosure are provided with a control unit and a feedback unit. The feedback unit is configured to output a feedback signal according to a voltage of the control unit and a reference voltage; the control unit is configured to adjust a voltage of a second terminal of the control unit according to the feedback unit, so as to allow a current variation of the control unit with a first parameter to be within a first range. Herein, the first parameter refers to any of a power supply voltage, an operating temperature, and a manufacturing process, so that the second terminal of the control unit can output a voltage that varies with any of the power supply voltage, the operating temperature, and the manufacturing process.

It should be noted at last: the above various embodiments are only used to illustrate the technical solutions of this disclosure, but not to limit it. Although this disclosure has been illustrated in detail with reference to the foregoing embodiments, for those of ordinary skill in the art, they can still modify the technical solutions described in the foregoing embodiments, or equivalently replace part or all of the technical features. All these modifications and replacements shall not cause the essence of the corresponding technical solutions to depart from the scope of the technical solutions of the embodiments of this disclosure.

The invention claimed is:

1. A control circuit, comprising a control unit and a feedback unit, wherein
the feedback unit is configured to output a feedback signal according to a voltage of the control unit and a reference voltage; wherein a first terminal of the feedback unit is connected to a first terminal of the control unit, a second terminal of the feedback unit serves as an input terminal of the reference voltage, and an output terminal of the feedback unit is connected to a second terminal of the control unit;
the control unit is configured to adjust a voltage of the second terminal of the control unit according to the feedback signal, so as to allow a current variation of the control unit with a first parameter to be within a first range; wherein the first parameter comprises at least one of a manufacturing process of the control circuit, a power supply voltage of the control circuit, or an operating temperature of the control circuit; wherein a third terminal of the control unit is connected to a first power supply terminal, and a fourth terminal of the control unit is connected to a negative power supply terminal, or, the third terminal of the control unit is connected to a second power supply terminal, and the fourth terminal of the control unit is connected to a ground terminal; and
the control unit comprises an inverter and a constant-current source, the inverter being connected to the constant-current source and the feedback unit, and the constant-current source being connected to the inverter and the feedback unit.

2. The control circuit of claim 1, wherein when the third terminal of the control unit is connected to the first power supply terminal and the fourth terminal of the control unit is connected to the negative power supply terminal,
a first terminal of the inverter is connected to the first power supply terminal;
a first terminal of the constant-current source is connected to a second terminal of the inverter, and a second terminal of the constant-current source is connected to the negative power supply terminal; and
an input terminal of the inverter is short connected with an output terminal of the inverter.

3. The control circuit of claim 2, wherein the inverter comprises a first transistor and a second transistor, wherein a substrate terminal of the first transistor is connected to the first power supply terminal, and a substrate terminal of the second transistor is connected to the output terminal of the feedback unit;
wherein a first terminal of the first transistor is connected to the first power supply terminal, a second terminal of the first transistor is connected to a first terminal of the second transistor, a control terminal of the first transistor is connected to a control terminal of the second transistor, and a second terminal of the second transistor is connected to the first terminal of the constant-current source; and
wherein the control unit is configured to adjust a voltage of the substrate terminal of the second transistor according to the feedback signal.

4. The control circuit of claim 3, wherein the first transistor is a P-type transistor, and the second transistor is an N-type transistor.

5. The control circuit of claim 3, wherein the feedback unit comprises an error amplifier; and
wherein a negative input terminal of the error amplifier is connected to the first terminal of the constant-current source and the second terminal of the second transistor, a positive input terminal of the error amplifier serves as the input terminal of the reference voltage, and an output terminal of the error amplifier is connected to the substrate terminal of the second transistor.

6. The control circuit of claim 5, further comprising a buffer;
wherein the buffer is connected to the substrate terminal of the second transistor and the buffer is configured to output a first substrate voltage, a value of the first substrate voltage being equal to a voltage value of the substrate terminal of the second transistor.

7. The control circuit of claim 1, wherein when the third terminal of the control unit is connected to the second power supply terminal and the fourth terminal of the control unit is connected to the ground terminal,
   a first terminal of the inverter is connected to the ground terminal;
   a first terminal of the constant-current source is connected to a second terminal of the inverter, and a second terminal of the constant-current source is connected to the second power supply terminal; and
   an input terminal of the inverter is short connected with an output terminal of the inverter.

8. The control circuit of claim 7, wherein the inverter comprises a first transistor and a second transistor, wherein a substrate terminal of the first transistor is connected to the output terminal of the feedback unit, and a substrate terminal of the second transistor is connected to the ground terminal;
   wherein a first terminal of the first transistor is connected to the first terminal of the constant-current source, a second terminal of the first transistor is connected to a first terminal of the second transistor, a control terminal of the first transistor is connected to a control terminal of the second transistor, and a second terminal of the second transistor is connected to the ground terminal; and
   wherein the control unit is configured to adjust a voltage of the substrate terminal of the first transistor according to the feedback signal.

9. The control circuit of claim 8, wherein the feedback unit comprises an error amplifier; and
   wherein a negative input terminal of the error amplifier is connected to the first terminal of the constant-current source and the first terminal of the first transistor, the negative input terminal of the error amplifier serves as the input terminal of the reference voltage, and an output terminal of the error amplifier is connected to the substrate terminal of the first transistor.

10. The control circuit of claim 9, further comprising a buffer;
   wherein the buffer is connected to the substrate terminal of the first transistor and the buffer is configured to output a second substrate voltage, a value of the second substrate voltage being equal to a voltage value of the substrate terminal of the first transistor.

11. A delay circuit, comprising a delay unit and a control circuit, the control circuit comprising a control unit and a feedback unit, wherein
   the feedback unit is configured to output a feedback signal according to a voltage of the control unit and a reference voltage; wherein a first terminal of the feedback unit is connected to a first terminal of the control unit, a second terminal of the feedback unit serves as an input terminal of the reference voltage, and an output terminal of the feedback unit is connected to a second terminal of the control unit;
   the control unit is configured to adjust a voltage of the second terminal of the control unit according to the feedback signal, so as to allow a current variation of the control unit with a first parameter to be within a first range; wherein the first parameter comprises at least one of a manufacturing process of the control circuit, a power supply voltage of the control circuit, or an operating temperature of the control circuit; wherein a third terminal of the control unit is connected to a first power supply terminal, and a fourth terminal of the control unit is connected to a negative power supply terminal, or, the third terminal of the control unit is connected to a second power supply terminal, and the fourth terminal of the control unit is connected to a ground terminal;
   the second terminal of the control unit is connected to a first terminal of the delay unit, and the control unit is configured to control a variation of at least of one of a rising edge delay time or a falling edge delay time of the delay unit with the first parameter to be within the first range; and
   the control unit comprises a first inverter and a constant-current source, the first inverter being connected to the constant-current source and the feedback unit, and the constant-current source being connected to the first inverter and the feedback unit.

12. The delay circuit of claim 11, wherein the delay unit comprises a second inverter, the second inverter comprises a fourth transistor and a fifth transistor, and the second terminal of the control unit is connected to a substrate terminal of the fourth transistor or a substrate terminal of the fifth transistor.

13. The delay circuit of claim 12, wherein the fourth transistor is a P-type transistor, and the fifth transistor is an N-type transistor;
   when the third terminal of the control unit is connected to the first power supply terminal and the fourth terminal of the control unit is connected to the negative power supply terminal, and the second terminal of the control unit is connected to the substrate terminal of the fifth transistor; and
   when the third terminal of the control unit is connected to the second power supply terminal and the fourth terminal of the control unit is connected to the ground terminal, the second terminal of the control unit is connected to the substrate terminal of the fourth transistor.

14. The delay circuit of claim 11, wherein when the third terminal of the control unit is connected to the first power supply terminal and the fourth terminal of the control unit is connected to the negative power supply terminal,
   a first terminal of the first inverter is connected to the first power supply terminal;
   a first terminal of the constant-current source is connected to a second terminal of the first inverter, and a second terminal of the constant-current source is connected to the negative power supply terminal; and
   an input terminal of the first inverter is short connected with an output terminal of the first inverter.

15. The delay circuit of claim 14, wherein the first inverter comprises a first transistor and a second transistor, wherein a substrate terminal of the first transistor is connected to the first power supply terminal, and a substrate terminal of the second transistor is connected to the output terminal of the feedback unit;
   wherein a first terminal of the first transistor is connected to the first power supply terminal, a second terminal of the first transistor is connected to a first terminal of the second transistor, a control terminal of the first transistor is connected to a control terminal of the second transistor, and a second terminal of the second transistor is connected to the first terminal of the constant-current source; and
   wherein the control unit is configured to adjust a voltage of the substrate terminal of the second transistor according to the feedback signal.

16. The delay circuit of claim 15, wherein the first transistor is a P-type transistor, and the second transistor is an N-type transistor.

17. The delay circuit of claim 15, wherein the feedback unit comprises an error amplifier; and
   wherein a negative input terminal of the error amplifier is connected to the first terminal of the constant-current source and the second terminal of the second transistor, a positive input terminal of the error amplifier serves as the input terminal of the reference voltage, and an output terminal of the error amplifier is connected to the substrate terminal of the second transistor.

18. The delay circuit of claim 17, wherein the control circuit further comprises a buffer;
   wherein the buffer is connected to the substrate terminal of the second transistor and the buffer is configured to output a first substrate voltage, a value of the first substrate voltage being equal to a voltage value of the substrate terminal of the second transistor.

19. The delay circuit of claim 11, wherein when the third terminal of the control unit is connected to the second power supply terminal and the fourth terminal of the control unit is connected to the ground terminal,
   a first terminal of the first inverter is connected to the ground terminal;
   a first terminal of the constant-current source is connected to a second terminal of the first inverter, and a second terminal of the constant-current source is connected to the second power supply terminal; and
   an input terminal of the first inverter is short connected with an output terminal of the first inverter.

20. The delay circuit of claim 19, wherein the first inverter comprises a first transistor and a second transistor, wherein a substrate terminal of the first transistor is connected to the output terminal of the feedback unit, and a substrate terminal of the second transistor is connected to the ground terminal;
   wherein a first terminal of the first transistor is connected to the first terminal of the constant-current source, a second terminal of the first transistor is connected to a first terminal of the second transistor, a control terminal of the first transistor is connected to a control terminal of the second transistor, and a second terminal of the second transistor is connected to the ground terminal; and
   wherein the control unit is configured to adjust a voltage of the substrate terminal of the first transistor according to the feedback signal.

* * * * *